United States Patent
Koenemann et al.

(10) Patent No.: US 11,021,610 B2
(45) Date of Patent: Jun. 1, 2021

(54) PERYLENE BISIMIDES WITH RIGID 2,2'-BIPHENOXY BRIDGES

(71) Applicant: BASF SE, Ludwigshafen am Rhein (DE)

(72) Inventors: Martin Koenemann, Mannheim (DE); Gerhard Wagenblast, Wachenheim (DE); Sorin Ivanovici, Heidelberg (DE); Martina Mitgude, Gruenstadt (DE)

(73) Assignee: BASF SE

( * ) Notice: Subject to any disclaimer, the term of this patent is extended or adjusted under 35 U.S.C. 154(b) by 452 days.

(21) Appl. No.: 16/069,954

(22) PCT Filed: Jan. 13, 2017

(86) PCT No.: PCT/EP2017/050621
§ 371 (c)(1),
(2) Date: Jul. 13, 2018

(87) PCT Pub. No.: WO2017/121833
PCT Pub. Date: Jul. 20, 2017

(65) Prior Publication Data
US 2019/0023905 A1 Jan. 24, 2019

(30) Foreign Application Priority Data

Jan. 14, 2016 (EP) ..................................... 16151228
Feb. 8, 2016 (EP) ..................................... 16154637

(51) Int. Cl.
| | | |
|---|---|---|
| C09B 5/62 | (2006.01) |
| C09K 11/06 | (2006.01) |
| C09B 57/12 | (2006.01) |
| H01L 33/50 | (2010.01) |
| B41M 3/14 | (2006.01) |
| C09K 11/77 | (2006.01) |
| C09B 57/14 | (2006.01) |

(52) U.S. Cl.
CPC ............... *C09B 5/62* (2013.01); *B41M 3/144* (2013.01); *C09B 57/12* (2013.01); *C09B 57/14* (2013.01); *C09K 11/06* (2013.01); *C09K 11/7731* (2013.01); *C09K 11/7734* (2013.01); *C09K 11/7774* (2013.01); *C09K 11/7792* (2013.01); *H01L 33/502* (2013.01); *C09K 2211/1007* (2013.01); *C09K 2211/1029* (2013.01); *C09K 2211/1033* (2013.01); *C09K 2211/1037* (2013.01); *C09K 2211/1044* (2013.01); *C09K 2211/1048* (2013.01); *C09K 2211/1051* (2013.01); *C09K 2211/1088* (2013.01)

(58) Field of Classification Search
CPC ............ C09B 5/62; C09B 57/12; C09K 11/06
See application file for complete search history.

(56) References Cited

U.S. PATENT DOCUMENTS

| | | |
|---|---|---|
| 3,748,330 A | 7/1973 | Fuchs et al. |
| 3,812,051 A | 5/1974 | Merkle et al. |
| 5,998,925 A | 12/1999 | Shimizu et al. |
| 6,245,259 B1 | 6/2001 | Höhn et al. |
| 6,429,583 B1 | 8/2002 | Levinson et al. |
| 6,576,930 B2 | 6/2003 | Reeh et al. |
| 6,669,866 B1 | 12/2003 | Kummer et al. |
| 6,765,237 B1 | 7/2004 | Doxsee et al. |
| 6,809,347 B2 | 10/2004 | Tasch et al. |
| 6,812,500 B2 | 11/2004 | Reeh et al. |
| 6,943,380 B2 | 9/2005 | Ota et al. |
| 7,267,787 B2 | 9/2007 | Dong et al. |
| 7,311,858 B2 | 12/2007 | Wang et al. |
| 7,446,166 B2 * | 11/2008 | Lee ..................... C07D 471/06 528/423 |
| 8,071,775 B2 | 12/2011 | Koenemann et al. |
| 9,236,535 B2 | 1/2016 | Wagenblast et al. |
| 9,406,848 B2 | 8/2016 | Koenemann et al. |
| 9,711,665 B2 | 7/2017 | Wagenblast et al. |
| 9,790,423 B2 | 10/2017 | Koenemann et al. |
| 9,919,999 B2 | 3/2018 | Koenemann et al. |
| 2007/0004919 A1 * | 1/2007 | Kohl ........................ C09B 5/62 546/37 |

(Continued)

FOREIGN PATENT DOCUMENTS

| | | |
|---|---|---|
| CN | 101389737 A | 3/2009 |
| CN | 103154185 A | 6/2013 |

(Continued)

OTHER PUBLICATIONS

International Search Report dated Mar. 17, 2017 in PCT/EP2017/050621.

(Continued)

*Primary Examiner* — Matthew E. Hoban
(74) *Attorney, Agent, or Firm* — Faegre Drinker Biddle & Reath LLP

(57) ABSTRACT

The present invention relates to perylene bisimides with rigid 2,2'-biphenoxy bridges which are useful in a wide variety of applications and to novel to perylene bisimides with rigid 2,2'-biphenoxy bridges. The present invention also relates to the use of said compound(s) in color converters for improving the luminous efficacy of LEDs, to color converters and their use and to lighting devices comprising at least one LED or OLED and at least one color converter. The present invention also relates to a printing ink formulation for security printing comprising at least one perylene bisimide with rigid 2,2'-biphenoxy bridges and security documents.

18 Claims, No Drawings

(56) References Cited

U.S. PATENT DOCUMENTS

| | | | |
|---|---|---|---|
| 2007/0043218 A1* | 2/2007 | Kohl | C07H 21/00 546/36 |
| 2008/0167467 A1 | 7/2008 | Koenemann et al. | |
| 2010/0011656 A1 | 1/2010 | Gessner et al. | |
| 2010/0022021 A1* | 1/2010 | Gessner | C07D 471/06 436/172 |
| 2010/0043875 A1* | 2/2010 | Bhaumik | C09B 5/62 136/256 |
| 2011/0068328 A1 | 3/2011 | Koenemann et al. | |
| 2013/0182409 A1 | 7/2013 | Lub et al. | |
| 2013/0334546 A1 | 12/2013 | Wagenblast et al. | |
| 2014/0076397 A1 | 3/2014 | Wagenblast et al. | |
| 2014/0103374 A1 | 4/2014 | Koenemann et al. | |
| 2014/0153247 A1* | 6/2014 | Lub | H05B 33/20 362/293 |
| 2015/0166882 A1* | 6/2015 | Hikmet | C09K 11/06 257/98 |
| 2015/0204836 A1* | 7/2015 | Prestwich | C09B 5/62 436/79 |
| 2016/0084477 A1 | 3/2016 | Wagenblast et al. | |
| 2016/0186961 A1 | 6/2016 | Lub et al. | |
| 2016/0284947 A1 | 9/2016 | Koenemann et al. | |
| 2017/0268746 A1* | 9/2017 | Lub | F21V 9/08 |

FOREIGN PATENT DOCUMENTS

| | | |
|---|---|---|
| CN | 103380192 A | 10/2013 |
| CN | 103517964 A | 1/2014 |
| CN | 103619987 A | 3/2014 |
| CN | 104152137 A | 11/2014 |
| EP | 3 072 887 A1 | 9/2016 |
| GB | 1 440 450 A | 6/1976 |
| JP | 2012-242411 | 12/2012 |
| WO | WO 02/11214 A1 | 2/2002 |
| WO | WO 2004/029028 A2 | 4/2004 |
| WO | WO 2005/052087 A1 | 6/2005 |
| WO | WO 2007/006717 A1 | 1/2007 |
| WO | WO 2012/042438 A1 | 4/2012 |
| WO | WO 2012/113884 A1 | 8/2012 |
| WO | WO 2012/152812 A1 | 11/2012 |
| WO | WO 2012/168395 A1 | 12/2012 |
| WO | WO 2014/131628 A1 | 9/2014 |
| WO | WO 2015/019270 A1 | 2/2015 |
| WO | WO 2015/169935 A1 | 11/2015 |
| WO | WO 2016/151068 A1 | 9/2016 |

OTHER PUBLICATIONS

International Preliminary Report on Patentability and Written Opinion dated Jul. 17, 2018 in PCT/EP2017/050621.

Zengqi Xie, et al., "Perylene Bisimides with Rigid 2,2'-Biphenol Bridges at Bay Area as Conjugated Chiral Platforms", Organic Letters, vol. 12, No. 14, XP055280267, 2010, pp. 3204-3207.

U.S. Appl. No. 14/963,713, filed Dec. 9, 2015, 2016/0084477 A1, Wagenblast, G. et al.

U.S. Appl. No. 15/180,161, filed Jun. 13, 2016, 2016/0284947 A1, Koenemann, M. et al.

U.S. Appl. No. 15/561,218, filed Sep. 25, 2017, 2018/0065980 A1, Koenemann, M. et al.

U.S. Appl. No. 15/180,161, filed Sep. 29, 2016, 2016/0284947, Koenemann et al.

U.S. Appl. No. 15/561,218, filed Mar. 8, 2018, 2018/0065980, Koenemann et al.

U.S. Appl. No. 16/069,954, filed Jul. 13, 2018, Koenemann et al.

\* cited by examiner

PERYLENE BISIMIDES WITH RIGID 2,2'-BIPHENOXY BRIDGES

FIELD OF THE INVENTION

The present invention relates to perylene bisimides with rigid 2,2'-biphenoxy bridges which are useful in a wide variety of applications and to novel to perylene bisimides with rigid 2,2'-biphenoxy bridges. In particular, the present invention relates to the use of said compound(s) in color converters for improving the luminous efficacy of LEDs, to color converters and their use and to lighting devices comprising at least one LED or OLED and at least one color converter. The present invention also relates to a printing ink formulation for security printing comprising at least one perylene bisimide with rigid 2,2'-biphenoxy bridges and to security documents.

LEDs (light-emitting diodes, LEDs) and OLEDs (organic light-emitting diodes, OLEDs) are an important class of devices that convert electric energy into light. In particular, LEDs are attractive candidates to replace conventional light sources such as incandescent lamps and fluorescent lamps, since they have a better luminous efficacy. Luminous efficacy is an important indicator of energy efficiency of light sources and is a measure of how well a light source produces visible light.

Light emission is based on the recombination of electron-hole pairs (excitons) in the junction region of a pn junction poled in forward direction in a semiconductor. The size of the band gap of this semiconductor determines the approximate wavelength of the light emitted. In order to generate a particular color, LEDs with different band gaps can be combined to form a multi-LED.

Alternatively, a radiation conversion luminophore (also referred to as phosphor, or fluorescent colorant or fluorescent dye; in the context of the present invention, these terms are used interchangeable to describe a material that converts light of a first wavelength into light of a second wavelength) can also be combined with a LED. In this context, the radiation emitted by the LED is partly absorbed by the radiation conversion luminophore, which is thus induced to photoluminesce. The light of such a phosphor-converted LED results from the superposition of non-absorbed and transmitted LED light and the emission spectrum and intensity of the radiation converting luminophore. According to one approach called "phosphor on a chip", a polymeric material comprising a radiation converting luminophore is directly applied onto the LED light source (LED chip). The polymeric material is applied directly and without intervening space to an LED chip, for instance, in droplet form or in hemispherical form, as a result of which particular optical effects contribute to the emission of the light. In phosphor on a chip LEDs, the radiation converting luminophores used are generally inorganic materials. Organic luminophore materials are not suitable, because the polymeric material and the radiation conversion luminophore are subject to relatively high thermal stress and radiation stress.

In another approach called "remote phosphor", the color converter (also referred to as "converter" or "light converter"), which generally comprises a polymer layer and one or more radiation converting luminophore(s), is spatially separated from the LED source. The spatial separation between the primary light source, the LED, and the color converter reduces the stress resulting from heat and radiation to such an extent that organic fluorescent dyes can also be used as radiation conversion luminophores. Furthermore, LEDs according to the "remote phosphor" concept are more energy-efficient than those according to the "phosphor on a chip" concept.

White light-emitting LEDs are used in a wide range of applications as a light source or as a backlight in full-color displays including in flat panel display applications due to their long lifetime, high reliability and low power consumption. Three methods are commonly used to create white light with LEDs. The basis for the emission of white light is always the superposition (mixing) of various colors. The first approach is through the combination of so called multi-LEDs, namely the mixing of light from three individual red, green, and blue LEDs (RGB-LED). Because of the different brightnesses and operating conditions for the various light-emitting diodes (each LED is driven by a separate circuit), the multi-LED is technically complex and therefore expensive. Moreover, component miniaturization of the multi-LED is severely limited.

The second and third approach is through the combination of an ultraviolet LED or blue LED with a converting phosphor material through luminescence conversion. In the second approach, the UV emitting LED is coated with three different phosphors capable of emitting red, green and blue light, respectively, to give white light to the human eye.

In the third, widely used approach, a blue LED is coated with a yellow-emitting phosphor, that converts emissions from InGaN/GaN blue LED to yellow. Mixing of the blue and yellow light mimics white light. A conventional converter (phosphor) material is an inorganic converter material such as cerium-doped yttrium aluminum garnet (also referred to as Ce:YAG). However, a standard Ce:YAG-based white LED has high color temperatures (typically above 6000 K) and only emits cool-white light, because the red component in the spectrum is too weak. Thus, the emission of the inorganic phosphors typically does not cover uniformly the visible spectral range, which reduces the possibility of mimicking the emission spectrum of sunlight or incandescent sources and, consequently, the color rendering performance of the lighting device is not satisfactory. Alternatively, in place of inorganic phosphors, organic fluorescent dyes (organic phosphors) can be used in a remote phosphor setup to obtain white light from a LED. Compared to inorganic phosphors, organic fluorescent dyes are advantageous in that they are usually available at low cost and not dangerous to health.

When only the yellow fluorescent dye is used, a low color temperature (warm white light) with a high color rendering cannot be achieved. The addition of a further phosphor that emits light in the red or orange-red portion of the visible spectrum creates a more balanced spectrum. The spectrum is extended in the red range releasing a warmer white light and thus moves the chromatic coordinates toward a lower color temperature. Suitable inorganic red phosphors are based on rare-earth elements such as europium. However, rare-earth elements are expensive and dangerous to health. Due to these disadvantages, several organic red-fluorescent dyes and mixtures of organic fluorescent dyes have been proposed to provide white LEDs with lower color temperatures.

WO 2012/042438 describes color converters comprising perylene tetracarboximides in a polymeric material comprising a polyester having an aromatic moiety incorporated in the polymer backbone. The perylene tetracarboximide compounds carry up to four substituents selected from fluorine, methoxy, $C_1$-$C_{16}$-alkyl and phenoxy which is optionally substituted by fluorine, methoxy or $C_1$-$C_{16}$-alkyl at the core of the perylene skeleton.

WO 2014/131628 describes lighting devices comprising (i) a blue LED as light source and (ii) a color converter comprising a polymer matrix and as green/yellow emitting organic luminescent material a non-cyanated benzoxanthene or benzothioxanthene compound.

WO 2015/019270 describes cyanated naphthalene benzimidazole compounds and their use as yellow-fluorescent dye, in particular in color converters for blue LEDs.

WO 2015/169935 describes cyanated perylene compounds and their use as fluorescent dye, in particular in color converters for blue LEDs.

Subject matter of unpublished EP 15161081.3 (post-published WO 2016/151068) are cyanated benzoxanthene compounds and cyanated benzothioxanthene compounds and derivatives thereof and their use as organic luminescent material, in particular as fluorescent dyes in color converters comprising at least one polymer as a matrix material.

WO 2012/168395 describes color converters comprising at least one polymer and at least one organic yellow-fluorescent dye, wherein the organic fluorescent dye comprises at least one structural unit of the formula (A),

(A)

where the structural unit may be mono- or polysubstituted by identical or different substituents and where one or more CH groups in the six-membered ring of the benzimidazole structure shown may be replaced by nitrogen. This reference also describes a color converter comprising the yellow fluorescent dye 3,10,12-triphenyl-benzo[de]benzo[4,5]imidazo[2,1-a]isoquinolin-7-one and a red fluorescent dye, N,N'-(2,6-diisopropylphenyl)-1,6,7,12-tetraphenoxyperylene-3,4; 9,10-tetracarboximide. The combination of yellow and red fluorescent dyes in the plates allows to make color converters which on irradiation with LEDs having a peak wavelength of 450-452 nm give white light of varying color temperature. This reference is silent on the luminous efficacy of the organic dye-based white LED.

Zengqi Xie and Frank Würthner describe in Organic Letters, 2010, vol. 12, no. 14, 3204-3207 core-twisted perylene bisimides with one or two 2,2'-biphenoxy bridge at the carbocyclic scaffold in the bay area(s). The perylene bisimide compounds carry a n-butyl group at each imide nitrogen atom. These core-twisted perylene bisimides are considered to be suitable for applications in chiral recognition and catalysis.

WO 2007/006717 relates to perylene tetracarboximides, perylene dicarboximides, the corresponding acid anhydrides and the higher homologues. The use of these compounds as fluorescent dye in color converters comprising at least one polymer as a matrix material is not described. None of the concrete compounds carries rigid 2,2'-biphenol bridges in the bay area.

Subject matter of unpublished EP 15170126.5 (post-published EP 3072887) are N,N'-bis(2,6-diisopropylphenyl)-1,7-di(2,6-diphenylphenoxy)perylen-3,4; 9,10-tetracarboximide, N,N'-bis(2,6-diisopropylphenyl)-1,6-di(2,6-diphenylphenoxy)perylen-3,4; 9,10-tetracarboximide and the use of said compound(s) in color converters for improving the luminous efficacy of white-light emitting diodes. This reference concretely describes a color converter having a good luminous efficacy, the color converter comprising the compound of example 10 of WO 20127168395 as yellow-fluorescent dye and N,N'-bis(2,6-diisopropylphenyl)-1,7-di (2,6-diphenylphenoxy)perylen-3,4; 9,10-tetracarboximide as red-fluorescent dye.

Organic fluorescent dyes when submitted to the physical-chemical conditions encountered in most lighting devices based on LEDs must withstand rather harsh blue light irradiation conditions during the life time of the light source. While organic red-fluorescent dyes with emission in the near infrared (NIR) region of the electromagnetic spectrum (also called IR-A, wavelength range from ca 700 nm-1400 nm) regions are known, a large number of them suffer from degradation and thus show an efficacy loss over the operational lifetime. Degradation may be due to low photostability, low thermal stability and/or high sensitivity to moisture and oxygen. A special disadvantage with red-fluorescent dyes is that part of their fluorescence band(s) often lies in the NIR region and thus is not perceived by the human eye due to reduced sensitivity of human eye to red wavelength. Therefore, white LEDs are often not satisfactory in terms of their luminous efficacy. There is an ongoing need to provide organic orange-red or red-fluorescent dyes with intense emission color, non-toxicity, thermal stability, high chemical stability with respect to moisture and oxygen, and high photostability. In particular, there is an ongoing need for organic orange-red or red fluorescent dyes which allows an enhancement of the photopic luminous efficacy of white LEDs.

Warm-white LEDs are inherently less efficient than cool-white LEDs, due to (some small) losses in the color conversion process and the broadband emission of red phosphors that extend into the near-infrared. On the other hand, white LEDs having a high luminous efficacy are often inadequate in terms of color rendering index (CRI). Color rendering is a property of a light source that shows how natural the colors of objects look under the given illumination. If the color rendering is poor, the light source will not be useful for general lighting. There is a close relationship between luminous efficacy and color rendering index, in that one of the two quantities can be increased only at the expense of the other. Thus, there is also an ongoing need for white LEDs having high luminous efficacy and also good average color rendering index CRI Ra close to 85 or even higher.

The eight test colors for assessing the average color rendering index Ra (CRI Ra value) are pastel colors and are particularly lacking deep reds and purples. For many applications, however, the red color reproduction is of great importance. There is also an ongoing need for white LEDs having specific properties such as high luminous efficacy, a CRI Ra close to 85 or even higher and R9 value (saturated red) greater than zero or even higher to achieve very good efficacy, light quality and color reproduction.

Organic fluorescent dyes also have a great potential in security applications, because they emit bright colored light when viewed under UV light, e.g. under a black light source (UVA) or ultraviolet light emitted from a standard mercury vapor light at 365 nm. The ultraviolet light, invisible to the human eye, is converted into visible light (electromagnetic irradiation with wavelengths between 400 and 700 nm).

There is an ongoing need to provide novel fluorescent dyes with strong absorption (high extinction coefficient). There is also a need to provide a cost effective security ink which is more difficult to counterfeit and which meets the technical stability requirements (chemical stability, heat stability and/or light stability) when compared with the current technology.

Thus, it is an object of the present invention to provide novel organic fluorescent dyes which should have at least one of the following properties:
high photostability;
high chemical stability with respect to moisture and oxygen;
good heat stability;
high fluorescence quantum yield in polymeric matrices, preferably above 92%;
enhancement of the photopic luminous efficacy of the white LED light source;
high compatibility with the LED production operation;
use as fluorescent dye for security printing;
good fastness to chemicals, in particular fastness to bleaching with hypochlorite and fastness to solvents (like toluene, acetone or dichloromethane);
good fastness to boiling water;
high compatibility with a multiplicity of formulations, in particular printing ink formulations used in security printing and thermoplastic polymer formulations used for laser-welding.

These and further objects are achieved by the perylene bisimide compounds of the formula (I) described below.

SUMMARY OF THE INVENTION

It has been found that these objects are achieved by the perylene bisimide compound of the formula (I)

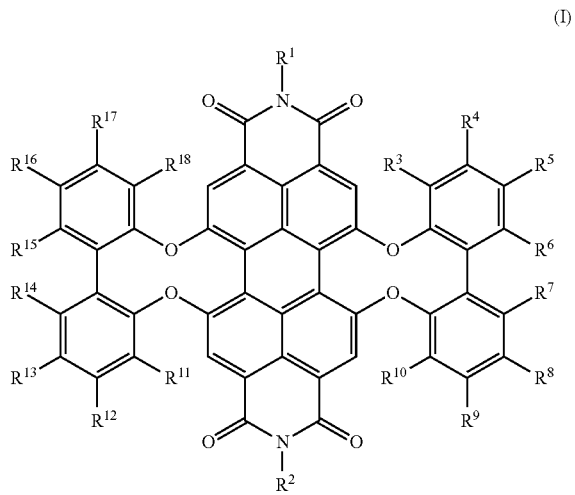

(I)

or a mixture thereof,
wherein
$R^1$ and $R^2$, independently of each other, are selected from hydrogen,
in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkyloxy, $C_6$-$C_{24}$-aryl and $C_6$-$C_{24}$-aryloxy;
$R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ independently of each other, are selected from hydrogen, halogen, cyano, hydroxyl, mercapto, nitro, —$NE^1E^2$, —$NR^{Ar1}COR^{Ar2}$, —$CONR^{Ar1}R^{Ar2}$, —$SO_2NR^{Ar1}R^{Ar2}$, —$COOR^{Ar1}$, —$SO_3R^{Ar2}$,
in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkoxy, $C_6$-$C_{24}$-aryl, $C_6$-$C_{24}$-aryloxy and $C_6$-$C_{24}$-arylthio,
where $R^3$ and $R^4$, $R^4$ and $R^5$, $R^5$ and $R^6$, $R^6$ and $R^7$, $R^7$ and $R^8$, $R^8$ and $R^9$, $R^9$ and $R^{10}$, $R^{11}$ and $R^{12}$, $R^{12}$ and $R^{13}$, $R^{13}$ and $R^{14}$, $R^{14}$ and $R^{15}$, $R^{15}$ and $R^{16}$, $R^{16}$ and $R^{17}$ and/or $R^{17}$ and $R^{18}$ together with the carbon atoms of the biphenylyl moiety to which they are bonded, may also form a further fused aromatic or non-aromatic ring system wherein the fused ring system is unsubstituted or substituted;
where
$E^1$ and $E^2$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl;
$R^{Ar1}$ and $R^{Ar2}$, each independently of each, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl.

Thus, the present invention relates to a color converter comprising in a polymeric matrix material at least one compound of the formula (I) or a mixture thereof as defined above. Preferably, the polymeric matrix material consists essentially of polymers selected from polystyrene, polycarbonate, polymethylmethacrylate, polyvinylpyrrolidone, polymethacrylate, polyvinyl acetate, polyvinyl chloride, polybutene, silicone, polyacrylate, epoxy resin, polyvinyl alcohol, poly(ethylene vinylalcohol)-copolymer (EVA, EVOH), polyacrylonitrile, polyvinylidene chloride (PVDC), polystyrene acrylonitrile (SAN), polybutylene terephthalate (PBT), polyethylene terephthalate (PET), polyvinyl butyrate (PVB), polyvinyl chloride (PVC), polyamides, polyoxymethylenes, polyimides, polyetherimides and mixtures thereof.

The present invention also relates to the use of a color converter as defined above, for conversion of light generated by LEDs or OLEDs, preferably generated by a cool-white LED or by a blue LED.

The present invention also relates to a lighting device comprising at least one LED and at least one color converter as defined above.

The present invention also relates to the use a compound of the formula (I) or a mixture thereof in color converters for converting light emitted from a light source, in particular a light source selected from LEDs and OLEDs, into light of a second, longer wavelength, for coloring coatings, printing inks and plastics, producing aqueous polymer dispersions which absorb and/or emit electromagnetic radiation, for data storage, for optical labels, for security labels in documents and for brand protection or as a fluorescent label for biomolecules.

The present invention also relates to the use of a perylene bisimide compound of the formula (I) or a mixture thereof as defined above in security inks for security printing.

The present invention also relates to a printing ink formulation for security printing, comprising at least one compound of the formula (I) or a mixture thereof as defined above.

Except for a compound of the formula (I), where $R^1$ and $R^2$ are each n-$C_4H_9$ and $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ are each hydrogen and which is mentioned in Organic Letters, 2010, vol. 12, no. 14, 3204-3207, compounds of the formula (I) and mixtures thereof are novel. Accordingly, the present invention also relates to perylene bisimide compounds of formula (I) and mixtures thereof, except for a compound, where $R^1$ and $R^2$ are each n-$C_4H_9$ and $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ are each hydrogen.

EMBODIMENTS OF THE INVENTION

Specially, the invention comprises the following preferred embodiments:

1. A color converter comprising in a polymeric matrix material at least one fluorescent dye, wherein the at least one fluorescent dye is a perylene bisimide compound of the formula (I)

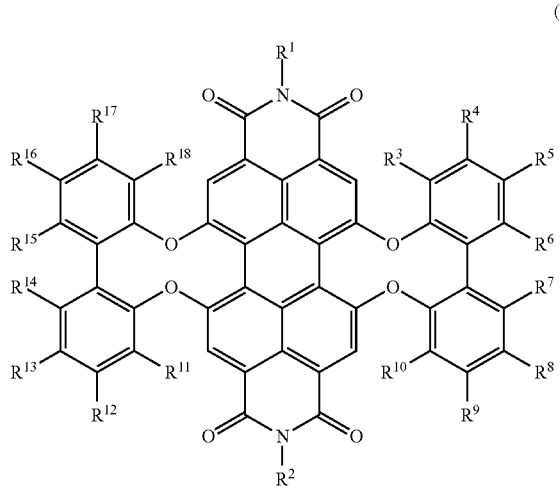

(I)

or a mixture thereof,
wherein
$R^1$ and $R^2$, independently of each other, are selected from hydrogen,
in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkyloxy, $C_6$-$C_{24}$-aryl and $C_6$-$C_{24}$-aryloxy;
$R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ independently of each other, are selected from hydrogen, halogen, cyano, hydroxyl, mercapto, nitro, —$NE^1E^2$, —$NR^{Ar1}COR^{Ar2}$, —$CONR^{Ar1}R^{Ar2}$, —$SO_2NR^{Ar1}R^{Ar2}$, —$COOR^{Ar1}$, —$SO_3R^{Ar2}$,
in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkoxy, $C_6$-$C_{24}$-aryl, $C_6$-$C_{24}$-aryloxy and $C_6$-$C_{24}$-arylthio,
where $R^3$ and $R^4$, $R^4$ and $R^5$, $R^5$ and $R^6$, $R^6$ and $R^7$, $R^7$ and $R^8$, $R^8$ and $R^9$, $R^9$ and $R^{10}$, $R^{11}$ and $R^{12}$, $R^{12}$ and $R^{13}$, $R^{13}$ and $R^{14}$, $R^{14}$ and $R^{15}$, $R^{15}$ and $R^{16}$, $R^{16}$ and $R^{17}$ and/or $R^{17}$ and $R^{18}$ together with the carbon atoms of the biphenylyl moiety to which they are bonded, may also form a further fused aromatic or non-aromatic ring system wherein the fused ring system is unsubstituted or substituted;

where
$E^1$ and $E^2$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl;
$R^{Ar1}$ and $R^{Ar2}$, each independently of each, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl.

2. The color converter as defined in embodiment 1, where $R^1$ and $R^2$ in formula (I) independently of each other are selected from
$C_1$-$C_{10}$-alkyl, which is unsubstituted or substituted by $C_6$-$C_{10}$-aryl which in turn is unsubstituted or substituted by 1, 2 or 3 $C_1$-$C_{10}$-alkyl,
$C_3$-$C_8$-cycloalkyl, which is unsubstituted or substituted by 1, 2 or 3 $C_1$-$C_{10}$-alkyl, and $C_6$-$C_{10}$-aryl which is unsubstituted or substituted by 1, 2 or 3 $C_1$-$C_{10}$-alkyl.

3. The color converter as defined in embodiment 2, where $R^1$ and $R^2$ in formula (I) independently of each other are selected from $C_1$-$C_8$-alkyl, $C_3$-$C_8$-cycloalkyl, which is unsubstituted or substituted by 1, 2 or 3 $C_1$-$C_6$-alkyl, and $C_6$-$C_{10}$-aryl which is unsubstituted or substituted by 1, 2 or 3 $C_1$-$C_6$-alkyl.

4. The color converter as defined in any of the preceding embodiments, where $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ in formula (I) independently of each other, are selected from hydrogen, halogen, $C_1$-$C_{18}$-alkyl, $C_6$-$C_{10}$-aryl, $C_6$-$C_{10}$-aryl-$C_1$-$C_{10}$-alkylene, $C_6$-$C_{10}$-aryloxy and $C_6$-$C_{10}$-arylthio, where the aryl moiety of $C_6$-$C_{10}$-aryl, $C_6$-$C_{10}$-aryl-$C_1$-$C_{10}$-alkylene, $C_6$-$C_{10}$-aryloxy and $C_6$-$C_{10}$-arylthio is unsubstituted or substituted by one or more $C_1$-$C_{10}$-alkyl,
and in addition $R^4$ and $R^5$, $R^5$ and $R^6$, $R^6$ and $R^7$, $R^7$ and $R^8$, $R^8$ and $R^9$, $R^{12}$ and $R^{13}$, $R^{13}$ and $R^{14}$, $R^{14}$ and $R^{15}$, $R^{15}$ and $R^{16}$ and/or $R^{16}$ and $R^{17}$ together with the carbon atoms of the biphenylyl moiety to which they are bonded, may also form a further fused benzene ring system.

5. The color converter as defined in any of the preceding embodiments, wherein, in formula (I), $R^3$, $R^{10}$, $R^{11}$ and $R^{18}$ are each hydrogen and $R^4$, $R^5$, $R^6$, $R^7$, $R^8$, $R^9$, $R^{12}$, $R^{13}$, $R^{14}$, $R^{15}$, $R^{16}$ and $R^{17}$ independently of each other, are selected from hydrogen and $C_1$-$C_{18}$-alkyl, and in addition $R^5$ and $R^6$, $R^6$ and $R^7$, $R^7$ and $R^8$, $R^{13}$ and $R^{14}$, $R^{14}$ and $R^{15}$ and/or $R^{15}$ and $R^{16}$ together with the carbon atoms of the biphenylyl moiety to which they are bonded, may also be a benzene ring system.

6. The color converter as defined in any of the preceding embodiments, wherein the polymeric matrix consists essentially of polymers selected from polystyrene, polycarbonate, polymethylmethacrylate, polyvinylpyrrolidone, polymethacrylate, polyvinyl acetate, polyvinyl chloride, polybutene, silicone, polyacrylate, epoxy resin, polyvinyl alcohol, poly(ethylene vinylalcohol)-copolymer (EVA, EVOH), polyacrylonitrile, polyvinylidene chloride (PVDC), polystyreneacrylonitrile (SAN), polybutylene terephthalate (PBT), polyethylene terephthalate (PET), polyvinyl butyrate (PVB), polyvinyl chloride (PVC), polyamides, polyoxymethylenes, polyimides, polyetherimides and mixtures thereof, preferably polystyrene, polycarbonate or polyethylene terephthalate.

7. The color converter as defined in embodiment 6, wherein the polymer consists of polystyrene.
8. The color converter as defined in embodiment 6, wherein the polymer consists of polycarbonate.
9. The color converter as defined in embodiment 6, wherein the polymer consists of polyethylene terephthalate.
10. The color converter as defined in any of the preceding embodiments, wherein the color converter additionally comprises at least one inorganic white pigment as a scattering body.
11. The color converter as defined in any of the preceding embodiments, comprising at least one further organic fluorescent dye selected from
    (i) a cyanated naphthalene benzimidazole compound of the formula (II)

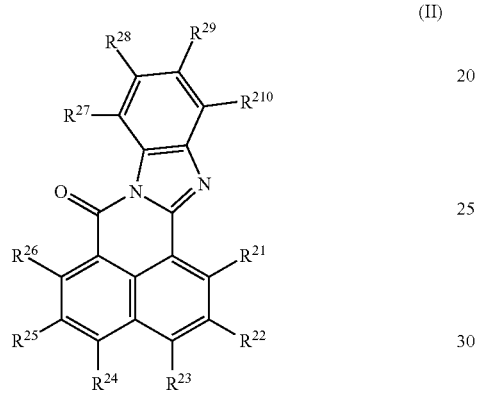

(II)

wherein
$R^{21}$, $R^{22}$, $R^{23}$, $R^{24}$, $R^{25}$, $R^{26}$, $R^{27}$, $R^{28}$, $R^{29}$ and $R^{210}$ are each independently hydrogen, cyano or aryl which is unsubstituted or has one or more identical or different substituents $R^{24r}$,
where
each $R^{24r}$ is independently selected from cyano, hydroxyl, mercapto, halogen, $C_1$-$C_{20}$-alkoxy, $C_1$-$C_{20}$-alkylthio, nitro, —$NR^{24r2}R^{24r3}$, —$NR^{24r2}COR^{24r3}$, —$CONR^{24r2}R^{24r3}$, —$SO_2NR^{24r2}R^{24r3}$, —$COOR^{24r2}$, —$SO_3R^{24r2}$,
$C_1$-$C_{30}$-alkyl, $C_2$-$C_{30}$-alkenyl, $C_2$-$C_{30}$-alkynyl, where the three latter radicals are unsubstituted or bear one or more $R^{2a}$ groups,
$C_3$-$C_8$-cycloalkyl, 3- to 8-membered heterocyclyl, where the two latter radicals are unsubstituted or bear one or more $R^{2b}$ groups,
aryl, U-aryl, heteroaryl and U-heteroaryl, where the four latter radicals are unsubstituted or bear one or more $R^{2b}$ groups,
where
each $R^{2a}$ is independently selected from cyano, hydroxyl, oxo, mercapto, halogen, $C_1$-$C_{20}$-alkoxy, $C_1$-$C_{20}$-alkylthio, nitro, —$NR^{24r2}R^{4r3}$, —$NR^{24r2}COR^{4r3}$, —$CONR^{24r2}R^{4r3}$, —$SO_2NR^{24r2}R^{4r3}$, —$COOR^{24r2}$, —$SO_3R^{24r2}$, $C_3$-$C_8$-cycloalkyl, 3- to 8-membered heterocyclyl, aryl and heteroaryl, where the cycloalkyl, heterocyclyl, aryl and heteroaryl radicals are unsubstituted or bear one or more $R^{2b}$ groups;
each $R^{2b}$ is independently selected from cyano, hydroxyl, oxo, mercapto, halogen, $C_1$-$C_{20}$-alkoxy, $C_1$-$C_{20}$-alkylthio, nitro, —$NR^{24r2}R^{24r3}$, —$NR^{24r2}COR^{24r3}$, —$CONR^{24r2}R^{24r3}$, —$SO_2NR^{24r2}R^{24r3}$, —$COOR^{24r2}$, —$SO_3R^{24r2}$, $C_1$-$C_{18}$-alkyl, $C_2$-$C_{18}$-alkenyl, $C_2$-$C_{18}$-alkynyl, $C_3$-$C_8$-cycloalkyl, 3- to 8-membered heterocyclyl, aryl and heteroaryl, where the four latter radicals are unsubstituted or bear one or more $R^{2b1}$ groups,
each $R^{2b1}$ is independently selected from cyano, hydroxyl, mercapto, oxo, nitro, halogen, —$NR^{24r2}R^{24r3}$, —$NR^{24r2}COR^{24r3}$, —$CONR^{24r2}R^{24r3}$, —$SO_2NR^{24r2}R^{24r3}$, —$COOR^{24r2}$, —$SO_3R^{24r2}$, —$SO_3R^{24r2}$, $C_1$-$C_{18}$-alkyl, $C_2$-$C_{18}$-alkenyl, $C_2$-$C_{18}$-alkynyl, $C_1$-$C_{12}$-alkoxy and $C_1$-$C_{12}$-alkylthio,
U is an —O—, —S—, —$NR^{24r1}$—, —CO—, —SO— or —$SO_2$— moiety;
$R^{24r1}$, $R^{24r2}$, $R^{24r3}$ are each independently hydrogen, $C_1$-$C_{18}$-alkyl, 3- to 8-membered cycloalkyl, 3- to 8-membered heterocyclyl, aryl or heteroaryl, where alkyl is unsubstituted or bears one or more $R^{2a}$ groups, where 3- to 8-membered cycloalkyl, 3- to 8-membered heterocyclyl, aryl and heteroaryl are unsubstituted or bear one or more $R^{2b}$ groups;
with the proviso that the compound of the formula II comprises at least one cyano group,
or mixtures thereof;
(ii) a cyanated perylene compound of the formula (III)

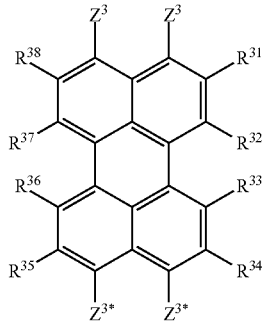

(III)

in which
one of the $Z^3$ substituents is cyano and the other $Z^3$ substituent is $CO_2R^{39}$, $CONR^{310}R^{311}$, $C_1$-$C_{18}$-alkyl, $C_2$-$C_{18}$-alkenyl, $C_2$-$C_{18}$-alkynyl, $C_3$-$C_{12}$-cycloalkyl or $C_6$-$C_{14}$-aryl, where
$C_1$-$C_{18}$-alkyl, $C_2$-$C_{18}$-alkenyl, $C_2$-$C_{18}$-alkynyl are unsubstituted or bear one or more identical or different $Z^{3a}$ substituents,
$C_3$-$C_{12}$-cycloalkyl is unsubstituted or bears one or more identical or different $Z^{3b}$ substituents, and
$C_6$-$C_{14}$-aryl is unsubstituted or bears one or more identical or different $Z^{3Ar}$ substituents;
one of the $Z^{3*}$ substituents is cyano and the other $Z^{3*}$ substituent is $CO_2R^{39}$, $CONR^{310}R^{311}$, $C_1$-$C_{18}$-alkyl, $C_2$-$C_{18}$-alkenyl, $C_2$-$C_{18}$-alkynyl, $C_3$-$C_{12}$-cycloalkyl or $C_6$-$C_{14}$-aryl, where
$C_1$-$C_{18}$-alkyl, $C_2$-$C_{18}$-alkenyl, $C_2$-$C_{18}$-alkynyl are unsubstituted or bear one or more identical or different $Z^{3a}$ substituents,
$C_3$-$C_{12}$-cycloalkyl is unsubstituted or bears one or more identical or different $Z^{3b}$ substituents, and $C_6$-$C_{14}$-aryl is unsubstituted or bears one or more identical or different $Z^{3Ar}$ substituents;

$R^{31}$, $R^{32}$, $R^{33}$, $R^{34}$, $R^{35}$, $R^{36}$, $R^{37}$ and $R^{38}$ are each independently selected from hydrogen, cyano, bromine and chlorine, with the proviso that 1, 2, 3, 4, 5, 6, 7 or 8 of the $R^{31}$, $R^{32}$, $R^{33}$, $R^{34}$, $R^{35}$, $R^{36}$, $R^{37}$ or $R^{38}$ substituents are cyano;

where $R^{39}$ is hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl, where $C_1$-$C_{10}$-alkyl, $C_2$-$C_{10}$-alkenyl, $C_2$-$C_{10}$-alkynyl are unsubstituted or bear one or more identical or different $R^{3a}$ substituents, $C_3$-$C_{12}$-cycloalkyl is unsubstituted or bears one or more identical or different $R^{3b}$ substituents and $C_6$-$C_{14}$-aryl is unsubstituted or bears one or more identical or different $R^{3Ar}$ substituents;

$R^{310}$ and $R^{311}$ are each independently hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl, where $C_1$-$C_{10}$-alkyl, $C_2$-$C_{10}$-alkenyl, $C_2$-$C_{10}$-alkynyl are unsubstituted or bear one or more identical or different $R^{3a}$ substituents, $C_3$-$C_{12}$-cycloalkyl is unsubstituted or bears one or more identical or different $R^{3b}$ substituents and $C_6$-$C_{14}$-aryl is unsubstituted or bears one or more identical or different $R^{3Ar}$ substituents;

each $Z^{3a}$ is independently halogen, hydroxyl, $NR^{310a}R^{311a}$, $C_1$-$C_{10}$-alkoxy, $C_1$-$C_{10}$-haloalkoxy, $C_1$-$C_{10}$-alkylthio, $C_3$-$C_{12}$-cycloalkyl, $C_6$-$C_{14}$-aryl, $C(=O)R^{39a}$; $C(=O)OR^{39a}$ or $C(O)NR^{310a}R^{311a}$, where $C_3$-$C_{12}$-cycloalkyl is unsubstituted or bears one or more identical or different $R^{3b}$ substituents and $C_6$-$C_{14}$-aryl is unsubstituted or bears one or more identical or different $R^{3Ar}$ substituents;

each $Z^{3b}$ and each $Z^{3Ar}$ is independently halogen, hydroxyl, $NR^{310a}R^{311a}$, $C_1$-$C_{10}$-alkyl, $C_1$-$C_{10}$-alkoxy, $C_1$-$C_{10}$-haloalkoxy, $C_1$-$C_{10}$-alkylthio, $C(=O)R^{39a}$; $C(=O)OR^{39a}$ or $C(O)NR^{310a}R^{311a}$;

each $R^{3a}$ is independently halogen, hydroxyl, $C_1$-$C_{10}$-alkoxy, $C_3$-$C_{12}$-cycloalkyl or $C_6$-$C_{14}$-aryl;

each $R^{3b}$ is independently halogen, hydroxyl, $C_1$-$C_{10}$-alkyl, $C_1$-$C_{10}$-alkoxy, $C_1$-$C_{10}$-haloalkoxy, $C_1$-$C_{10}$-alkylthio, $C_2$-$C_{10}$-alkenyl, $C_2$-$C_{10}$-alkynyl, $C_3$-$C_{12}$-cycloalkyl or $C_6$-$C_{14}$-aryl;

each $R^{3Ar}$ is independently halogen, hydroxyl, $C_1$-$C_{10}$-alkyl, $C_1$-$C_{10}$-alkoxy, $C_1$-$C_{10}$-haloalkoxy, $C_1$-$C_{10}$-alkylthio, $C_2$-$C_{10}$-alkenyl, $C_2$-$C_{10}$-alkynyl, $C_3$-$C_{12}$-cycloalkyl or $C_6$-$C_{14}$-aryl;

$R^{39a}$ is hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl; and $R^{310a}$, $R^{311a}$ are each independently hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl, and mixtures thereof.

(iii) a cyanated compound of the formula (IV)

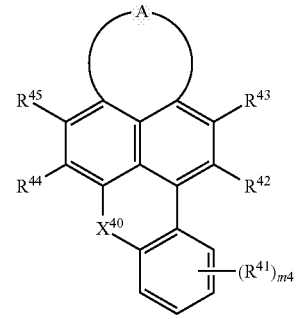

(IV)

wherein m4 is 0, 1, 2, 3 or 4;

each $R^{41}$ independently from each other is selected from bromine, chlorine, cyano, —$NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy, $C_6$-$C_{24}$-aryl-$C_1$-$C_{10}$-alkylene, where the rings of cycloalkyl, heterocycloalkyl, heteroaryl, aryl, aryloxy in the six last-mentioned radicals are unsubstituted or substituted with 1, 2, 3, 4 or 5 identical or different radicals $R^{41a}$ and where $C_1$-$C_{24}$-alkyl, $C_1$-$C_{24}$-haloalkyl, $C_1$-$C_{24}$-alkoxy, and the alkylene moiety of $C_6$-$C_{24}$-aryl-$C_1$-$C_{10}$-alkylene may be interrupted by one or more groups selected from O, S and $NR^{4c}$;

at least one of the radicals $R^{42}$, $R^{43}$, $R^{44}$ and $R^{45}$ is CN, and the remaining radicals, independently from each other, are selected from hydrogen, chlorine and bromine;

$X^{40}$ is O, S, SO or $SO_2$;

A is a diradical selected from diradicals of the general formulae (A.1), (A.2), (A.3), and (A.4)

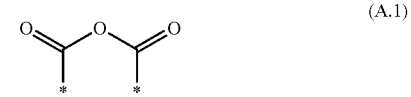

(A.1)

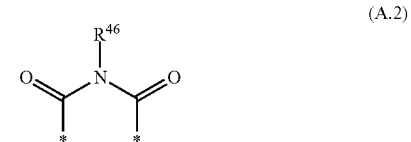

(A.2)

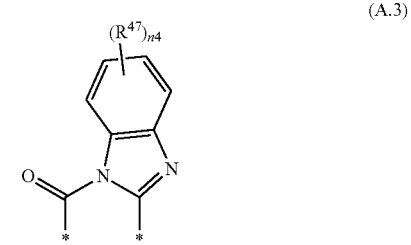

(A.3)

-continued

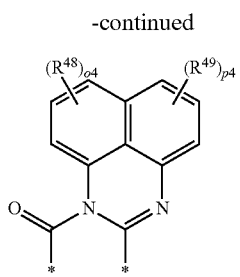
(A.4)

wherein
* in each case denotes the point of attachments to the remainder of the molecule;
n4 is 0, 1, 2, 3 or 4;
o4 is 0, 1, 2 or 3;
p4 is 0, 1, 2 or 3;
$R^{46}$ is hydrogen, $C_1$-$C_{24}$-alkyl, $C_1$-$C_{24}$-haloalkyl, $C_3$-$C_{24}$-cycloalkyl, $C_6$-$C_{24}$-aryl or $C_6$-$C_{24}$-aryl-$C_1$-$C_{10}$-alkylene, where the rings of cycloalkyl, aryl, and aryl-alkylene in the three last-mentioned radicals are unsubstituted or substituted with 1, 2, 3, 4 or 5 identical or different radicals $R^{46a}$, and where $C_1$-$C_{24}$-alkyl, $C_1$-$C_{24}$-haloalkyl and the alkylene moiety of $C_6$-$C_{24}$-aryl-$C_1$-$C_{10}$-alkylene may be interrupted by one or more heteroatoms or heteroatomic groups selected from O, S and $NR^{4c}$;
each $R^{47}$ independently from each other is selected from bromine, chlorine, cyano, —$NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy, $C_6$-$C_{24}$-aryl-$C_1$-$C_{10}$-alkylene, where the rings of cycloalkyl, heterocycloalkyl, heteroaryl, aryl and aryl-alkylene in the six last-mentioned radicals are unsubstituted or substituted with 1, 2, 3, 4 or 5 identical or different radicals $R^{47a}$ and where $C_1$-$C_{24}$-alkyl, $C_1$-$C_{24}$-haloalkyl, $C_1$-$C_{24}$-alkoxy, $C_1$-$C_{24}$-haloalkoxy, and the alkylene moiety of $C_6$-$C_{24}$-aryl-$C_1$-$C_{10}$-alkylene may be interrupted by one or more groups selected from O, S and $NR^{4c}$;
each $R^{48}$ independently from each other is selected from bromine, chlorine, cyano, $NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy, $C_6$-$C_{24}$-aryl-$C_1$-$C_{10}$-alkylene, where the rings of cycloalkyl, heterocycloalkyl, heteroaryl, aryl and aryl-alkylene in the six last-mentioned radicals are unsubstituted or substituted with 1, 2, 3, 4 or 5 identical or different radicals $R^{48a}$ and where $C_1$-$C_{24}$-alkyl, $C_1$-$C_{24}$-haloalkyl, $C_1$-$C_{24}$-alkoxy, $C_1$-$C_{24}$-haloalkoxy, and the alkylene moiety of $C_6$-$C_{24}$-aryl-$C_1$-$C_{10}$-alkylene may be interrupted by one or more groups selected from O, S and $NR^{4c}$;
each $R^{49}$ independently from each other is selected from bromine, chlorine, cyano, $NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy, $C_6$-$C_{24}$-aryl-$C_1$-$C_{10}$-alkylene, where the rings of cycloalkyl, heterocycloalkyl, heteroaryl, aryl and aryl-alkylene in the six last-mentioned radicals are unsubstituted or substituted with 1, 2, 3, 4 or 5 identical or different radicals $R^{49a}$ and where $C_1$-$C_{24}$-alkyl, $C_1$-$C_{24}$-haloalkyl, $C_1$-$C_{24}$-alkoxy, $C_1$-$C_{24}$-haloalkoxy, and the alkylene moiety of $C_6$-$C_{24}$-aryl-$C_1$-$C_{10}$-alkylene may be interrupted by one or more groups selected from O, S and $NR^{4c}$;
$R^{41a}$, $R^{46a}$, $R^{47a}$, $R^{48a}$, $R^{49a}$ are independently of one another selected from $C_1$-$C_{24}$-alkyl, $C_1$-$C_{24}$-fluoroalkyl, $C_1$-$C_{24}$-alkoxy, fluorine, chlorine and bromine;
$R^{4a}$, $R^{4b}$, $R^{4c}$ are independently of one another are selected from hydrogen, $C_1$-$C_{20}$-alkyl, $C_3$-$C_{24}$-cycloalkyl, heterocycloalkyl, heteroaryl and $C_6$-$C_{24}$-aryl;
and mixtures thereof;
(iv) a benzoxanthene compound of the formula (V)

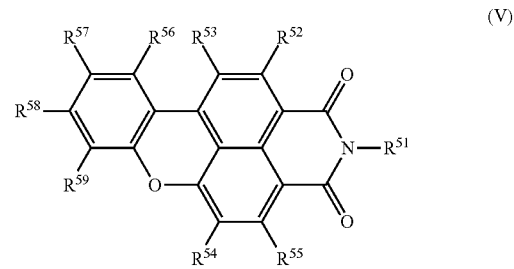
(V)

wherein
$R^{51}$ is phenyl which is unsubstituted or carries 1, 2, 3, 4, or 5 substituents selected from halogen, $R^{511}$, $OR^{552}$, $NHR^{552}$ and $NR^{552}R^{557}$;
$R^{52}$, $R^{53}$, $R^{54}$, $R^{55}$, $R^{56}$, $R^{57}$, $R^{58}$ and $R^{59}$ are independently of each other selected from hydrogen, halogen, $R^{553}$, $OR^{553}$, $NHR^{553}$ and $NR^{553}R^{554}$,
wherein
$R^{511}$ is selected from $C_2$-$C_{18}$-alkyl, $C_6$-$C_{24}$-aryl and heteroaryl;
$R^{552}$ and $R^{557}$ are independently of each other selected from $C_1$-$C_{18}$-alkyl, $C_6$-$C_{24}$-aryl and heteroaryl; and
$R^{553}$ and $R^{554}$ are independently of each other selected from $C_1$-$C_{18}$-alkyl, $C_6$-$C_{24}$-aryl and heteroaryl;
and mixtures thereof;
(v) a fluorescent compound comprising at least one structural unit of formula (VI)

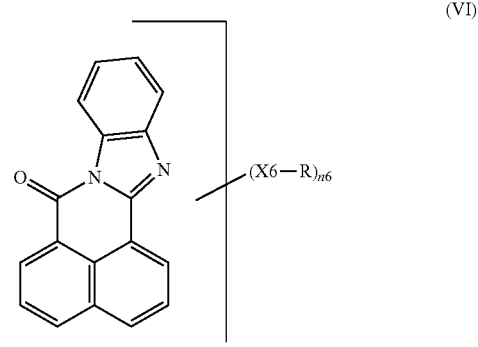
(VI)

where one or more CH groups of the six-membered ring of the benzimidazole structure shown may be replaced by nitrogen and where the symbols are each defined as follows:

n6 is a number from 0 to (10-p6) for each structural unit of the formula (VI); where p6 is the number of CH units which have been replaced by nitrogen in the six-membered ring of the benzimidazole structure shown X6 is a chemical bond, O, S, SO, $SO_2$, $NR^{61}$; and R is an aliphatic radical, cycloaliphatic radical, aryl, heteroaryl, each of which may bear any substituents, an aromatic or heteroaromatic ring or ring system, each of which is fused to other aromatic rings of the structural unit of the formula (VI)

is F, Cl, Br, CN, H when X6 is not a chemical bond;

where two R radicals may be joined to give one cyclic radical and where X6 and R, when n6>one, may be the same or different;

$R^{61}$ is each independently hydrogen, $C_1$-$C_{18}$-alkyl or cycloalkyl, the carbon chain of which may comprise one or more —O—, —S—, —CO—, —SO— and/or —$SO_2$-moieties and which may be mono- or polysubstituted;

aryl or heteroaryl which may be mono- or polysubstituted;

and mixtures thereof;

and (vi) a perylene compound of the formulae (VII), (VIII) or (IX)

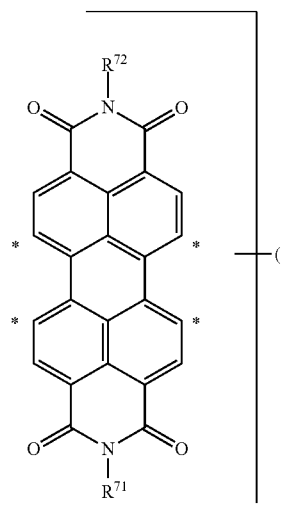

(VII)

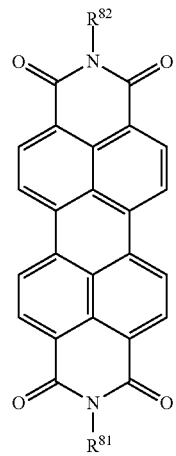

(VIII)

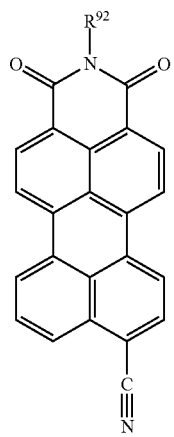

(IX)

where
p7 is 1 to 4,
$R^{71}$, $R^{72}$ are each independently $C_1$-$C_{30}$-alkyl, $C_3$-$C_8$-cycloalkyl, aryl, heteroaryl, aryl-$C_1$-$C_{10}$-alkylene, where the aromatic ring in the three latter radicals is unsubstituted or mono- or polysubstituted by $C_1$-$C_{10}$-alkyl;

each $R^{73}$ is independently aryloxy which is unsubstituted or mono- or polysubstituted by $C_1$-$C_{10}$-alkyl, where the $R^{73}$ radicals are at one or more of the positions indicated by *;

$R^{81}$, $R^{82}$ are each independently $C_1$-$C_{30}$-alkyl, $C_3$-$C_8$-cycloalkyl, aryl, heteroaryl, aryl-$C_1$-$C_{10}$-alkylene, where the aromatic ring in the three latter radicals is unsubstituted or mono- or polysubstituted by $C_1$-$C_{10}$-alkyl;

$R^{92}$ is $C_1$-$C_{30}$-alkyl, $C_3$-$C_8$-cycloalkyl, aryl, heteroaryl, aryl-$C_1$-$C_{10}$-alkylene, where the aromatic ring in the three latter radicals is unsubstituted or mono- or polysubstituted by $C_1$-$C_{10}$-alkyl
and mixtures thereof.

12. The color converter as defined in embodiment 11, wherein the at least one further organic fluorescent dye is selected from
compounds of formula (II) and mixtures thereof,
compounds of formula (IV) and mixtures thereof,
compounds of formula (V) and mixtures thereof, compounds comprising at least one structural unit of formula (VI) and mixtures thereof,
compounds of formula (VII)
and mixtures thereof.

13. The color converter as defined in embodiment 12, wherein the at least one further organic fluorescent dye is selected from
a compound comprising at least one structural unit of formula (VI) and mixtures thereof;
a compound of formula (VII) and mixtures thereof;
and mixtures thereof.

14. The color converter as defined in any of the preceding embodiments, wherein the compound comprising at least one structural unit of formula (VI) is selected from compounds of the formulae (VI-5), (VI-6), (VI-7), (VI-8),

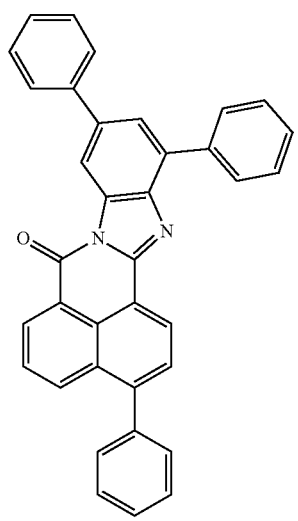
(VI-5)

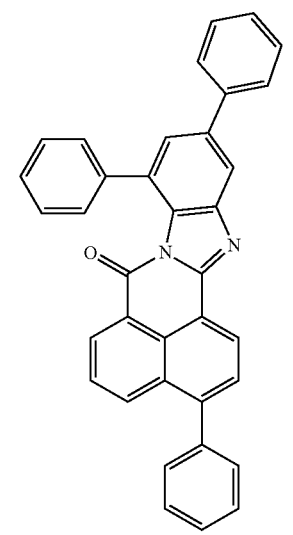
(VI-6)

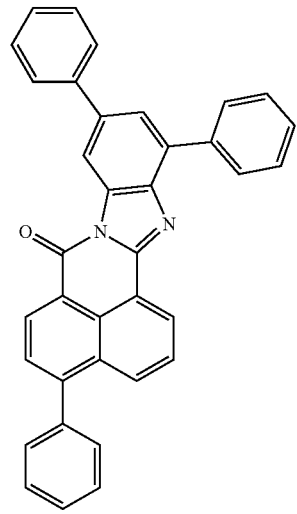
(VI-7)

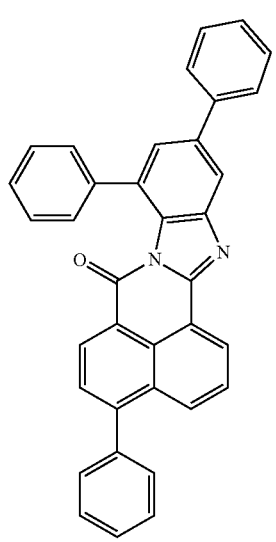
(VI-8)

and mixtures thereof.

15. The color converter as defined in any of embodiments 1 to 13, wherein the compound of the formula (VII) is a compound of formula (VII-3)

(VII-3)

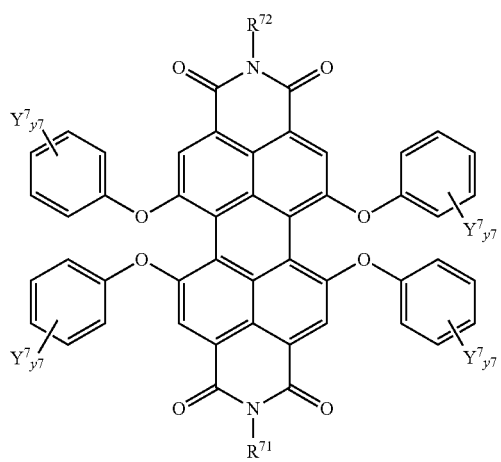

where

R$^{71}$, R$^{72}$ are each independently phenyl, which is unsubstituted or mono- or poly-substituted by $C_1$-$C_{10}$-alkyl;

each Y$^7$ is independently selected from the group consisting of linear $C_1$-$C_{10}$-alkyl and branched $C_3$-$C_{10}$-alkyl; and y$^7$ is 0, 1, 2 or 3.

and mixtures thereof.

16. The color converter as defined in any of embodiments 1 to 14, comprising at least one compound of the formula (I), wherein R$^1$ and R$^2$ are, independently of each other, selected from phenyl which is unsubstituted or substituted by 1, 2 or 3 $C_1$-$C_6$-alkyl; and R$^3$, R$^4$, R$^5$, R$^6$, R$^7$, R$^8$, R$^9$, R$^{10}$, R$^{11}$, R$^{12}$, R$^{13}$, R$^{14}$, R$^{15}$, R$^{16}$, R$^{17}$ and R$^{18}$ are each hydrogen; and at least one compound comprising at least one structural unit of formula (VI) selected from compounds of formulae (VI-5), (VI-6), (VI-7), (VI-8)

(VI-5)

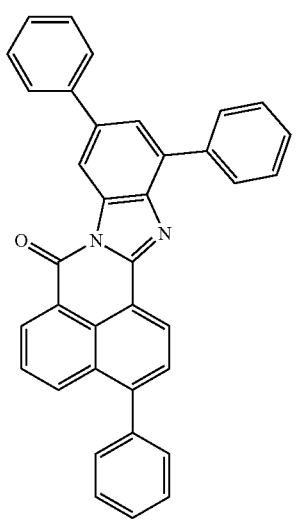

(VI-6)

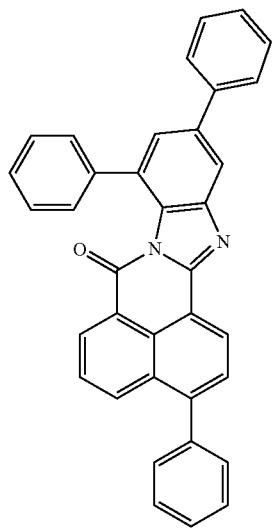

(VI-7)

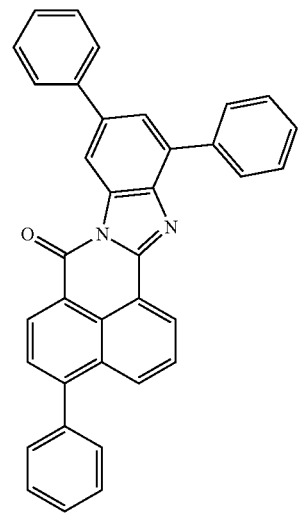

(VI-8)

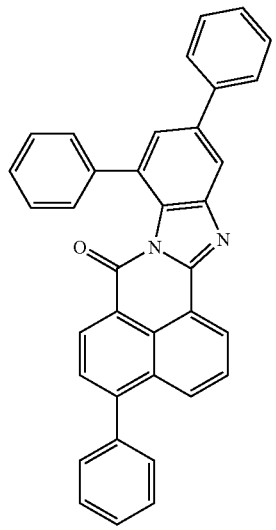

and mixtures thereof.

17. The color converter as defined in any of embodiments 1 to 15, comprising at least one compound of the formula (I), wherein $R^1$ and $R^2$ are, independently of each other, selected from phenyl which is unsubstituted or substituted by 1, 2 or 3 $C_1$-$C_4$-alkyl; and $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ are each hydrogen;

at least one compound comprising at least one structural unit of formula (VI) selected from compounds of formulae (VI-5), (VI-6), (VI-7), (VI-8)

(VI-5)

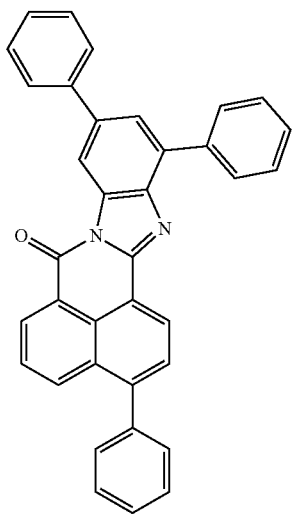

(VI-6)

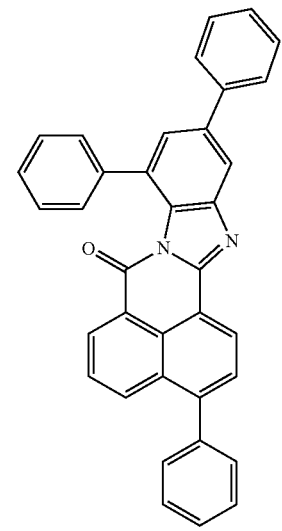

(VI-7)

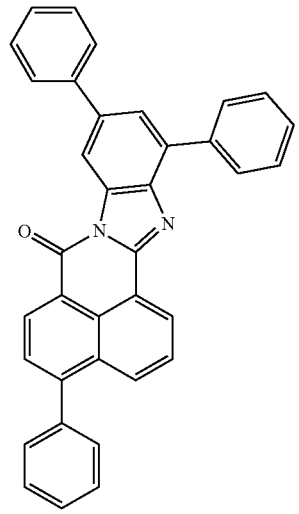

(VI-8)

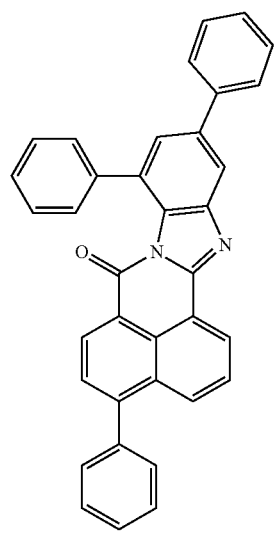

and mixtures thereof; and at least one compound of the formula (VII) selected from compounds of the formula (VII-3)

(VII-3)

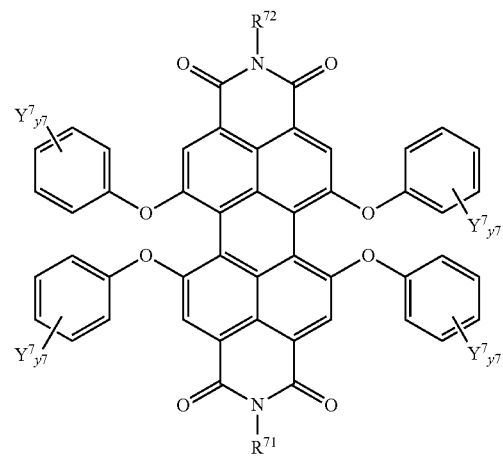

where
R⁷¹, R⁷² are each independently phenyl, which is unsubstituted or mono- or polysubstituted by $C_1$-$C_{10}$-alkyl;
each $Y^7$ is independently selected from the group consisting of linear $C_1$-$C_{10}$-alkyl and branched $C_3$-$C_{10}$-alkyl; and
$y^7$ is 0, 1, 2 or 3;
and mixtures thereof.

18. The color converter as defined in any of the preceding embodiments, comprising as further fluorescent material at least one inorganic fluorescent material selected from garnets, silicates, sulfides, nitrides and oxynitrides.

19. The color converter as defined in any of the preceding embodiments, comprising at least one quantum dot from a crystalline semiconductor material.

20. The use of a color converter as defined in any of the preceding embodiments, for conversion of light generated by LEDs or OLEDs.

21. The use of a color converter as defined in embodiment 18 for conversion of light generated by a cool-white LED or by a blue LED, the cool-white LED having a color temperature of 20000 K to 4500 K, preferably 12000 K to 7000 K.

22. The use of a color converter as defined in any of the preceding embodiments in displays.

23. A lighting device comprising at least one LED and at least one color converter as defined in any of embodiments 1 to 19, the LED and color converter being preferably in a remote phosphor arrangement.

24. The use of a perylene bisimide compound of the formula I or a mixture thereof as defined in any of embodiments 1 to 5, in color converters for converting light emitted from a light source, in particular a light source selected from LEDs and OLEDs, into light of a second, longer wavelength, for coloring coatings, printing inks and plastics, producing aqueous polymer dispersions which absorb and/or emit electromagnetic radiation, for data storage, for optical labels, for security labels in documents and for brand protection or as a fluorescent label for biomolecules.

25. The use of a perylene bisimide compound of the formula I or a mixture thereof as defined in any of embodiments 1 to 5 in security inks for security printing.

26. A printing ink formulation for security printing, comprising at least one compound of the formula I or a mixture thereof as defined in any of claims 1 to 5.

27. A printing ink formulation as defined in embodiment 26, for security printing, comprising
a) at least one compound of the formula (I) or a mixture thereof as defined in any of embodiments 1 to 5;
b) a polymeric binder;
c) optionally an organic solvent;
d) optionally at least one colorant; and
e) optionally at least one further additive.

28. A printing ink formulation according to embodiments 26 or 27, comprising
a) 0.0001 to 25% by weight of at least one compound of the formula (I) or a mixture thereof as defined in any of embodiments 1 to 5;
b) 5 to 75% by weight of at least one polymeric binder,
c) 0 to 94.9999% by weight of at least one solvent,
d) 0 to 25% by weight of at least one colorant, and
e) 0 to 25% by weight of at least one further additive,
wherein the sum of components a) to e) adds up to 100%.

29. A process for the manufacture of a security document comprising the steps printing on a substrate a printing ink formulation according to any of embodiments 26 to 28.

30. A security document, comprising a substrate, a cured ink which ink comprises at least one compound of the formula (I) or a mixture thereof as defined in any of embodiments 1 to 5.

31. A security document according to embodiment 30 obtainable by a printing process wherein a printing ink formulation as defined in any of embodiments 23 to 25 is employed.

32. The security document according to embodiments 30 or 31, which is selected from a bank note, a passport, a check, a voucher, an ID- or transaction card, a stamp and a tax label.

33. The security document according to embodiment 30 or 31 which is part of a rigid or flexible packaging, of a carton board or of a brand or product label.

34. A compound of the formula (I)

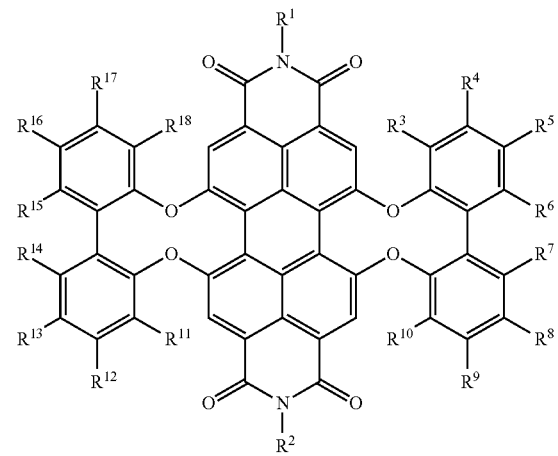

(I)

or a mixture thereof
wherein
$R^1$ and $R^2$, independently of each other, are selected from hydrogen,
in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkyloxy, $C_6$-$C_{24}$-aryl and $C_6$-$C_{24}$-aryloxy;
$R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ independently of each other, are selected from hydrogen, halogen, cyano, hydroxyl, mercapto, nitro, —$NE^1E^2$, —$NR^{Ar1}COR^{Ar2}$, —$CONR^{Ar1}R^{Ar2}$, —$SO_2NR^{Ar1}R^{Ar2}$, —$COOR^{Ar1}$, —$SO_3R^{Ar2}$,
in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkoxy, $C_6$-$C_{24}$-aryl, $C_6$-$C_{24}$-aryloxy and $C_6$-$C_{24}$-arylthio,
where $R^3$ and $R^4$, $R^4$ and $R^5$, $R^5$ and $R^6$, $R^6$ and $R^7$, $R^7$ and $R^8$, $R^8$ and $R^9$, $R^9$ and $R^{10}$, $R^{11}$ and $R^{12}$, $R^{12}$ and $R^{13}$, $R^{13}$ and $R^{14}$, $R^{14}$ and $R^{15}$, $R^{15}$ and $R^{16}$, $R^{16}$ and $R^{17}$ and/or $R^{17}$ and $R^{18}$ together with the carbon atoms of the biphenylyl moiety to which they are bonded, may also form a further fused aromatic or non-aromatic ring system wherein the fused ring system is unsubstituted or substituted;

where

E$^1$ and E$^2$, independently of each other, are hydrogen, unsubstituted or substituted C$_1$-C$_{18}$-alkyl, unsubstituted or substituted C$_2$-C$_{18}$-alkenyl, unsubstituted or substituted C$_2$-C$_{18}$-alkynyl, unsubstituted or substituted C$_3$-C$_{20}$-cycloalkyl or unsubstituted or substituted C$_6$-C$_{10}$-aryl;

R$^{Ar1}$ and R$^{Ar2}$, each independently of each, are hydrogen, unsubstituted or substituted C$_1$-C$_{18}$-alkyl, unsubstituted or substituted C$_3$-C$_{20}$-cycloalkyl, unsubstituted or substituted heterocyclyl, unsubstituted or substituted C$_6$-C$_{20}$-aryl or unsubstituted or substituted heteroaryl;

except for the compound of the formula (I), where R$^1$ and R$^2$ are each n-C$_4$H$_9$ and R$^3$, R$^4$, R$^5$, R$^6$, R$^7$, R$^8$, R$^9$, R$^{10}$, R$^{11}$, R$^{12}$, R$^{13}$, R$^{14}$, R$^{15}$, R$^{16}$, R$^{17}$ and R$^{18}$ are each hydrogen.

35. The compound as defined in embodiment 34, where R$^1$ and R$^2$ in formula (I) independently of each other are selected from C$_1$-C$_{10}$-alkyl, which is unsubstituted or substituted by C$_6$-C$_{10}$-aryl which in turn is unsubstituted or substituted by 1, 2 or 3 C$_1$-C$_{10}$-alkyl, C$_3$-C$_8$-cycloalkyl, which is unsubstituted or substituted by 1, 2 or 3 C$_1$-C$_{10}$-alkyl, and C$_6$-C$_{10}$-aryl which is unsubstituted or substituted by 1, 2 or 3 C$_1$-C$_{10}$-alkyl.

36. The compound as defined in embodiment 35, where R$^1$ and R$^2$ in formula (I) independently of each other are selected from C$_1$-C$_8$-alkyl, C$_3$-C$_8$-cycloalkyl, which is unsubstituted or substituted by 1, 2 or 3 C$_1$-C$_6$-alkyl, and C$_6$-C$_{10}$-aryl which is unsubstituted or substituted by 1, 2 or 3 C$_1$-C$_6$-alkyl.

37. The compound as defined in any of embodiments 34 to 36, where R$^3$, R$^4$, R$^5$, R$^6$, R$^7$, R$^8$, R$^9$, R$^{10}$, R$^{11}$, R$^{12}$, R$^{13}$, R$^{14}$, R$^{15}$, R$^{16}$, R$^{17}$ and R$^{18}$ in formula (I) independently of each other, are selected from hydrogen, halogen, C$_1$-C$_{18}$-alkyl, C$_6$-C$_{10}$-aryl, C$_6$-C$_{10}$-aryl-C$_1$-C$_{10}$-alkylene, C$_6$-C$_{10}$-aryloxy and C$_6$-C$_{10}$-arylthio, where the aryl moiety of C$_6$-C$_{10}$-aryl, C$_6$-C$_{10}$-aryl-C$_1$-C$_{10}$-alkylene, C$_6$-C$_{10}$-aryloxy and C$_6$-C$_{10}$-arylthio is unsubstituted or substituted by one or more C$_1$-C$_{10}$-alkyl, and in addition R$^4$ and R$^5$, R$^5$ and R$^6$, R$^6$ and R$^7$, R$^7$ and R$^8$, R$^8$ and R$^9$, R$^{12}$ and R$^{13}$, R$^{13}$ and R$^{14}$, R$^{14}$ and R$^{15}$, R$^{15}$ and R$^{16}$, and/or R$^{16}$ and R$^{17}$ together with the carbon atoms of the biphenylyl moiety to which they are bonded, may also form a further fused benzene ring system.

38. The compound as defined in any of embodiments 34 to 37, wherein, in formula (I), R$^3$, R$^{10}$, R$^{11}$ and R$^{18}$ are each hydrogen and R$^4$, R$^5$, R$^6$, R$^7$, R$^8$, R$^9$, R$^{12}$, R$^{13}$, R$^{14}$, R$^{15}$, R$^{16}$, and R$^{17}$ independently of each other, are selected from hydrogen and C$_1$-C$_{18}$-alkyl, and in addition R$^5$ and R$^6$, R$^6$ and R$^7$, R$^7$ and R$^8$, R$^{13}$ and R$^{14}$, R$^{14}$ and R$^{15}$, and/or R$^{15}$ and R$^{16}$ together with the carbon atoms of the biphenylyl moiety to which they are bonded, may also be a benzene ring system.

DETAILED DESCRIPTION OF INVENTION

The compounds of the formula (I) may be present as mixtures of two diasteromers, because the two biphenyl groups may locate at the same face or two different faces of the perylene core. The invention provides the pure diastereomers and mixtures of the diastereomers. The invention also provides the use of the pure diastereomers of the compound of the formula (I) and mixtures of diastereomers.

In the context of the present invention, fluorescent colorants include all materials which are capable of absorbing light of a particular wavelength and converting it to light of another wavelength. Organic fluorescent colorants may be organic fluorescent pigments or organic fluorescent dyes. Throughout the specification, the terms colorants and dyes are synonymously used.

In the context of the present invention, a yellow fluorescent dye is understood to mean a dye which re-emits light in the yellow, yellow-green range or green range of the electromagnetic spectrum. Accordingly, the term "yellow fluorescent dye", "yellow-green fluorescent dye", "green-yellow fluorescent dye" and "green fluorescent dye" are synonymously used.

In the context of the present invention, a red fluorescent dye is understood to mean a dye which re-emits light in the orange, orange-red or red range of the electromagnetic spectrum. Accordingly, the term "orange fluorescent dye", "orange-red fluorescent dye", "red-orange fluorescent dye" and "red fluorescent dye" are synonymously used.

In the context of the present invention, a "blue LED" is understood to mean an LED which emits light in the blue range of the electromagnetic spectrum. Suitable semiconductor materials are silicon carbide, zinc selenide and nitrides such as aluminum nitride (AlN), gallium nitride (GaN), indium nitride (InN) and indium gallium nitride (InGaN). Standard InGaN-based blue LEDs are fabricated on a sapphire substrate. They emit light with a center wavelength of 420 to 480 nm, preferably 440 to 470 nm, most preferably at 440 to 460 nm, for example, with a peak emission wavelength usually centered at 450 nm.

In the context of the present invention, a "green LED" is understood to mean an LED which emits light in the green range of the electromagnetic spectrum with a center wavelength of 501 to 560 nm, preferably 501 to 540 nm and especially 520 to 540 nm. Suitable semiconductor materials are for example based on GaInNAs.

In the context of the present invention, a "white LED" is understood to mean an LED which produces white light. Examples of a white LED are multi-LEDs or a blue LED in combination with at least one radiation conversion luminophore, in particular a blue LED in combination with at least one radiation conversion luminophore. Examples of a white LED are also cool-white LEDs in combination with at least one radiation conversion luminophore. White light is generally described by its correlated color temperature CCT, see below.

In the context of the present invention, "color converter" is understood to mean all physical devices capable of absorbing light of particular wavelengths and converting it to light of a second wavelength. Color converters are, for example, part of lighting devices, especially those lighting devices which utilize UV light or LEDs or OLEDs as a light source, or of fluorescence conversion solar cells. Thus, the blue light may be (at least) partly converted into visible light of longer wavelengths than the excitation wavelengths.

A quantum dot is a nanocrystal made of semiconductor materials that is small enough to exhibit quantum mechanical properties. The quantum dot has a defined emission wavelength which is not subject to aging and is also photochemical stable. The color output of the dots can be tuned by controlling the size of the crystals. With a smaller size in quantum dots, the quantum dots emit light of a shorter wavelength.

The correlated color temperature (CCT) is a measure of the warmth or coolness of the color emitted by a light source. CCT is measured in Kelvin. CCT is generally used herein in connection with white light. The correlated color temperature CCT from a white light source usually is in the range from 2000 K to 20000 K, especially 2700 K to 20000 K. Higher CCT white light contains relatively more lumens in the short wavelength region (blue) and relatively fewer lumens in the longer wavelength region (red). Accordingly, higher CCTs generally indicate white light having a more significant blue component or a cool tone while lower CCTs generally indicate light having a more significant red tint or a warm tone. A white light having a CCT in the range from 4500 K to 20000 K is often referred to as cool-white light, a white light having a CCT in the range from 2700 K to 3200 K is often referred to as warm-white light and a white light having a CCT in the range between 3200 K to 4500 K is often referred to as neutral white.

According to CIE 17.4, International Lighting Vocabulary, color rendering (CRI) is defined as "the effect of an illuminant on the color appearance of objects by conscious or unconscious comparison with the color appearance under a reference illuminant". A reference source, such as black body radiation, is defined as having a CRI of 100, i.e. a value of 100 indicates that the source renders colors in a manner identical to the reference. Negative values are also possible. The average or general color rendering index Ra is calculated from the differences in the chromaticities of the eight pastel CIE standard (reference) color samples R1 to R8 (CIE 13.3-1995). For many general interior illumination applications, a CRI Ra value of greater than 80 is acceptable. For general lightning, the color rendering index Ra should be above 85. For backlight, general lightning and various other applications, it is often desirable to provide a lighting source that generates white light having a high CRI Ra, so that objects illuminated by the lighting source may appear to have more natural coloring to the human eye.

CRI Ra does not include coefficients corresponding to six highly saturated colors (R9-R14). Of these, R9 corresponds to a strong red color, which may affect a red-green contrast that may be beneficial in rendering colors. Often, the ability to reproduce red colors well is essential for accurately rendering colors, as the color red is often found mixed into processed colors. Thus, if a light source cannot render red correctly, things that are reddish will turn dull. Accordingly, light sources with high CRI Ra and with positive R9 value tend to produce the most vivid colors.

According to the CIE 1931 standard colorimetric system, colors are perceived by human eye following specific color curves. The standard luminosity curve $V_\lambda$ accounts for the wavelength dependence of the sensitivity of human eye. The luminosity curve has a maximum possible value of 683 lm/W, for the case of monochromatic light at a wavelength of 555 nm (green).

Luminous flux is the measure of the perceived power of light. It differs from radiant flux, the measure of the total power of electromagnetic radiation (including infrared, ultraviolet, and visible light), in that luminous flux is adjusted to reflect the varying sensitivity of the human eye to different wavelengths of light. The luminous flux accounts for the sensitivity of the eye by weighting the power at each wavelength with the luminosity function, which represents the eye's response to different wavelengths. Luminous flux is calculated as a weighted sum of the power at all wavelengths in the visible band. Light outside the visible band does not contribute. The (photopic) luminous flux of a light source is calculated from the absolute spectral power distribution of the radiant intensity $J_\lambda$ and the standard luminosity function $V_\lambda$ as an integral over $J_\lambda$ which is weighted by $V_\lambda$ within the visible $\lambda$ range (390-700 nm):

(Photopic) luminous flux: $LF = \int J_\lambda \cdot V_\lambda d\lambda$

Luminous efficacy is a measure of how well a light source produces visible light. It is the ratio of luminous flux LF for the white light output to the (electrical) power which is necessary for driving the device.

For evaluation of the effectiveness of a color converting device, the optical luminous conversion efficacy is used herein which is defined as the (photopic) luminous flux LF (lumen) of the white light output of the converter divided by the optical radiant flux (Watt) of the LEDs which are pumping the device.

The word "essentially" in the context of the present invention encompasses the words "completely", "wholly" and "all". The word encompasses a proportion of 90% or more, such as 95% or more, especially 99% or 100%.

The definitions of the variables specified in the above formulae use collective terms which are generally representative of the respective substituents. The definition $C_n$-$C_m$ gives the number of carbon atoms possible in each case in the respective substituent or substituent moiety.

The expression "halogen" denotes in each case fluorine, bromine, chlorine or iodine, particularly chlorine, bromide or iodine.

In the context of the invention, the expression "in each case unsubstituted or substituted alkyl, cycloalkyl and aryl" represents unsubstituted or substituted alkyl, unsubstituted or substituted cycloalkyl and unsubstituted or substituted aryl.

Likewise, in the context of the invention, the expression "in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkyloxy, $C_6$-$C_{24}$-aryl and $C_6$-$C_{24}$-aryloxy" represents unsubstituted or substituted $C_1$-$C_{30}$-alkyl, unsubstituted or substituted polyalkyleneoxy, unsubstituted or substituted $C_1$-$C_{30}$-alkoxy, unsubstituted or substituted $C_1$-$C_{30}$-alkylthio, unsubstituted or substituted $C_3$-$C_{20}$-cycloalkyl, unsubstituted or substituted $C_3$-$C_{20}$-cycloalkyloxy, unsubstituted or substituted $C_6$-$C_{24}$-aryl and unsubstituted or substituted $C_6$-$C_{24}$-aryloxy.

The term "aliphatic radical" refers to an acyclic saturated or unsaturated, straight-chain or branched hydrocarbon radical. Usually the aliphatic radical has 1 to 100 carbon atoms. Examples for an aliphatic radical are alkyl, alkenyl and alkynyl.

The term "cycloaliphatic radical" refers to a cyclic, non-aromatic saturated or unsaturated hydrocarbon radical having usually 3 to 20 ring carbon atoms. Examples are cycloalkanes, cycloalkenes, and cycloalkynes. The cycloaliphatic radical may also comprise heteroatoms or heteroatom groups selected from N, O, S and $SO_2$.

The term "alkyl" as used herein and in the alkyl moieties of alkoxy, alkylthio, alkylsulfinyl, alkylsulfonyl, alkylamino, dialkylamino, alkylcarbonyl, alkoxycarbonyl and the like refers to saturated straight-chain or branched hydrocarbon radicals having usually 1 to 100 ("$C_1$-$C_{100}$-alkyl"), 1 to 30 ("$C_1$-$C_{30}$-alkyl"), 1 to 18 ("$C_1$-$C_{18}$-alkyl"), 1 to 12 ("$C_1$-$C_{12}$-alkyl"), 1 to 8 ("$C_1$-$C_8$-alkyl") or 1 to 6 ("$C_1$-$C_6$-alkyl") carbon atoms. Alkyl is preferably $C_1$-$C_{30}$-alkyl, more preferably $C_1$-$C_{20}$-alkyl. Examples of alkyl groups are especially methyl, ethyl, n-propyl, isopropyl, n-butyl, isobutyl, sec-butyl, tert-butyl, n-pentyl, 1-methylbutyl, 1-ethylpropyl, neo-pentyl, n-hexyl, 1-methylpentyl, 2-methylpentyl, 1-ethylbutyl, 2-ethylbutyl, n-heptyl, 1-methylhexyl, 2-methylhexyl, 1-ethylpentyl, 1-propylbutyl, 2-ethylpentyl, n-octyl, 1-methylheptyl, 2-methylheptyl, 1-ethylhexyl, 2-ethylhexyl, 1-propylpentyl, 2-propylpentyl, n-nonyl, 1-methyloctyl, 2-methyloctyl, 1-ethylheptyl, 2-ethylheptyl, 1-propylhexyl, 2-propylhexyl, 1-butylpentyl, n-decyl, 2-methyldecyl, 1-methylnonyl, 2-methylnonyl, 1-ethyloctyl, 2-ethyloctyl, 1-propylheptyl, 2-propylheptyl, 1-butylhexyl, 2-butylhexyl, n-undecyl, 2-ethylnonyl, 1-propyloctyl, 2-propyloctyl, 1-butylheptyl, 2-butylheptyl, 1-pentylhexyl, n-dodecyl, 2-ethyldecyl, 2-propylnonyl, 1-butyloctyl, 2-butyloctyl, 1-pentylheptyl, 2-pentylheptyl, 2-propyldecyl, n-tridecyl, 1-pentyloctyl, 2-pentyloctyl, 1-hexylheptyl, 2-butylnonyl, n-tetradecyl, 1-hexyloctyl, 2-hexyloctyl, 2-pentylnonyl, 2-hexylnonyl, 2-pentyldecyl, 2-butyldecyl, n-hexadecyl, 1-heptyloctyl, 2-heptylnonyl, 2-hexyldecyl, 2-heptyldecyl, n-octadecyl, 2-octyldecyl, n-eicosyl, 2-nonylundecyl, 2-octylundecyl, 2-heptylundecyl, 2-hexylundecyl, 2-pentylundecyl, 2-butylundecyl, 2-propylundecyl, 2-ethylundecyl, 2-methylundecyl, 2-decyldodecyl, 2-nonyldodecyl, 2-octyldodecyl, 2-heptyldodecyl, 2-hexyldodecyl, 2-pentyldodecyl, 2-butyldodecyl, 2-propyldodecyl, 2-ethyldodecyl, 2-methyldodecyl, 2-undecyltridecyl, 2-decyltridecyl, 2-nonyltridecyl, 2-octyltridecyl, 2-heptyltridecyl, 2-hexyltridecyl, 2-pentyltridecyl, 2-butyltridecyl, 2-propyltridecyl, 2-ethyltridecyl, 2-methyltridecyl, 2-undecyltetradecyl, 2-decyltetradecyl, 2-nonyltetradecyl, 2-octyltetradecyl, 2-hetyltetradecyl, 2-hexyltetradecyl, 2-pentyltetradecyl, 2-butyltetradecyl, 2-propyltetradecyl, 2-ethyltetradecyl, 2-methyltetradecyl, 2-tetradecylhexadecyl, 2-tridecylhexadecyl, 2-dodecylhexadecyl, 2-undecylhexadecyl, 2-decylhexadecyl, 2-nonylhexadecyl, 2-octylhexadecyl, 2-heptylhexadecyl, 2-hexylhexadecyl, 2-pentylhexadecyl, 2-butylhexadecyl, 2-propylhexadecyl, 2-ethylhexadecyl, 2-methylhexadecyl, 2-dodecyloctadecyl, 2-undecyloctadecyl, 2-decyloctadecyl, 2-nonyloctadecyl, 2-octyloctadecyl, 2-heptyloctadecyl, 2-hexyloctadecyl, 2-pentyloctadecyl, 2-butyloctadecyl, 2-propyloctadecyl, 2-ethyloctadecyl, 2-methyloctadecyl, 2-decyleicosanyl, 2-nonyleicosanyl, 2-octyleicosanyl, 2-heptyleicosanyl, 2-hexyleicosanyl, 2-pentyleicosanyl, 2-butyleicosanyl, 2-propyleicosanyl, 2-ethyleicosanyl, 2-methyleicosanyl, 2-octadecyldocosanyl, 2-heptadecyldocosanyl, 2-hexadecyldocosanyl, 2-pentadecyldocosanyl, 2-tetradecyldocosanyl, 2-tridecyldocosanyl, 2-undecyldocosanyl, 2-decyldocosanyl, 2-nonyldocosanyl, 2-octyldocosanyl, 2-heptyldocosanyl, 2-hexyldocosanyl, 2-pentyldocosanyl, 2-butyldocosanyl, 2-propyldocosanyl, 2-ethyldocosanyl, 2-methyldocosanyl, 2-docosanyltetracosanyl, 2-hexadecyltetracosanyl, 2-pentadecyltetracosanyl, 2-pentadecyltetracosanyl, 2-tetradecyltetracosanyl, 2-tridecyltetracosanyl, 2-dodecyltetracosanyl, 2-undecyltetracosanyl, 2-decyltetracosanyl, 2-nonyltetracosanyl, 2-octyltetracosanyl, 2-heptyltetracosanyl, 2-hexyltetracosanyl, 2-pentyltetracosanyl, 2-butyltetracosanyl, 2-propyltetracosanyl, 2-ethyltetracosanyl, 2-methyltetracosanyl, 2-dodecyloctacosanyl, 2-undecyloctacosanyl, 2-decyloctacosanyl, 2-nonyloctacosanyl, 2-octyloctacosanyl, 2-heptyloctacosanyl, 2-hexyloctacosanyl, 2-pentyloctacosanyl, 2-butyloctacosanyl, 2-propyloctacosanyl, 2-ethyloctacosanyl and 2-methyloctacosanyl.

Substituted alkyl groups, depending on the length of the alkyl chain, have one or more (e.g. 1, 2, 3, 4, 5 or more than 5) substituents. These are preferably each independently of each other selected from unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cyclolalkyloxy, unsubstituted or substituted aryloxy, unsubstituted or substituted arylthio, cyano, nitro, unsubstituted or substituted alkylcarbonyloxy, formyl, acyl, COOH, carboxylate, —COOR$^{Ar1}$, NE$^1$E$^2$, —NR$^{Ar1}$COR$^{Ar2}$, —CONR$^{Ar1}$R$^{Ar2}$, —SO$_2$NR$^{Ar1}$R$^{Ar2}$ and —SO$_3$R$^{Ar2}$, where E$^1$ and E$^2$ are hydrogen, unsubstituted or substituted C$_1$-C$_{18}$-alkyl, unsubstituted or substituted C$_2$-C$_{18}$-alkenyl, unsubstituted or substituted C$_2$-C$_{18}$-alkynyl, unsubstituted or substituted C$_3$-C$_{20}$-cycloalkyl or unsubstituted or substituted C$_6$-C$_{10}$-aryl, and R$^{Ar1}$ and R$^{Ar2}$, independently of each other, are hydrogen, unsubstituted or substituted C$_1$-C$_{18}$-alkyl, unsubstituted or substituted C$_3$-C$_{20}$-cycloalkyl, unsubstituted or substituted heterocyclyl, unsubstituted or substituted C$_6$-C$_{20}$-aryl or unsubstituted or substituted heteroaryl. In particular, substituted alkyl groups have one or more, for example 1, 2 or 3 substituent(s) selected from unsubstituted or substituted cycloalkyl, unsubstituted or substituted aryl, fluorine, chlorine, bromine, hydroxyl, alkoxy, polyalkyleneoxy, mercapto, alkylthio, cyano, nitro, NE$^1$E$^2$, —NR$^{Ar1}$COR$^{Ar2}$, —CONR$^{Ar1}$R$^{Ar2}$, —SO$_2$NR$^{Ar1}$R$^{Ar2}$, and —SO$_3$R$^{Ar2}$, where E$^1$, E$^2$, R$^{Ar1}$ and R$^{Ar2}$ are as defined above. Special embodiments of substituted alkyl groups are alkyl substituted by aryl ("aralkyl", also referred to hereinafter as arylalkyl or arylalkylene). The aryl substituent in turn may be unsubstituted or substituted, suitable substituents are the substituents mentioned below for aryl. Examples are C$_6$-C$_{24}$-aryl-C$_1$-C$_{10}$-alkyl, also referred to as C$_6$-C$_{24}$-aryl-C$_1$-C$_{10}$-alkylene, in particular C$_6$-C$_{10}$-aryl-C$_1$-C$_{10}$-alkylene, where the alkylene moiety of C$_6$-C$_{10}$-aryl-C$_1$-C$_{10}$-alkylene is unsubstituted and the aryl moiety of aryl-C$_1$-C$_{10}$-alkylene is unsubstituted or substituted such as benzyl, 1-phenylethyl, 2-phenylethyl, phenylpropyl, naphthylmethyl, naphthylethyl etc. Further special embodiments of substituted alkyl groups are alkyl groups where some or all of the hydrogen atoms in these groups may be replaced by halogen atoms as mentioned above, for example C$_1$-C$_4$-haloalkyl.

The term "alkenyl" as used herein refers to straight-chain or branched hydrocarbon groups having usually 2 to 100 ("C$_2$-C$_{100}$-alkenyl"), 2 to 18 ("C$_2$-C$_{18}$-alkenyl"), 2 to 10 ("C$_2$-C$_{10}$-alkenyl"), 2 to 8 ("C$_2$-C$_8$-alkenyl"), or 2 to 6 ("C$_2$-C$_6$-alkenyl") carbon atoms and one or more, e.g. 2 or 3, double bonds in any position. Substituted alkenyl groups, depending on the length of the alkenyl chain, have one or more (e.g. 1, 2, 3, 4, 5 or more than 5) substituents. These are preferably each independently of each other selected from unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cyclolalkyloxy, unsubstituted or substituted aryloxy, unsubstituted or substituted arylthio, cyano, nitro, unsubstituted or substituted alkylcarbonyloxy, formyl, acyl, COOH, carboxylate, —COOR$^{Ar1}$, NE$^1$E$^2$, —NR$^{Ar1}$COR$^{Ar2}$, —CONR$^{Ar1}$R$^{Ar2}$, —SO$_2$NR$^{Ar1}$R$^{Ar2}$ and —SO$_3$R$^{Ar2}$, where E$^1$ and E$^2$ are hydrogen, unsubstituted or substituted C$_1$-C$_{18}$-alkyl, unsubstituted or substituted C$_2$-C$_{18}$-alkenyl, unsubstituted or substituted C$_2$-C$_{18}$-alkynyl, unsubstituted or substituted C$_3$-C$_{20}$-cycloalkyl or unsubstituted or substituted C$_6$-C$_{10}$-aryl, and R$^{Ar1}$ and R$^{Ar2}$, independently of each other, are hydrogen, unsubstituted or substituted C$_1$-C$_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl. In particular, substituted alkenyl groups have one or more, for example 1, 2 or 3 substituent(s) selected from unsubstituted or substituted cycloalkyl, unsubstituted or substituted aryl, fluorine, chlorine, bromine, hydroxyl, alkoxy, polyalkyleneoxy, mercapto, alkylthio, cyano, nitro, $NE^1E^2$, —$NR^{Ar1}COR^{Ar2}$, —$CONR^{Ar1}R^{Ar2}$, —$SO_2NR^{Ar1}R^{Ar2}$, and —$SO_3R^{Ar2}$, where $E^1$, $E^2$, $R^{Ar1}$ and $R^{Ar2}$ are as defined above.

The term "alkynyl" as used herein (also referred to as alkyl whose carbon chain may comprise one or more triple bonds) refers to straight-chain or branched hydrocarbon groups having usually 2 to 100 ("$C_2$-$C_{100}$-alkynyl"), 2 to 18 ("$C_2$-$C_{18}$-alkynyl"), 2 to 10 ("$C_2$-$C_{10}$-alkynyl"), 2 to 8 ("$C_2$-$C_8$-alkynyl"), or 2 to 6 ("$C_2$-$C_6$-alkynyl") carbon atoms and one or more, e.g. 2 or 3, triple bonds in any position. Substituted alkynyl groups, depending on the length of the alkynyl chain, have one or more (e.g. 1, 2, 3, 4, 5 or more than 5) substituents. These are preferably each independently of each other selected from unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cyclolalkyloxy, unsubstituted or substituted aryloxy, unsubstituted or substituted arylthio, cyano, nitro, alkylcarbonyloxy, formyl, acyl, COOH, carboxylate, —$COOR^{Ar1}$, $NE^1E^2$, —$NR^{Ar1}COR^{Ar2}$, —$CONR^{Ar1}R^{Ar2}$, —$SO_2NR^{Ar1}R^{Ar2}$ and —$SO_3R^{Ar2}$, where $E^1$ and $E^2$ are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl. In particular, substituted alkynyl groups have one or more, for example 1, 2 or 3 substituent(s) selected from unsubstituted or substituted cycloalkyl, unsubstituted or substituted aryl, fluorine, chlorine, bromine, hydroxyl, alkoxy, polyalkyleneoxy, mercapto, alkylthio, cyano, nitro, $NE^1E^2$, —$NR^{Ar1}COR^{Ar2}$, —$CONR^{Ar1}R^{Ar2}$, —$SO_2NR^{Ar1}R^{Ar2}$, and —$SO_3R^{Ar2}$, where $E^1$, $E^2$, $R^{Ar1}$ and $R^{Ar2}$ are as defined above.

The term "alkoxy" as used herein refers to an alkyl group bound through an oxygen atom to the remainder of the molecule, that is, an "alkoxy" group may be represented as —O-alkyl where alkyl is as defined above. $C_1$-$C_2$-Alkoxy is methoxy or ethoxy. $C_1$-$C_4$-Alkoxy is, for example, methoxy, ethoxy, n-propoxy, 1-methylethoxy (isopropoxy), butoxy, 1-methylpropoxy (sec-butoxy), 2-methylpropoxy (isobutoxy) or 1,1-dimethylethoxy (tert-butoxy).

Accordingly, the term "unsubstituted or substituted alkoxy" as used herein refers to —O-alkyl where alkyl is unsubstituted or substituted as defined above.

The term "polyoxyalkylene" as used herein refers to an alkyl group bound through an oxygen atom to the remainder of the molecule, where alkyl is interrupted by one or more non-adjacent oxygen atoms and alkyl is as defined above.

Accordingly, the term "unsubstituted or substituted polyalkyleneoxy" as used herein refers to —O-alkyl where alkyl is interrupted by one or more non-adjacent oxygen atoms and alkyl is unsubstituted or substituted as defined above.

The term "alkylthio" as used herein refers to an alkyl group bound through a sulfur atom to the remainder of the molecule, that is, an "alkylthio" group may be represented as —S-alkyl where alkyl is as defined above. $C_1$-$C_2$-Alkylthio is methylthio or ethylthio. $C_1$-$C_4$-Alkylthio is, for example, methylthio, ethylthio, n-propylthio, 1-methylethylthio (isopropylthio), butylthio, 1-methylpropylthio (sec-butylthio), 2-methylpropylthio (isobutylthio) or 1,1-dimethylethylthio (tert-butylthio).

Accordingly, the term "unsubstituted or substituted alkylthio" as used herein refers to —S-alkyl where alkyl is unsubstituted or substituted as defined above.

The term "cycloalkyl" as used herein refers to mono- or bi- or polycyclic saturated hydrocarbon radicals having usually 3 to 24 ($C_3$-$C_{24}$-cycloalkyl), 3 to 20 ("$C_3$-$C_{20}$-cycloalkyl") atoms, preferably 3 to 8 ("$C_3$-$C_8$-cycloalkyl") or 3 to 6 carbon atoms ("$C_3$-$C_6$-cycloalkyl"). Examples of monocyclic radicals having 3 to 6 carbon atoms comprise cyclopropyl, cyclobutyl, cyclopentyl and cyclohexyl. Examples of monocyclic radicals having 3 to 8 carbon atoms comprise cyclopropyl, cyclobutyl, cyclopentyl, cyclohexyl, cycloheptyl and cyclooctyl. Examples of bicyclic radicals having 7 to 12 carbon atoms comprise bicyclo[2.2.1]heptyl, bicyclo[3.1.1]heptyl, bicyclo[2.2.2]octyl, bicyclo[3.3.0]octyl, bicyclo[3.2.1]octyl, bicyclo[3.3.1]nonyl, bicyclo[4.2.1]nonyl, bicyclo[4.3.1]decyl, bicyclo[3.3.2]decyl, bicyclo[4.4.0]decyl, bicyclo[4.2.2]decyl, bicyclo[4.3.2] undecyl, bicyclo[3.3.3]undecyl, bicyclo[4.3.3]dodecyl, and perhydronaphthyl. Examples of polycyclic rings are perhydroanthracyl, perhydrofluorenyl, perhydrochrysenyl, perhydropicenyl, and adamantyl.

Substituted cycloalkyl groups may, depending on the ring size, have one or more (e.g. 1, 2, 3, 4, 5 or more than 5) substituents. These are preferably each independently of each other selected from unsubstituted or substituted alkyl, unsubstituted or substituted alkenyl, unsubstituted or substituted alkynyl, unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cyclolalkyloxy, unsubstituted or substituted aryloxy, unsubstituted or substituted arylthio, cyano, nitro, unsubstituted or substituted alkylcarbonyloxy, formyl, acyl, COOH, carboxylate, —$COOR^{Ar1}$, —$NE^1E^2$, —$NR^{Ar1}COR^{Ar2}$, —$CONR^{Ar1}R^{Ar2}$, —$SO_2NR^{Ar1}R^{Ar2}$ and —$SO_3R^{Ar2}$, where $E^1$ and $E^2$ are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl. In particular, substituted cycloalkyl groups have one or more, for example 1, 2 or 3 substituent(s) selected from unsubstituted or substituted alkyl, unsubstituted or substituted cycloalkyl, unsubstituted or substituted aryl, fluorine, chlorine, bromine, hydroxyl, alkoxy, polyalkyleneoxy, mercapto, alkylthio, cyano, nitro, $NE^1E^2$, $—NR^{Ar1}COR^{Ar2}$, $—CONR^{Ar1}R^{Ar2}$, $—SO_2NR^{Ar1}R^{Ar2}$, and $—SO_3R^{Ar2}$, where $E^1$, $E^2$, $R^{Ar1}$ and $R^{Ar2}$ are as defined above.

The term "cycloalkyloxy" as used herein refers to a cycloalkyl group bound through an oxygen atom to the remainder of the molecule, that is, a "cycloalkyloxy" group may be represented as —O-cycloalkyl where cycloalkyl is as defined above.

Accordingly, the term "unsubstituted or substituted cycloalkyloxy" as used herein refers to —O— cycloalkyl where cycloalkyl is unsubstituted or substituted as defined above.

The term "cycloalkylthio" as used herein refers to a cycloalkyl group bound through a sulfur atom to the remainder of the molecule, that is, a "cycloalkylthio" group may be represented as —S-cycloalkyl where cycloalkyl is as defined above.

Accordingly, the term "unsubstituted or substituted cycloalkylthio" as used herein refers to —S— cycloalkyl where cycloalkyl is unsubstituted or substituted as defined above.

The term heterocycloalkyl refers to nonaromatic, partially unsaturated or fully saturated, heterocyclic rings having generally 5 to 8 ring members, preferably 5 or 6 ring members, comprising besides carbon atoms as ring members, one, two, three or four heteroatoms or heteroatom-containing groups selected from O, N, $NR^{cc}$, S, SO and $S(O)_2$ as ring members, wherein $R^{cc}$ is hydrogen, $C_1$-$C_{20}$-alkyl, $C_3$-$C_{24}$-cycloalkyl, heterocycloalkyl, $C_6$-$C_{24}$-aryl or heteroaryl. Examples of heterocycloalkyl groups are especially pyrrolidinyl, piperidinyl, imidazolidinyl, pyrazolidinyl, oxazolidinyl, morpholinyl, thiazolidinyl, isothiazolidinyl, isoxazolidinyl, piperazinyl, tetrahydrothiophenyl, dihydrothien-2-yl, tetrahydrofuranyl, dihydrofuran-2-yl, tetrahydropyranyl, 2-oxazolinyl, 3-oxazolinyl, 4-oxazolinyl and dioxanyl.

Substituted heterocycloalkyl groups may, depending on the ring size, have one or more (e.g. 1, 2, 3, 4, 5 or more than 5) substituents. These are preferably each independently of each other selected from unsubstituted or substituted alkyl, unsubstituted or substituted alkenyl, unsubstituted or substituted alkynyl, unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cyclolalkyloxy, unsubstituted or substituted aryloxy, unsubstituted or substituted arylthio, cyano, nitro, unsubstituted or substituted alkylcarbonyloxy, formyl, acyl, COOH, carboxylate, $—COOR^{Ar1}$, $—NE^1E^2$, $—NR^{Ar1}COR^{Ar2}$, $—CONR^{Ar1}R^{Ar2}$, $—SO_2NR^{Ar1}R^{Ar2}$ and $—SO_3R^{Ar2}$, where $E^1$ and $E^2$ are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, independently of each other, are hydrogen or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl. In particular, substituted heterocycloalkyl groups have one or more, for example 1, 2 or 3 substituent(s) selected from unsubstituted or substituted alkyl, unsubstituted or substituted cycloalkyl, unsubstituted or substituted aryl, fluorine, chlorine, bromine, hydroxyl, alkoxy, polyalkyleneoxy, mercapto, alkylthio, cyano, nitro, $NE^1E^2$, $—NR^{Ar1}COR^{Ar2}$, $—CONR^{Ar1}R^{Ar2}$, $—SO_2NR^{Ar1}R^{Ar2}$, and $—SO_3R^{Ar2}$, where $E^1$, $E^2$, $R^{Ar1}$ and $R^{Ar2}$ are as defined above In the context of the present invention, the term "aryl" refers to mono- or polycyclic aromatic hydrocarbon radicals. Aryl usually is an aromatic radical having 6 to 24 carbon atoms ($C_6$-$C_{24}$-aryl), preferably 6 to 20 carbon atoms ($C_6$-$C_{20}$-aryl), especially 6 to 14 carbon atoms ($C_6$-$C_{14}$-aryl) as ring members. Aryl is preferably phenyl, naphthyl, indenyl, fluorenyl, anthracenyl, phenanthrenyl, naphthacenyl, chrysenyl, pyrenyl, coronenyl, perylenyl, etc., and more preferably phenyl or naphthyl. Examples of aryl are in particular phenyl and naphthyl.

Substituted aryls may, depending on the number and size of their ring systems, have one or more (e.g. 1, 2, 3, 4, 5 or more than 5) substituents. These are preferably each independently of each other selected from unsubstituted or substituted alkyl, unsubstituted or substituted alkenyl, unsubstituted or substituted alkynyl, unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cyclolalkyloxy, unsubstituted or substituted aryloxy, unsubstituted or substituted arylthio, cyano, nitro, unsubstituted or substituted alkylcarbonyloxy, formyl, acyl, COOH, carboxylate, $—COOR^{Ar1}$, $—NE^1E^2$, $—NR^{Ar1}COR^{Ar2}$, $—CONR^{Ar1}R^{Ar2}$, $—SO_2NR^{Ar1}R^{Ar2}$ and $—SO_3R^{Ar2}$, where $E^1$ and $E^2$ are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl. In particular, substituted aryl groups have one or more, for example 1, 2 or 3 substituent(s) selected from unsubstituted or substituted alkyl, unsubstituted or substituted cycloalkyl, unsubstituted or substituted aryl, fluorine, chlorine, bromine, hydroxyl, alkoxy, polyalkyleneoxy, mercapto, alkylthio, cyano, nitro, $NE^1E^2$, $—NR^{Ar1}COR^{Ar2}$, $—CONR^{Ar1}R^{Ar2}$, $—SO_2NR^{Ar1}R^{Ar2}$, and $—SO_3R^{Ar2}$, where $E^1$, $E^2$, $R^{Ar1}$ and $R^{Ar2}$ are as defined above.

Substituted aryl is preferably aryl substituted by at least one alkyl group ("alkaryl", also referred to hereinafter as alkylaryl). Alkaryl groups may, depending on the size of the aromatic ring system, have one or more (e.g. 1, 2, 3, 4, 5, 6, 7, 8, 9 or more than 9) alkyl substituents. The alkyl substituents may be unsubstituted or substituted. In this regard, reference is made to the above statements regarding unsubstituted and substituted alkyl. A special embodiment relates to alkaryl groups, wherein alkyl is unsubstituted. Alkaryl is preferably phenyl which bears 1, 2, 3, 4 or 5, preferably 1, 2 or 3, more preferably 1 or 2 alkyl substituents. Aryl which bears one or more alkyl radicals, is, for example, 2-, 3- and 4-methylphenyl, 2,4-, 2,5-, 3,5- and 2,6-dimethylphenyl, 2,4,6-trimethylphenyl, 2-, 3- and 4-ethylphenyl, 2,4-, 2,5-, 3,5- and 2,6-diethylphenyl, 2,4,6-triethylphenyl, 2-, 3- and 4-n-propylphenyl, 2-, 3- and 4-iso-propylphenyl, 2,4-, 2,5-, 3,5- and 2,6-di-n-propylphenyl, 2,4,6-tripropylphenyl, 2-, 3- and 4-isopropylphenyl, 2,4-, 2,5-, 3,5- and 2,6-diisopropylphenyl, 2,4,6-triisopropylphenyl, 2-, 3- and 4-butylphenyl, 2,4-, 2,5-, 3,5- and 2,6-dibutylphenyl, 2,4,6-tributylphenyl, 2-, 3- and 4-isobutylphenyl, 2,4-, 2,5-, 3,5- and 2,6-diisobutylphenyl, 2,4,6-triisobutylphenyl, 2-, 3- and 4-sec-butylphenyl, 2,4-, 2,5-, 3,5- and 2,6-di-sec-butylphenyl, 2,4,6-tri-sec-butylphenyl, 2-, 3- and 4-tert-butylphenyl, 2,4-, 2,5-, 3,5- and 2,6-di-tert-butylphenyl and 2,4,6-tri-tert-butylphenyl.

$C_6$-$C_{24}$-aryloxy: $C_6$-$C_{24}$-aryl as defined above, which is bonded to the skeleton via an oxygen atom (—O—). Preference is given to phenoxy and naphthyloxy.

Accordingly, the term "unsubstituted or substituted aryloxy" as used herein refers to —O-aryl where aryl is unsubstituted or substituted as defined above.

$C_6$-$C_{24}$-arylthio: $C_6$-$C_{24}$-aryl as defined above, which is bonded to the skeleton via a sulfur atom (—S—). Preference is given to phenylthio and naphthylthio.

Accordingly, the term "unsubstituted or substituted arylthio" as used herein refers to —S-aryl where aryl is unsubstituted or substituted as defined above.

In the context of the present invention, the expression "hetaryl" (also referred to as heteroaryl) comprises heteroaromatic, mono- or polycyclic groups. In addition to the ring carbon atoms, these have 1, 2, 3, 4 or more than 4 heteroatoms as ring members. The heteroatoms are preferably selected from oxygen, nitrogen, selenium and sulfur. The hetaryl groups have preferably 5 to 18, e.g. 5, 6, 8, 9, 10, 11, 12, 13 or 14, ring atoms.

Monocyclic hetaryl groups are preferably 5- or 6-membered hetaryl groups, such as 2-furyl (furan-2-yl), 3-furyl (furan-3-yl), 2-thienyl (thiophen-2-yl), 3-thienyl (thiophen-3-yl), selenophen-2-yl, selenophen-3-yl, 1H-pyrrol-2-yl, 1H-pyrrol-3-yl, pyrrol-1-yl, imidazol-2-yl, imidazol-1-yl, imidazol-4-yl, pyrazol-1-yl, pyrazol-3-yl, pyrazol-4-yl, pyrazol-5-yl, 3-isoxazolyl, 4-isoxazolyl, 5-isoxazolyl, 3-isothiazolyl, 4-isothiazolyl, 5-isothiazolyl, 2-oxazolyl, 4-oxazolyl, 5-oxazolyl, 2-thiazolyl, 4-thiazolyl, 5-thiazolyl, 1,2,4-oxadiazol-3-yl, 1,2,4-oxadiazol-5-yl, 1,3,4-oxadiazol-2-yl, 1,2,4-thiadiazol-3-yl, 1,2,4-thiadiazol-5-yl, 1,3,4-thiadiazol-2-yl, 4H-[1,2,4]-triazol-3-yl, 1,3,4-triazol-2-yl, 1,2,3-triazol-1-yl, 1,2,4-triazol-1-yl, pyridin-2-yl, pyridin-3-yl, pyridin-4-yl, 3-pyridazinyl, 4-pyridazinyl, 2-pyrimidinyl, 4-pyrimidinyl, 5-pyrimidinyl, 2-pyrazinyl, 1,3,5-triazin-2-yl and 1,2,4-triazin-3-yl.

Polycyclic hetaryl groups have 2, 3, 4 or more than 4 fused rings. The fused-on rings may be aromatic, saturated or partly unsaturated. Examples of polycyclic hetaryl groups are quinolinyl, isoquinolinyl, indolyl, isoindolyl, indolizinyl, benzofuranyl, isobenzofuranyl, benzothiophenyl, benzoxazolyl, benzisoxazolyl, benzthiazolyl, benzoxadiazolyl, benzothiadiazolyl, benzoxazinyl, benzopyrazolyl, benzimidazolyl, benzotriazolyl, benzotriazinyl, benzoselenophenyl, thienothiophenyl, thienopyrimidyl, thiazolothiazolyl, dibenzopyrrolyl (carbazolyl), dibenzofuranyl, dibenzothiophenyl, naphtho[2,3-b]thiophenyl, naphtha[2,3-b]furyl, dihydroindolyl, dihydroindolizinyl, dihydroisoindolyl, dihydroquinolinyl and dihydroisoquinolinyl.

Substituted hetaryl groups may, depending on the number and size of their ring systems, have one or more (e.g. 1, 2, 3, 4, 5 or more than 5) substituents. These are preferably each independently of each other selected from unsubstituted or substituted alkyl, unsubstituted or substituted alkenyl, unsubstituted or substituted alkynyl, unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cycloalkyloxy, unsubstituted or substituted aryloxy, unsubstituted or substituted arylthio, cyano, nitro, unsubstituted or substituted alkylcarbonyloxy, formyl, acyl, COOH, carboxylate, —COOR$^{Ar1}$, —NE$^1$E$^2$, —NR$^{Ar1}$COR$^{Ar2}$, —CONR$^{Ar1}$R$^{Ar2}$, —SO$_2$NR$^{Ar1}$R$^{Ar2}$ and —SO$_3$R$^{Ar2}$, where E$^1$ and E$^2$ are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and R$^{Ar1}$ and R$^{Ar2}$, independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl. In particular, substituted hetaryl groups have one or more, for example 1, 2 or 3 substituent(s) selected from unsubstituted or substituted alkyl, unsubstituted or substituted cycloalkyl, unsubstituted or substituted aryl, fluorine, chlorine, bromine, hydroxyl, alkoxy, polyalkyleneoxy, mercapto, alkylthio, cyano, nitro, NE$^1$E$^2$, —NR$^{Ar1}$COR$^{Ar2}$, —CONR$^{Ar1}$R$^{Ar2}$, —SO$_2$NR$^{Ar1}$R$^{Ar2}$, and —SO$_3$R$^{Ar2}$, where E$^1$, E$^2$, R$^{Ar1}$ and R$^{Ar2}$ are as defined above.

When * or # appears in a formula showing a preferred substructure of a compound of the present invention, it denotes the attachment bond to the remainder of the molecule.

Fused ring systems can comprise alicyclic, aliphatic heterocyclic, aromatic and heteroaromatic rings and combinations thereof, hydroaromatic joined by fusion. Fused ring systems comprise two, three or more (e.g. 4, 5, 6, 7 or 8) rings. Depending on the way in which the rings in fused ring systems are joined, a distinction is made between ortho-fusion, i.e. each ring shares at least one edge or two atoms with each adjacent ring, and peri-fusion in which a carbon atom belongs to more than two rings. Preferred fused ring systems are ortho-fused ring systems.

Preferred embodiments and further aspects of the present invention are outlined in the following paragraphs:

With a view to the use of the compound of the formula (I) according to the invention, the variables $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$, independently of one another and preferably in combination have the following meanings:

Preferably, in the compounds of the formula (I) $R^1$ and $R^2$, independently of each other are selected from $C_1$-$C_{10}$-alkyl, $C_3$-$C_8$-cycloalkyl and $C_6$-$C_{10}$-aryl, wherein the carbon atoms of the aforementioned aliphatic, cycloaliphatic and aromatic radicals may optionally be substituted.

More preferred are compounds of formula (I), wherein $R^1$ and $R^2$, independently of each other are selected from $C_1$-$C_{10}$-alkyl, which is unsubstituted or substituted by $C_6$-$C_{10}$-aryl which in turn is unsubstituted or substituted by 1, 2 or 3 $C_1$-$C_{10}$-alkyl;

$C_3$-$C_8$-cycloalkyl, which is unsubstituted or substituted by 1, 2 or 3 $C_1$-$C_{10}$-alkyl; and $C_6$-$C_{10}$-aryl which is unsubstituted or substituted by 1, 2 or 3 $C_1$-$C_{10}$-alkyl.

Even more preferred are compounds of formula (I), wherein $R^1$ and $R^2$ are independently from each other selected from the group consisting linear $C_1$-$C_8$-alkyl; branched $C_3$-$C_8$-alkyl; $C_1$-$C_8$-alkyl, which is substituted by $C_6$-$C_{10}$-aryl, in particular phenyl; $C_1$-$C_8$-alkyl, which is substituted by $C_6$-$C_{10}$-aryl which in turn is substituted by 1, 2 or 3 $C_1$-$C_6$-alkyl; $C_3$-$C_8$-cycloalkyl; $C_3$-$C_8$-cycloalkyl which carries 1, 2 or 3 $C_1$-$C_6$-alkyl substituents; $C_6$-$C_{10}$-aryl; and $C_6$-$C_{10}$-aryl which carries 1, 2 or 3 $C_1$-$C_6$-alkyl substituents. In particular, $R^1$ and $R^2$, independently of each other are selected from linear $C_1$-$C_8$-alkyl, branched $C_3$-$C_8$-alkyl, $C_3$-$C_8$-cycloalkyl; $C_3$-$C_8$-cycloalkyl which carries 1, 2 or 3 $C_1$-$C_6$-alkyl substituents; $C_6$-$C_{10}$-aryl; and $C_6$-$C_{10}$-aryl which carries 1, 2 or 3 $C_1$-$C_6$-alkyl substituents.

Especially, $R^1$ and $R^2$ are independently of each other are selected from methyl, ethyl, n-propyl, n-butyl, n-pentyl, n-hexyl, n-heptyl or n-octyl, isopropyl, sec-butyl, iso-butyl, tert-butyl, isopentyl, 2-pentyl, tert-pentyl, 2-ethylhexyl, cyclopentyl, cyclohexyl, cycloheptyl, 2-methylcyclohexyl, 2,4-dimethylcyclohexyl, 2,6-dimethylcyclohexyl, 2-ethylcyclohexyl, 2,4-diethylcyclohexyl, 2,6-diethylcyclohexyl, 2-isopropylcyclohexyl, 2,4-diisopropylcyclohexyl, 2,6-diisopropylcyclohexyl, phenyl, naphthyl, 2-methylphenyl, 2,4-dimethylphenyl, 2,6-dimethylphenyl, 2-ethylphenyl, 2,4-diethylphenyl, 2,6-diethylphenyl, 2-n-propylphenyl, 2,4-di-n-propylphenyl 2,6-di-(n-propyl)phenyl, 2-isopropylphenyl, 2,4-diisopropylphenyl and 2,6-diisopropylphenyl.

Preferably, $R^1$ and $R^2$ have the same meaning. Especially more preferred are compounds of the formula (I), wherein $R^1$ and $R^2$ are both phenyl, which carries 1, 2 or 3 $C_1$-$C_4$-alkyl substituents, in particular 2 $C_1$-$C_4$-alkyl substituents. If phenyl carries 2 or 3 $C_1$-$C_4$-alkyl substituents, and especially 2, the alkyl substituents preferably have the same meaning. Especially, $R^1$ and $R^2$ are both phenyl which carries 2 $C_1$-$C_4$-alkyl substituents. More especially, $R^1$ and $R^2$ are both phenyl which carries 2 $C_1$-$C_4$-alkyl substituents where the alkyl substituents are located in the 2- and 6-position of the phenyl ring, i.e. adjacent to the carbon atom bound to the imide nitrogen atom.

Preferably, in the compounds of the formula (I), $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$, independently of each other, are selected from hydrogen, halogen, $C_1$-$C_{20}$-alkyl, $C_3$-$C_{20}$-cycloalkyl, $C_3$-$C_{20}$-cycloalkyloxy, $C_6$-$C_{24}$-aryl, $C_6$-$C_{24}$-aryl-$C_1$-$C_{10}$-alkylene, $C_6$-$C_{24}$-aryloxy and $C_6$-$C_{24}$-arylthio, where the aryl moiety of $C_6$-$C_{10}$-aryl, $C_6$-$C_{10}$-aryl-$C_1$-$C_{10}$-alkylene, $C_6$-$C_{10}$-aryloxy and $C_6$-$C_{10}$-arylthio is unsubstituted or substituted by one or more $C_1$-$C_{10}$-alkyl.

More, preferably, in the compounds of the formula (I), $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$, independently of each other, are selected from hydrogen, halogen such as fluorine, chlorine or bromine, $C_1$-$C_{18}$-alkyl such as methyl, ethyl, propyl, 1-methylethyl, butyl, 1-methylpropyl, 2-methylpropyl, 1,1-dimethylethyl, pentyl, 1-methylbutyl, 2-methylbutyl, 3-methylbutyl, 2,2-dimethylpropyl, 1-ethylpropyl, hexyl, 1,1-dimethylpropyl, 1,2-dimethylpropyl, 1-methylpentyl, 2-methylpentyl, 3-methylpentyl, 4-methylpentyl, 1,1-dimethylbutyl, 1,2-dimethylbutyl, 1,3-dimethylbutyl, 2,2-dimethylbutyl, 2,3-dimethylbutyl, 3,3-dimethylbutyl, 1-ethylbutyl, 2-ethylbutyl, 1,1,2-trimethylpropyl, 1,2,2-trimethylpropyl, 1-ethyl-1-methylpropyl, 1-ethyl-2-methylpropyl, heptyl, octyl, 2-ethylhexyl, nonyl or decyl, $C_6$-$C_{10}$-aryl such as phenyl or naphthyl, $C_6$-$C_{10}$-aryl-$C_1$-$C_{10}$-alkylene such as benzyl, 1-phenylethyl, 2-phenylethyl, 1-naphthylmethyl or 2-naphthylmethyl, $C_6$-$C_{10}$-aryloxy such as phenyloxy or naphthyloxy and $C_6$-$C_{10}$-arylthio such as phenylthio or naphthylthio, where the aryl moiety of $C_6$-$C_{10}$-aryl, $C_6$-$C_{10}$-aryl-$C_1$-$C_{10}$-alkylene, $C_6$-$C_{10}$-aryloxy and $C_6$-$C_{10}$-arylthio is unsubstituted or substituted by one or more $C_1$-$C_{10}$-alkyl.

Even more preferred are compounds of formula (I), wherein $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$, independently of each other, are selected from hydrogen or $C_1$-$C_{18}$-alkyl, especially hydrogen.

Preferred are also compounds of the formula (I), where $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ in formula (I) independently of each other, are selected from hydrogen, halogen, $C_1$-$C_{18}$-alkyl, $C_6$-$C_{10}$-aryl, $C_6$-$C_{10}$-aryl-$C_1$-$C_{10}$-alkylene, $C_6$-$C_{10}$-aryloxy and $C_6$-$C_{10}$-arylthio, where the aryl moiety of $C_6$-$C_{10}$-aryl, $C_6$-$C_{10}$-aryl-$C_1$-$C_{10}$-alkylene, $C_6$-$C_{10}$-aryloxy and $C_6$-$C_{10}$-arylthio is unsubstituted or substituted by one or more $C_1$-$C_{10}$-alkyl, and in addition $R^4$ and $R^5$, $R^5$ and $R^6$, $R^6$ and $R^7$, $R^7$ and $R^8$, $R^8$ and $R^9$, $R^{12}$ and $R^{13}$, $R^{13}$ and $R^{14}$, $R^{14}$ and $R^{15}$, $R^{15}$ and $R^{16}$ and/or $R^{16}$ and $R^{17}$ together with the carbon atoms of the biphenylyl moiety to which they are bonded, may also form a further fused cyclohexane, benzene or naphthalene, especially benzene ring system, wherein the ring system is unsubstituted or carries one or more substituents selected from halogen, cyano, $C_1$-$C_{18}$-alkyl, $C_1$-$C_{18}$-alkoxy or $C_1$-$C_{18}$-alkylthio. If $R^4$ and $R^5$, $R^5$ and $R^6$, $R^6$ and $R^7$, $R^7$ and $R^8$, $R^8$ and $R^9$, $R^{12}$ and $R^{13}$, $R^{13}$ and $R^{14}$, $R^{14}$ and $R^{15}$, $R^{15}$ and $R^{16}$ and/or $R^{16}$ and $R^{17}$ together with the carbon atoms of the biphenylyl moiety to which they are bonded, form a further fused benzene ring system, the ring system is preferably unsubstituted. More preferred are compounds of formula (I), wherein $R^5$ and $R^6$, $R^6$ and $R^7$, $R^7$ and $R^8$, $R^{13}$ and $R^{14}$, $R^{14}$ and $R^{15}$ and/or $R^{15}$ and $R^{16}$ together with the carbon atoms of the biphenylyl moiety to which they are bonded, may also be a fused benzene, while the remaining radicals $R^5$, $R^6$, $R^7$, $R^8$, $R^{13}$, $R^{14}$, $R^{15}$ and $R^{16}$, independently of each other, are selected from hydrogen and $C_1$-$C_{18}$-alkyl; $R^4$, $R^9$, $R^{12}$ and $R^{17}$ are selected from hydrogen and $C_1$-$C_{18}$-alkyl and $R^3$, $R^{10}$, $R^{11}$ and $R^{18}$ are each hydrogen. In particular, $R^3$, $R^{10}$, $R^{11}$ and $R^{18}$ are each hydrogen; $R^4$, $R^5$, $R^6$, $R^7$, $R^8$, $R^9$, $R^{12}$, $R^{13}$, $R^{14}$, $R^{15}$, $R^{16}$ and $R^{17}$ are selected from hydrogen and $C_1$-$C_{18}$-alkyl, and in addition $R^5$ and $R^6$, $R^7$ and $R^8$, $R^{13}$ and $R^{14}$, and/or $R^{15}$ and $R^{16}$ together with the carbon atoms of the biphenylyl moiety to which they are bonded, may also be a fused benzene ring system.

In particular, preference is given to the compound of the formula (I), wherein $R^1$ and $R^2$ are each phenyl which carries 1, 2 or 3 $C_1$-$C_4$-alkyl substituents and $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ are all hydrogen.

Compounds of formula (I) can be prepared by reacting an appropriate chlorinated or brominated perylene bisimide of formula (1)

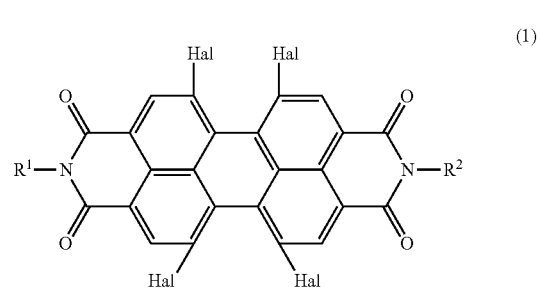

where
Hal is in each case bromine or in each case chlorine; and
R$^1$ and R$^2$ are as defined above;
with a 2,2'-biphenol compound of formula (2) and, if appropriate, a 2,2'-biphenol compound of formula (3)

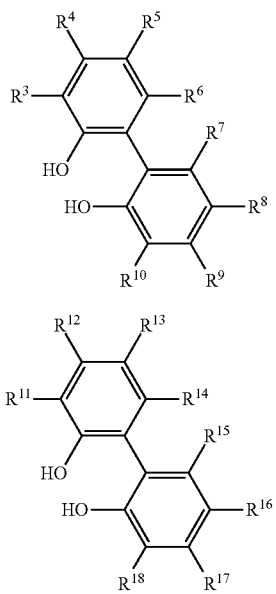

where
R$^3$, R$^4$, R$^5$, R$^6$, R$^7$, R$^8$, R$^9$, R$^{10}$, R$^{11}$, R$^{12}$, R$^{13}$, R$^{14}$, R$^{15}$, R$^{16}$, R$^{17}$ and R$^{18}$ are as defined above.

The 2,2'-biphenol of formula (3) may also be as defined for the 2,2'-biphenol of formula (2), if only one 2,2'-biphenol of the formula (2) is used for halogen replacement reaction.

The reaction is usually carried out in the presence of a base. Suitable bases are in particular inorganic alkali metal or alkaline earth metal bases, the alkali metal bases being particularly suitable. Examples of inorganic bases are the carbonates and hydrogencarbonates, hydroxides, hydrides and amides of alkali metals and alkaline earth metals. Preferred bases are the carbonates and hydrogencarbonates, particular preference being given to the carbonates. Preferred alkali metals are lithium, sodium, potassium and cesium; particularly suitable alkaline earth metals are magnesium and calcium. It will be appreciated that it is also possible to use base mixtures. Very particularly preferred bases are lithium carbonate, sodium carbonate, potassium carbonate and cesium carbonate.

The reaction is usually carried out in the presence of a polar, aprotic solvent. Suitable solvents are especially aliphatic carboxamides, preferably N,N-di-C$_1$-C$_4$-alkyl-C$_1$-C$_4$-carboxamides, lactams such as dimethylformamide, diethylformamide, dimethylacetamide, dimethylbutyramide and N-methyl-2-pyrrolidone (NMP), nitriles such as acetonitrile. It is also possible to use mixtures of polar, aprotic solvents. Particular preference is given to NMP.

The reaction temperature is generally within the range from room temperature to the boiling point of the solvent, preferably 40 to 160° C.

Compounds of formula (1) can be prepared according to literature methods, for example from 1,6,7,12-tetrachloroperylene tetracarboxylic acid dianhydride or 1,6,7,12-tetrabromoperylene tetracarboxylic acid dianhydride of formula (4)

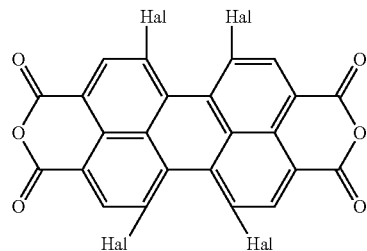

where
Hal is in each case bromine or in each case chlorine;
by condensation with a primary amine of formula R$^1$—NH$_2$ and, if appropriate a primary amine of formula R$^2$—NH$_2$, where R$^1$ and R$^2$ are as defined above, where R$^2$ may also be as defined for R$^1$ (if only one amine of the formula R$^1$—NH$_2$ is used for the imidation). The imidation reaction is carried out according to standard methods, e.g. as described by Bartholomew et al., in *Chem. Commun.*, 2008, 6594-6596 including Supplementary Material (ESI) for Chemical Communications.

1,6,7,12-tetrachloroperylene tetracarboxylic acid dianhydride is commercially available; 1,6,7,12-tetrabromoperylene tetracarboxylic acid dianhydride can be prepared as described by Bartholomew et al., in *Chem. Commun.*, 2008, 6594-6596 including Supplementary Material (ESI). Compounds of formulae (2) and (3) are commercially available or can be prepared according to literature methods.

The compound of the formula (I) and mixtures thereof may be incorporated without any problem into organic and inorganic materials and are therefore suitable for a whole series of end uses.

The inventive perylene bisimide compound of the formula (I) and mixtures thereof are notable as fluorescent dye in color converters.

Accordingly, the present invention further provides a color converter comprising in a polymeric matrix material at least one perylene bisimide compound of the formula (I) or a mixture thereof as fluorescent dye.

The polymers serve as matrix material for the inventive organic fluorescent dye selected from a compound of the formula (I) and mixtures thereof.

Suitable polymers are in principle all polymers capable of dissolving or homogeneously dispersing the at least one compound of the formula (I) or a mixture of compounds of formula (I) in a sufficient amount.

Suitable polymers may be inorganic polymers or organic polymers.

In a preferred embodiment, the polymeric matrix consists essentially of polymers selected from polystyrene, polycarbonate, polymethylmethacrylate, polyvinylpyrrolidone, polymethacrylate, polyvinyl acetate, polyvinyl chloride, polybutene, silicone, polyacrylate, epoxy resin, polyvinyl alcohol, poly(ethylene vinylalcohol)-copolymer (EVA, EVOH), polyacrylonitrile, polyvinylidene chloride (PVDC), polystyrene acrylonitrile (SAN), polybutylene terephthalate (PBT), polyethylene terephthalate (PET), polyvinyl butyrate (PVB), polyvinyl chloride (PVC), polyamides, polyoxymethylenes, polyimides, polyetherimides and mixtures thereof, preferably polystyrene, polycarbonate or polyethylene terephthalate.

More preferably, the polymeric matrix consists essentially of polymers selected from polystyrene, polycarbonate, polymethylmethacrylate, polyvinylpyrrolidone, polymethacrylate, polyvinyl acetate, polyvinyl chloride, polybutene, silicone, polyacrylate, epoxy resin, polyvinyl alcohol, poly(ethylene vinylalcohol)-copolymer, polyacrylonitrile, polyvinylidene chloride, polystyreneacrylonitrile, polybutylene terephthalate, polyethylene terephthalate, polyvinyl butyrate, polyvinyl chloride, polyamides, polyoxymethylenes, polyimides, polyetherimides and mixtures thereof.

In particular, the polymeric matrix consists essentially of polymers selected from polystyrene, polycarbonate, polymethylmethacrylate, polyethylene terephthalate or mixtures thereof.

Polystyrene is understood here to mean, inter alia, all homo- or copolymers which result from polymerization of styrene and/or derivatives of styrene. Derivatives of styrene are, for example, alkylstyrenes such as alpha-methylstyrene, ortho-, meta-, para-methylstyrene, para-butylstyrene, especially para-tert-butylstyrene, alkoxystyrene such as para-methoxystyrene, para-butoxystyrene, para-tert-butoxystyrene.

In general, suitable polystyrenes have a mean molar mass $M_n$ of 10000 to 1000000 g/mol (determined by GPC), preferably 20000 to 750000 g/mol, more preferably 30000 to 500000 g/mol.

In a preferred embodiment, the matrix of the color converter consists essentially or completely of a homopolymer of styrene or styrene derivatives. More particularly, the polymer consists of polystyrene.

In further preferred embodiments of the invention, the matrix consists essentially or completely of a styrene copolymer, which are likewise regarded as polystyrene in the context of this application. Styrene copolymers may comprise, as further constituents, for example, butadiene, acrylonitrile, maleic anhydride, vinylcarbazole or esters of acrylic, methacrylic or itaconic acid as monomers. Suitable styrene copolymers generally comprise at least 20% by weight of styrene, preferably at least 40% and more preferably at least 60% by weight of styrene. In another embodiment, they comprise at least 90% by weight of styrene.

Preferred styrene copolymers are styrene-acrylonitrile copolymers (SAN) and acrylonitrile-butadiene-styrene copolymers (ABS), styrene-1,1'-diphenylethene copolymers, acrylic ester-styrene-acrylonitrile copolymers (ASA), methyl methacrylate-acrylonitrile-butadiene-styrene copolymers (MABS).

A further preferred polymer is alpha-methylstyrene-acrylonitrile copolymer (AMSAN).

The styrene homo- or copolymers can be prepared, for example, by free-radical polymerization, cationic polymerization, anionic polymerization or under the influence of organometallic catalysts (for example Ziegler-Natta catalysis). This can lead to isotactic, syndiotactic or atactic polystyrene or copolymers. They are preferably prepared by free-radical polymerization. The polymerization can be performed as a suspension polymerization, emulsion polymerization, solution polymerization or bulk polymerization.

The preparation of suitable polystyrenes is described, for example, in Oscar Nuyken, Polystyrenes and Other Aromatic Polyvinyl Compounds, in Kricheldorf, Nuyken, Swift, N.Y. 2005, p. 73-150 and references cited therein; and in Elias, Macromolecules, Weinheim 2007, p. 269-275.

Likewise more particularly, the polymer consists of polyethylene terephthalate. Polyethylene terephthalate is obtainable by condensation of ethylene glycol with terephthalic acid.

Likewise more particularly, the polymer consists of polycarbonate. Polycarbonates are polyesters of carbonic acid with aromatic or aliphatic dihydroxyl compounds. Preferred dihydroxyl compounds are, for example, methylenediphenylenedihydroxyl compounds, for example bisphenol A.

One means of preparing polycarbonates is the reaction of suitable dihydroxyl compounds with phosgene in an interfacial polymerization. Another means is the reaction with diesters of carbonic acid such as diphenyl carbonate in a condensation polymerization.

The preparation of suitable polycarbonates is described, for example, in Elias, Macromolecules, Weinheim 2007, p. 343-347.

In a preferred embodiment, polymers which have been polymerized with exclusion of oxygen are used. Preferably, the monomers during the polymerization comprised a total of not more than 1000 ppm of oxygen, more preferably not more than 100 ppm and especially preferably not more than 10 ppm.

Suitable polymers may comprise, as further constituents, additives such as flame retardants, antioxidants, light stabilizers, UV absorbers, free-radical scavengers, antistats. Stabilizers of this kind are known to those skilled in the art.

Suitable antioxidants or free-radical scavengers are, for example, phenols, especially sterically hindered phenols such as butylhydroxyanisole (BHA) or butylhydroxytoluene (BHT), or sterically hindered amines (HALS). Stabilizers of this kind are sold, for example, by BASF under the Irganox® trade name. In some cases, antioxidants and free-radical scavengers can be supplemented by secondary stabilizers such as phosphites or phosphonites, as sold, for example, by BASF under the Irgafos® trade name.

Suitable UV absorbers are, for example, benzotriazoles such as 2-(2-hydroxyphenyl)-2H-benzotriazole (BTZ), triazines such as (2-hydroxyphenyl)-s-triazine (HPT), hydroxybenzophenones (BP) or oxalanilides. UV absorbers of this kind are sold, for example, by BASF under the Uvinul® trade name.

In a preferred embodiment of the invention, suitable polymers do not comprise any antioxidants or free-radical scavengers.

In a further embodiment of the invention, suitable polymers are transparent polymers.

In another embodiment, suitable polymers are opaque polymers.

The inventive fluorescent dye(s), i.e. the compound of the formula (I) or a mixture thereof may either be dissolved in the polymer or may be in the form of a homogeneously distributed mixture. The fluorescent dyes are preferably dissolved in the polymer. The compound of the formula (I) is a red-fluorescing fluorescent dye.

In a preferred embodiment, color converters comprise, in addition to the at least one organic red-fluorescent dye according to the invention and mixtures thereof, further organic fluorescent dyes. Suitable further organic fluorescent dyes may be any organic fluorescent dye that absorbs light in the wavelength range from 400 to 500 nm and emits light having a longer wavelength than that of the absorbed light, especially in the wavelength range above 450 nm, for example in the wavelength range from 450 to 600 nm or 450 to 650 nm.

Different organic fluorescent dyes may be combined to optimize energy efficiency and—in particular—luminous efficacy. Suitable further organic fluorescent dyes are green-fluorescent dyes, yellow-green fluorescent dyes, yellow-fluorescent dyes, orange-fluorescent dyes and red-fluorescent dyes. Preferably, fluorescent dyes are combined with one another such that color converters with high energy and photometric efficacy are obtained.

In a preferred embodiment, color converters comprise, as well as the at least one inventive fluorescent dye of the formula (I) or mixtures thereof, further organic fluorescent dyes.

In particular, further organic fluorescent dyes are selected from
(i) a cyanated naphthalene benzimidazole compound of the formula (II)

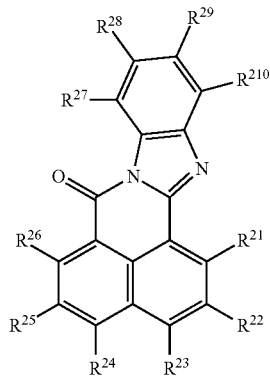

(II)

wherein
$R^{21}$, $R^{22}$, $R^{23}$, $R^{24}$, $R^{25}$, $R^{26}$, $R^{27}$, $R^{28}$, $R^{29}$ and $R^{210}$ are each independently hydrogen, cyano or aryl which is unsubstituted or has one or more identical or different substituents $R^{2Ar}$,
where
each $R^{2Ar}$ is independently selected from cyano, hydroxyl, mercapto, halogen, $C_1$-$C_{20}$-alkoxy, $C_1$-$C_{20}$-alkylthio, nitro, —$NR^{2Ar2}R^{2Ar3}$, —$NR^{2Ar2}COR^{2Ar3}$, —$CONR^{2Ar2}R^{2Ar3}$, —$SO_2NR^{2Ar2}R^{2Ar3}$, —$COOR^{2Ar2}$, —$SO_3R^{2Ar2}$,
$C_1$-$C_{30}$-alkyl, $C_2$-$C_{30}$-alkenyl, $C_2$-$C_{30}$-alkynyl, where the three latter radicals are unsubstituted or bear one or more $R^{2a}$ groups,
$C_3$-$C_8$-cycloalkyl, 3- to 8-membered heterocyclyl, where the two latter radicals are unsubstituted or bear one or more $R^{2b}$ groups,
aryl, U-aryl, heteroaryl and U-heteroaryl, where the four latter radicals are unsubstituted or bear one or more $R^{2b}$ groups,
where
each $R^{2a}$ is independently selected from cyano, hydroxyl, oxo, mercapto, halogen, $C_1$-$C_{20}$-alkoxy, $C_1$-$C_{20}$-alkylthio, nitro,
—$NR^{2Ar2}R^{Ar3}$, —$NR^{2Ar2}COR^{2Ar3}$,
—$CONR^{2Ar2}R^{Ar3}$, —$SO_2NR^{2Ar2}R^{Ar3}$,
—$COOR^{2Ar2}$, —$SO_3R^{2Ar2}$, $C_3$-$C_8$-cycloalkyl, 3- to 8-membered heterocyclyl, aryl and heteroaryl, where the cycloalkyl, heterocyclyl, aryl and heteroaryl radicals are unsubstituted or bear one or more $R^{2b}$ groups;
each $R^{2b}$ is independently selected from cyano, hydroxyl, oxo, mercapto, halogen, $C_1$-$C_{20}$-alkoxy, $C_1$-$C_{20}$-alkylthio, nitro,
—$NR^{2Ar2}R^{2Ar3}$, —$NR^{2Ar2}COR^{2Ar3}$,
—$CONR^{2Ar2}R^{2Ar3}$, —$SO_2NR^{2Ar2}R^{2Ar3}$,
—$COOR^{2Ar2}$, —$SO_3R^{2Ar2}$, $C_1$-$C_{18}$-alkyl, $C_2$-$C_{18}$-alkenyl, $C_2$-$C_{18}$-alkynyl, $C_3$-$C_8$-cycloalkyl, 3- to 8-membered heterocyclyl, aryl and heteroaryl, where the four latter radicals are unsubstituted or bear one or more $R^{2b1}$ groups,
each $R^{2b1}$ is independently selected from cyano, hydroxyl, mercapto, oxo, nitro, halogen,
—$NR^{2Ar2}R^{2Ar3}$, —$NR^{2Ar2}COR^{2Ar3}$,
—$CONR^{2Ar2}R^{2Ar3}$, —$SO_2NR^{2Ar2}R^{2Ar3}$,
—$COOR^{2Ar2}$, —$SO_3R^{2Ar2}$, —$SO_3R^{2Ar2}$, $C_1$-$C_{18}$-alkyl, $C_2$-$C_{18}$-alkenyl, $C_2$-$C_{18}$-alkynyl, $C_1$-$C_{12}$-alkoxy, and $C_1$-$C_{12}$-alkylthio,
U is an —O—, —S—, —$NR^{2Ar1}$—, —CO—, —SO— or —$SO_2$— moiety;
$R^{2Ar1}$, $R^{2Ar2}$, $R^{2Ar3}$ are each independently hydrogen, $C_1$-$C_{18}$-alkyl, 3- to 8-membered cycloalkyl, 3- to 8-membered heterocyclyl, aryl or heteroaryl, where alkyl is unsubstituted or bears one or more $R^{2a}$ groups, where 3- to 8-membered cycloalkyl, 3- to 8-membered heterocyclyl, aryl and heteroaryl are unsubstituted or bear one or more $R^{2b}$ groups;
with the proviso that the compound of the formula (II) comprises at least one cyano group,
or mixtures thereof;
(ii) a cyanated perylene compound of the formula (III)

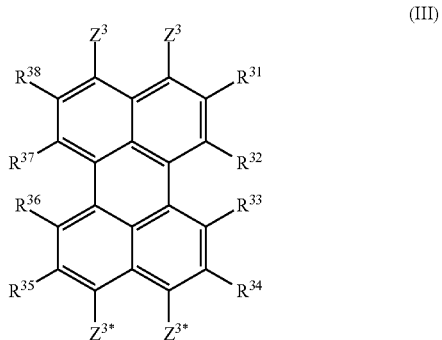

(III)

in which
one of the $Z^3$ substituents is cyano and the other $Z^3$ substituent is $CO_2R^{39}$, $CONR^{310}R^{311}$, $C_1$-$C_{18}$-alkyl, $C_2$-$C_{18}$-alkenyl, $C_2$-$C_{18}$-alkynyl, $C_3$-$C_{12}$-cycloalkyl or $C_6$-$C_{14}$-aryl, where
$C_1$-$C_{18}$-alkyl, $C_2$-$C_{18}$-alkenyl, $C_2$-$C_{18}$-alkynyl are unsubstituted or bear one or more identical or different $Z^{3a}$ substituents,
$C_3$-$C_{12}$-cycloalkyl is unsubstituted or bears one or more identical or different $Z^{3b}$ substituents, and
$C_6$-$C_{14}$-aryl is unsubstituted or bears one or more identical or different $Z^{3Ar}$ substituents;
one of the $Z^{3*}$ substituents is cyano and the other $Z^{3*}$ substituent is $CO_2R^{39}$, $CONR^{310}R^{311}$, $C_1$-$C_{18}$-alkyl, $C_2$-$C_{18}$-alkenyl, $C_2$-$C_{18}$-alkynyl, $C_3$-$C_{12}$-cycloalkyl or $C_6$-$C_{14}$-aryl, where
$C_1$-$C_{18}$-alkyl, $C_2$-$C_{18}$-alkenyl, $C_2$-$C_{18}$-alkynyl are unsubstituted or bear one or more identical or different $Z^{3a}$ substituents,
$C_3$-$C_{12}$-cycloalkyl is unsubstituted or bears one or more identical or different $Z^{3b}$ substituents, and $C_6$-$C_{14}$-aryl is unsubstituted or bears one or more identical or different $Z^{3Ar}$ substituents;
$R^{31}$, $R^{32}$, $R^{33}$, $R^{34}$, $R^{35}$, $R^{36}$, $R^{37}$ and $R^{38}$ are each independently selected from hydrogen, cyano, bromine and chlorine,
with the proviso that 1, 2, 3, 4, 5, 6, 7 or 8 of the $R^{31}$, $R^{32}$, $R^{33}$, $R^{34}$, $R^{35}$, $R^{36}$, $R^{37}$ or $R^{38}$ substituents are cyano;

where
R$^{39}$ is hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl, where
$C_1$-$C_{10}$-alkyl, $C_2$-$C_{10}$-alkenyl, $C_2$-$C_{10}$-alkynyl are unsubstituted or bear one or more identical or different R$^{3a}$ substituents,
$C_3$-$C_{12}$-cycloalkyl is unsubstituted or bears one or more identical or different R$^{3b}$ substituents and
$C_6$-$C_{14}$-aryl is unsubstituted or bears one or more identical or different R$^{3Ar}$ substituents;
R$^{310}$ and R$^{311}$ are each independently hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl, where
$C_1$-$C_{10}$-alkyl, $C_2$-$C_{10}$-alkenyl, $C_2$-$C_{10}$-alkynyl are unsubstituted or bear one or more identical or different R$^{3a}$ substituents,
$C_3$-$C_{12}$-cycloalkyl is unsubstituted or bears one or more identical or different R$^{3b}$ substituents and
$C_6$-$C_{14}$-aryl is unsubstituted or bears one or more identical or different R$^{3Ar}$ substituents;
each $Z^{3a}$ is independently halogen, hydroxyl, NR$^{310a}$R$^{311a}$, $C_1$-$C_{10}$-alkoxy, $C_1$-$C_{10}$-haloalkoxy, $C_1$-$C_{10}$-alkylthio, $C_3$-$C_{12}$-cycloalkyl, $C_6$-$C_{14}$-aryl, C(=O)R$^{39a}$; C(=O)OR$^{39a}$ or C(O)NR$^{310a}$R$^{311a}$, where
$C_3$-$C_{12}$-cycloalkyl is unsubstituted or bears one or more identical or different R$^{3b}$ substituents and
$C_6$-$C_{14}$-aryl is unsubstituted or bears one or more identical or different R$^{3Ar}$ substituents;
each $Z^{3b}$ and each $Z^{3Ar}$ is independently halogen, hydroxyl, NR$^{310a}$R$^{311a}$, $C_1$-$C_{10}$-alkyl, $C_1$-$C_{10}$-alkoxy, $C_1$-$C_{10}$-haloalkoxy, $C_1$-$C_{10}$-alkylthio, C(=O)R$^{39a}$; C(=O)OR$^{39a}$ or C(O)NR$^{310a}$R$^{311a}$;
each R$^{3a}$ is independently halogen, hydroxyl, $C_1$-$C_{10}$-alkoxy, $C_3$-$C_{12}$-cycloalkyl or $C_6$-$C_{14}$-aryl;
each R$^{3b}$ is independently halogen, hydroxyl, $C_1$-$C_{10}$-alkyl, $C_1$-$C_{10}$-alkoxy, $C_1$-$C_{10}$-haloalkoxy, $C_1$-$C_{10}$-alkylthio, $C_2$-$C_{10}$-alkenyl, $C_2$-$C_{10}$-alkynyl, $C_3$-$C_{12}$-cycloalkyl or $C_6$-$C_{14}$-aryl;
each R$^{3Ar}$ is independently halogen, hydroxyl, $C_1$-$C_{10}$-alkyl, $C_1$-$C_{10}$-alkoxy, $C_1$-$C_{10}$-haloalkoxy, $C_1$-$C_{10}$-alkylthio, $C_2$-$C_{10}$-alkenyl, $C_2$-$C_{10}$-alkynyl, $C_3$-$C_{12}$-cycloalkyl or $C_6$-$C_{14}$-aryl;
R$^{39a}$ is hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl; and
R$^{310a}$, R$^{311a}$ are each independently hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl,
and mixtures thereof.
(iii) a cyanated compound of the formula (IV)

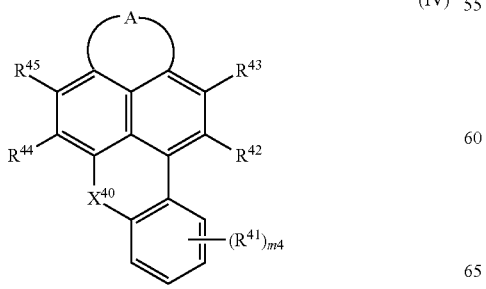

(IV)

wherein
m4 is 0, 1, 2, 3 or 4;
each R$^{41}$ independently from each other is selected from bromine, chlorine, cyano, —NR$^{4a}$R$^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy, $C_6$-$C_{24}$-aryl-$C_1$-$C_{10}$-alkylene, where the rings of cycloalkyl, heterocycloalkyl, heteroaryl, aryl, aryloxy in the six last-mentioned radicals are unsubstituted or substituted with 1, 2, 3, 4 or 5 identical or different radicals R$^{41a}$ and where $C_1$-$C_{24}$-alkyl, $C_1$-$C_{24}$-haloalkyl, $C_1$-$C_{24}$-alkoxy, and the alkylene moiety of $C_6$-$C_{24}$-aryl-$C_1$-$C_{10}$-alkylene may be interrupted by one or more groups selected from O, S and NR$^{4c}$;
at least one of the radicals R$^{42}$, R$^{43}$, R$^{44}$ and R$^{45}$ is CN, and the remaining radicals, independently from each other, are selected from hydrogen, chlorine and bromine;
X$^{40}$ is O, S, SO or SO$_2$;
A is a diradical selected from diradicals of the general formulae (A.1), (A.2), (A.3), and (A.4)

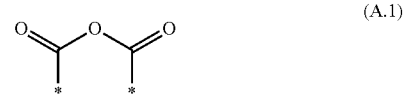

(A.1)

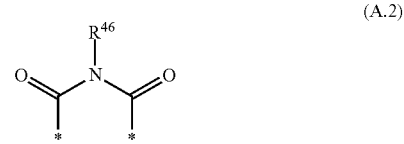

(A.2)

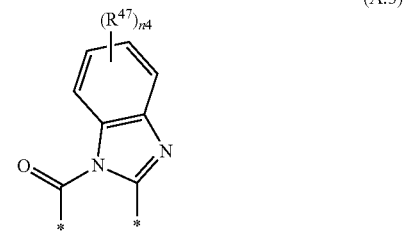

(A.3)

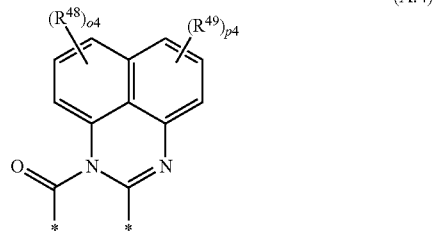

(A.4)

wherein
* in each case denotes the point of attachments to the remainder of the molecule;
n4 is 0, 1, 2, 3 or 4;
o4 is 0, 1, 2 or 3;
p4 is 0, 1, 2 or 3;
R$^{46}$ is hydrogen, $C_1$-$C_{24}$-alkyl, $C_1$-$C_{24}$-haloalkyl, $C_3$-$C_{24}$-cycloalkyl, $C_6$-$C_{24}$-aryl or $C_6$-$C_{24}$-aryl-$C_1$-$C_{10}$-alkylene, where the rings of cycloalkyl, aryl, and aryl-alkylene in the three last-mentioned radicals are unsubstituted or substituted with 1, 2, 3, 4 or 5 identical or different radicals R$^{46a}$, and where $C_1$-$C_{24}$-alkyl, $C_1$-$C_{24}$-haloalkyl and the alkylene moiety of $C_6$-$C_{24}$-aryl-$C_1$-$C_{10}$-alkylene may be interrupted by one or more heteroatoms or heteroatomic groups selected from O, S and $NR^{4c}$;

each $R^{47}$ independently from each other is selected from bromine, chlorine, cyano, —$NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy, $C_6$-$C_{24}$-aryl-$C_1$-$C_{10}$-alkylene, where the rings of cycloalkyl, heterocycloalkyl, heteroaryl, aryl and aryl-alkylene in the six last-mentioned radicals are unsubstituted or substituted with 1, 2, 3, 4 or 5 identical or different radicals $R^{47a}$ and where $C_1$-$C_{24}$-alkyl, $C_1$-$C_{24}$-haloalkyl, $C_1$-$C_{24}$-alkoxy, $C_1$-$C_{24}$-haloalkoxy, and the alkylene moiety of $C_6$-$C_{24}$-aryl-$C_1$-$C_{10}$-alkylene may be interrupted by one or more groups selected from O, S and $NR^{4c}$;

each $R^{48}$ independently from each other is selected from bromine, chlorine, cyano, $NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy, $C_6$-$C_{24}$-aryl-$C_1$-$C_{10}$-alkylene, where the rings of cycloalkyl, heterocycloalkyl, heteroaryl, aryl and aryl-alkylene in the six last-mentioned radicals are unsubstituted or substituted with 1, 2, 3, 4 or 5 identical or different radicals $R^{48a}$ and where $C_1$-$C_{24}$-alkyl, $C_1$-$C_{24}$-haloalkyl, $C_1$-$C_{24}$-alkoxy, $C_1$-$C_{24}$-haloalkoxy, and the alkylene moiety of $C_6$-$C_{24}$-aryl-$C_1$-$C_{10}$-alkylene may be interrupted by one or more groups selected from O, S and $NR^{4c}$;

each $R^{49}$ independently from each other is selected from bromine, chlorine, cyano, $NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy, $C_6$-$C_{24}$-aryl-$C_1$-$C_{10}$-alkylene, where the rings of cycloalkyl, heterocycloalkyl, heteroaryl, aryl and aryl-alkylene in the six last-mentioned radicals are unsubstituted or substituted with 1, 2, 3, 4 or 5 identical or different radicals $R^{49a}$ and where $C_1$-$C_{24}$-alkyl, $C_1$-$C_{24}$-haloalkyl, $C_1$-$C_{24}$-alkoxy, $C_1$-$C_{24}$-haloalkoxy, and the alkylene moiety of $C_6$-$C_{24}$-aryl-$C_1$-$C_{10}$-alkylene may be interrupted by one or more groups selected from O, S and $NR^{4c}$;

$R^{41a}$, $R^{46a}$, $R^{47a}$, $R^{48a}$, $R^{49a}$ are independently of one another selected from $C_1$-$C_{24}$-alkyl, $C_1$-$C_{24}$-fluoroalkyl, $C_1$-$C_{24}$-alkoxy, fluorine, chlorine and bromine;

$R^{4a}$, $R^{4b}$, $R^{4c}$ are independently of one another are selected from hydrogen, $C_1$-$C_{20}$-alkyl, $C_3$-$C_{24}$-cycloalkyl, heterocycloalkyl, heteroaryl and $C_6$-$C_{24}$-aryl;

and mixtures thereof;

(iv) a benzoxanthene compound of the formula (V)

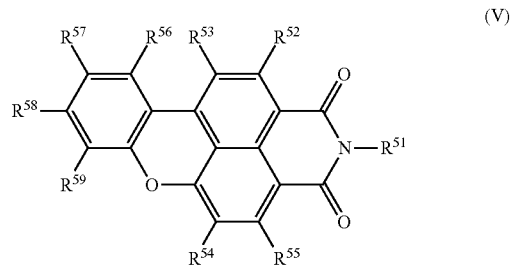

wherein
$R^{51}$ is phenyl which is unsubstituted or carries 1, 2, 3, 4, or 5 substituents selected from halogen, $R^{511}$, $OR^{552}$, $NHR^{552}$ and $NR^{552}R^{557}$;

$R^{52}$, $R^{53}$, $R^{54}$, $R^{55}$, $R^{56}$, $R^{57}$, $R^{58}$ and $R^{59}$ are independently of each other selected from hydrogen, halogen, $R^{553}$, $OR^{553}$, $NHR^{553}$ and $NR^{553}R^{554}$, wherein
$R^{511}$ is selected from $C_2$-$C_{18}$-alkyl, $C_6$-$C_{24}$-aryl and heteroaryl;

$R^{552}$ and $R^{557}$ are independently of each other selected from $C_1$-$C_{18}$-alkyl, $C_6$-$C_{24}$-aryl and heteroaryl; and $R^{553}$ and $R^{554}$ are independently of each other selected from $C_1$-$C_{18}$-alkyl, $C_6$-$C_{24}$-aryl and heteroaryl;

and mixtures thereof;

(v) a fluorescent compound comprising at least one structural unit of formula (VI)

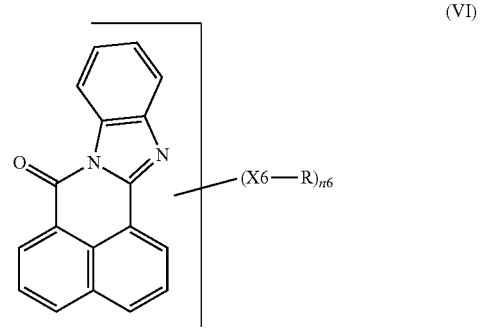

where one or more CH groups of the six-membered ring of the benzimidazole structure shown may be replaced by nitrogen and where the symbols are each defined as follows:

n6 is a number from 0 to (10-p6) for each structural unit of the formula (VI); where p6 is the number of CH units which have been replaced by nitrogen in the six-membered ring of the benzimidazole structure shown X6 is a chemical bond, O, S, SO, $SO_2$, $NR^{61}$; and R is an aliphatic radical, cycloaliphatic radical, aryl, heteroaryl, each of which may bear any substituents, an aromatic or heteroaromatic ring or ring system, each of which is fused to other aromatic rings of the structural unit of the formula (VI)

is F, Cl, Br, CN, H when X6 is not a chemical bond;

where two R radicals may be joined to give one cyclic radical and where X6 and R, when n6>one, may be the same or different;

$R^{61}$ is each independently hydrogen, $C_1$-$C_{18}$-alkyl or cycloalkyl, the carbon chain of which may comprise one or more —O—, —S—, —CO—, —SO— and/or —SO$_2$—moieties and which may be mono- or polysubstituted;
aryl or heteroaryl which may be mono- or polysubstituted;
and mixtures thereof;
and
(vi) a perylene compound of the formulae (VII), (VIII) or (IX)

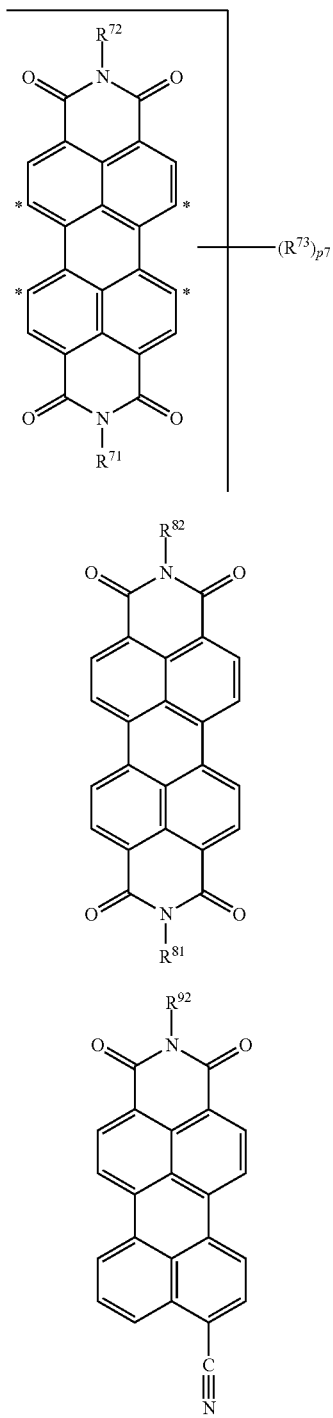

where
p7 is 1 to 4,
$R^{71}$, $R^{72}$ are each independently $C_1$-$C_{30}$-alkyl, $C_3$-$C_8$-cycloalkyl, aryl, heteroaryl, aryl-$C_1$-$C_{10}$-alkylene, where the aromatic ring in the three latter radicals is unsubstituted or mono- or polysubstituted by $C_1$-$C_{10}$-alkyl;
each $R^{73}$ is independently aryloxy which is unsubstituted or mono- or polysubstituted by $C_1$-$C_{10}$-alkyl, where the $R^{73}$ radicals are at one or more of the positions indicated by *;
$R^{81}$, $R^{82}$ are each independently $C_1$-$C_{30}$-alkyl, $C_3$-$C_8$-cycloalkyl, aryl, heteroaryl, aryl-$C_1$-$C_{10}$-alkylene, where the aromatic ring in the three latter radicals is unsubstituted or mono- or polysubstituted by $C_1$-$C_{10}$-alkyl;
$R^{92}$ is $C_1$-$C_{30}$-alkyl, $C_3$-$C_8$-cycloalkyl, aryl, heteroaryl, aryl-$C_1$-$C_{10}$-alkylene, where the aromatic ring in the three latter radicals is unsubstituted or mono- or polysubstituted by $C_1$-$C_{10}$-alkyl
and mixtures thereof.

Surprisingly, when the color converter comprises a combination of a compound of the formula (I) or a mixture thereof and at least one further organic fluorescent dye selected from
a compound of the formulae (II) and mixtures thereof,
a compound of the formula (III) and mixtures thereof,
a compound of the formula (IV) and mixtures thereof,
a compound of the formula (V) and mixtures thereof,
a compound of the formula (VI) and mixtures thereof,
a compound of the formula (VII) and mixtures thereof,
a compound of the formula (VIII) and mixtures thereof,
a compound of the formula (IX) and mixtures thereof,
and mixtures thereof
a color converter is provided with high luminous efficacy for converting LED light to white light. In addition, using a compound of the formula (I) or a mixture thereof together with a yellow-fluorescent dye, a good tradeoff between luminous efficacy and color rendering of white LEDs is achieved.

In addition, the color converter according to the invention together with blue light of a LED is able to provide white-light having any color temperature in the range between 2000 K and 7500 K. In addition, the color converter according to the present invention together with a white LED having a color temperature of 20000K to 4500K, preferably 12000 K to 7000 K provides white light having a color temperature in the range between 2000 K and 7500 K with high color rendering.

Fluorescent dyes of the formula (II) are known from WO 2015/019270. Among the compounds of formula (II), particular preference is given to those of the general formula II-A

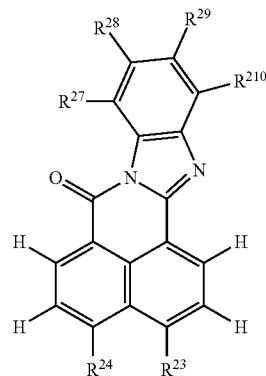

(II-A)

and mixtures thereof
in which
R²³ and R²⁴ are each independently cyano, phenyl, 4-cyanophenyl or phenyl which carries 1, 2 or 3 substituents selected from $C_1$-$C_{10}$-alkyl, especially cyano, phenyl or 4-cyanophenyl; and R²⁷, R²⁸, R²⁹ and R²¹⁰ are each independently hydrogen, cyano, phenyl, 4-cyanophenyl or phenyl which carries 1, 2 or 3 substituents selected from $C_1$-$C_{10}$-alkyl, especially hydrogen, cyano, phenyl or 4-cyanophenyl.

Compounds in turn preferred among the compounds of the formula II-A are those
in which
R²³ is cyano;
R²⁴ is phenyl, 4-cyanophenyl or phenyl which carries 1, 2 or 3 substituents selected from $C_1$-$C_{10}$-alkyl; and
two of the radicals R²⁷, R²⁸, R²⁹ and R²¹⁰ are each independently, phenyl, 4-cyanophenyl or phenyl which carries 1, 2 or 3 substituents selected from $C_1$-$C_{10}$-alkyl and the other radicals R²⁷, R²⁸, R²⁹ and R²¹⁰ are hydrogen.

Likewise, compounds in turn preferred among the compounds of the formula II-A are also those which correspond to the formulae (II-Ab) and (II-Ab')

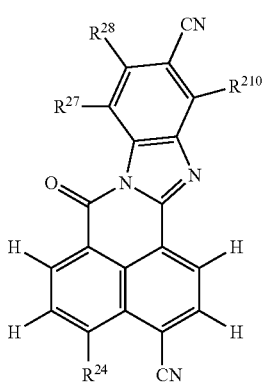

(II-Ab)

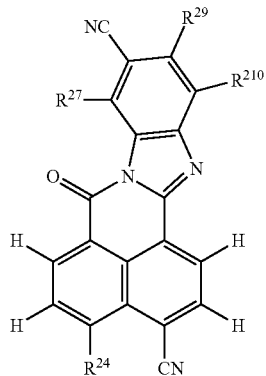

(II-Ab')

in which
R²⁴ is phenyl, 4-cyanophenyl or phenyl which carries 1, 2 or 3 substituents selected from $C_1$-$C_{10}$-alkyl; and
zero, one or two of the radicals R²⁷, R²¹⁰, if present, R²⁸ and R²⁹ are each independently, phenyl, 4-cyanophenyl or phenyl which carries 1, 2 or 3 substituents selected from $C_1$-$C_{10}$-alkyl and the other radicals R²⁷, R²¹⁰, R²⁸, R²⁹, if present, are hydrogen.

Compounds in turn preferred among the compounds of the formula (II-A) are also those which correspond to the formula (II-Ac)

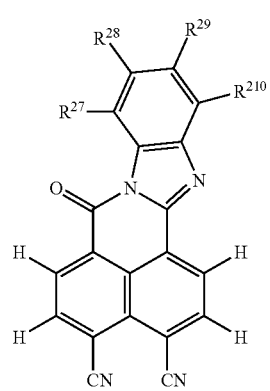

(II-Ac)

in which
one or two of the radicals R²⁷, R²⁸, R²⁹ and R²¹⁰ are each independently, phenyl, 4-cyanophenyl or phenyl which carries 1, 2 or 3 substituents selected from $C_1$-$C_{10}$-alkyl and the other radicals R²⁷, R²⁸, R²⁹ and R²¹⁰ are hydrogen.

Compounds in turn preferred among the compounds of the formula (II-A) are also those which correspond to the formula (II-Ad) and (II-Ad')

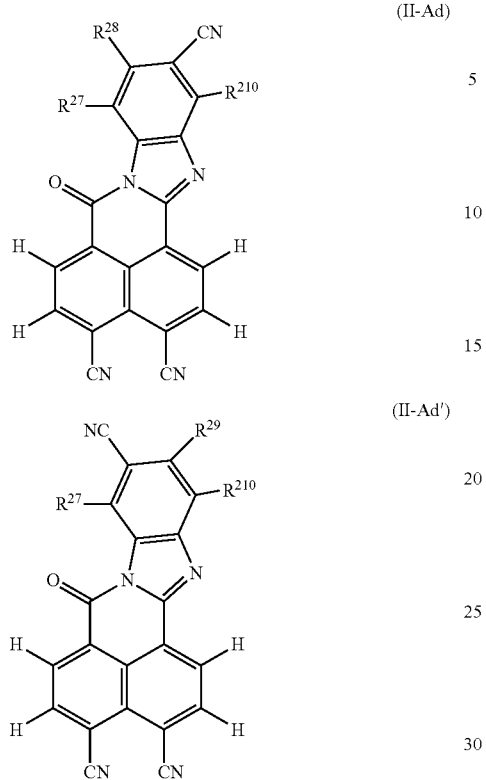

(II-Ad)

(II-Ad')

in which
one or two of the radicals $R^{27}$, $R^{28}$, $R^{29}$ and $R^{210}$ are each independently, phenyl, 4-cyanophenyl or phenyl which carries 1, 2 or 3 substituents selected from $C_1$-$C_{10}$-alkyl and the other radicals $R^{27}$, $R^{28}$, $R^{29}$ and $R^{210}$ are hydrogen.

Especially preferably, the at least one cyanated naphthalenebenzimidazole compound of the formula (II) is selected from the compounds of the formulae (II-1), (II-2), (II-3), (II-4), (II-5), (II-6), (II-7), (II-8), (II-9), (II-10), (II-11), (II-12), (II-13), (II-14), (II-15), (II-16), (II-17), (II-18), (II-19), (II-20), (II-21), (II-22), (II-23), (II-24), (II-25), (II-26), (II-27), (II-28), (II-29), (II-30), (II-31), (II-32), (II-33), (II-34), (II-35), (II-36), (II-37), (II-38), (II-39), (II-40), (II-41), (II-42), (II-43), (II-44), (II-45), (II-46), (II-47), (II-48), (II-49), and (II-50) and mixtures thereof

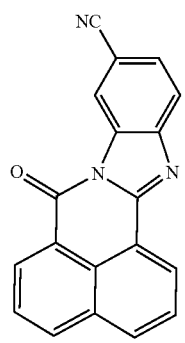

(II-1)

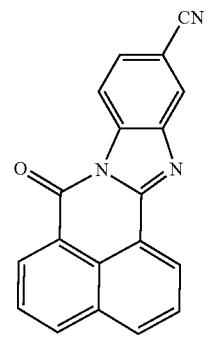

(II-2)

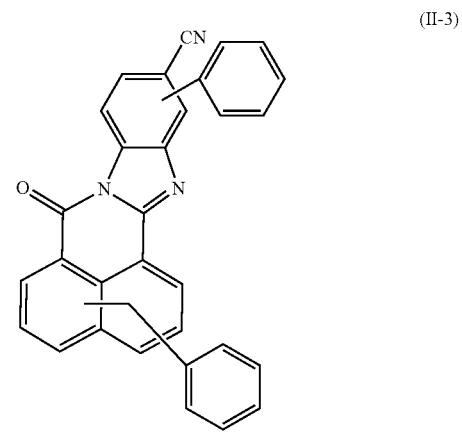

(II-3)

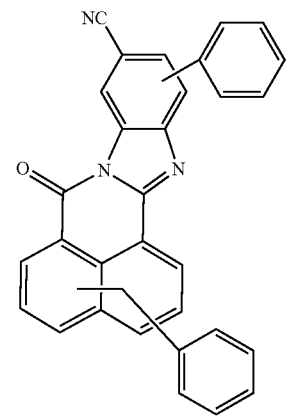

(II-4)

(II-5)
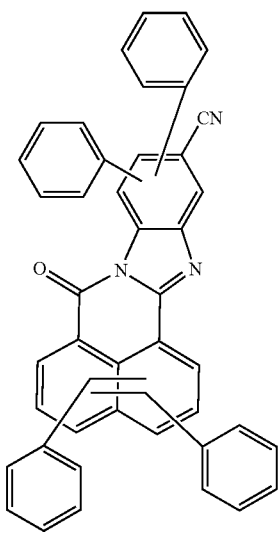
(II-6)
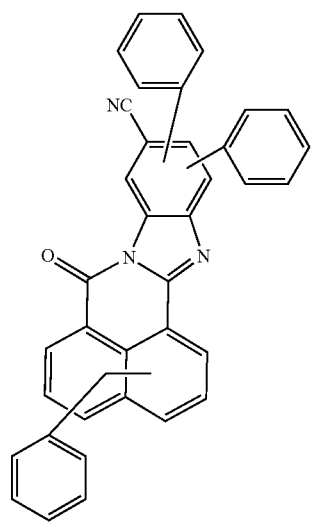
(II-7)
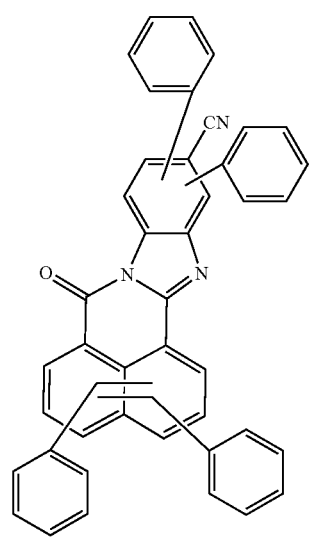
(II-8)
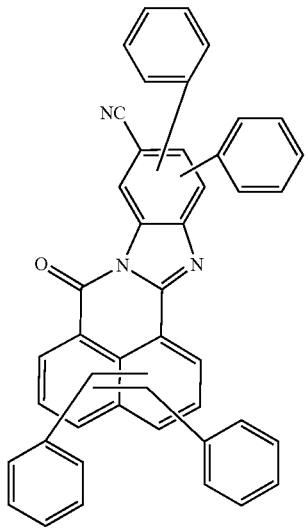
(II-9)
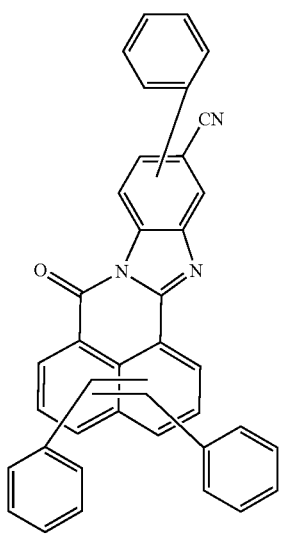
(II-10)
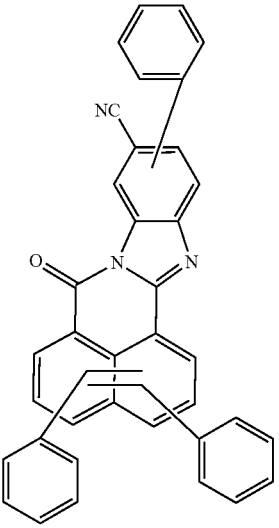

-continued
(II-11)
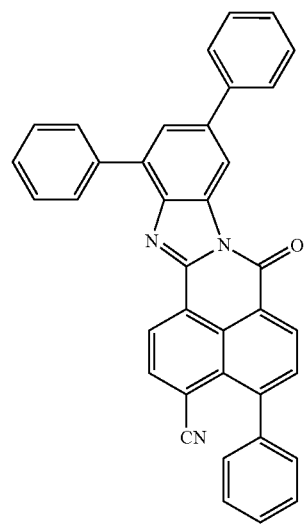
(II-12)
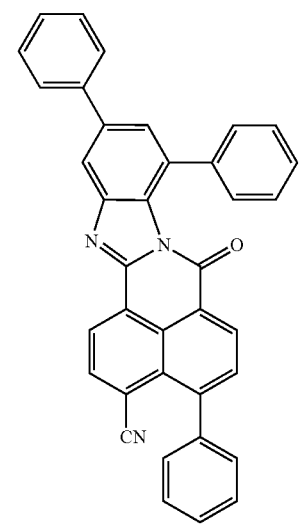
(II-13)
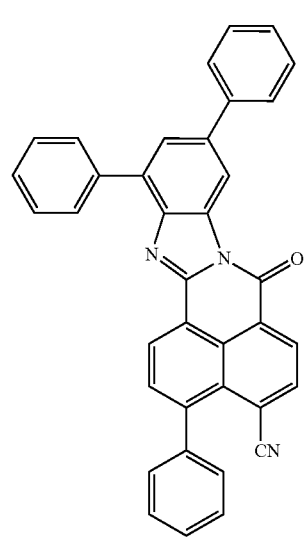
(II-14)
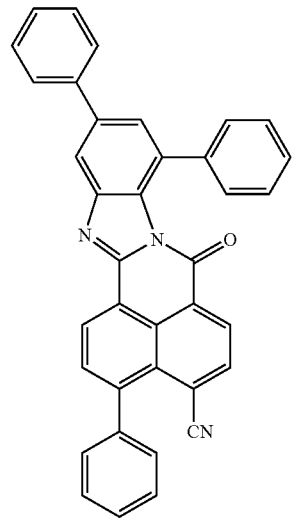
(II-15)
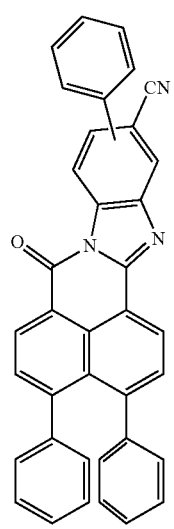
(II-16)
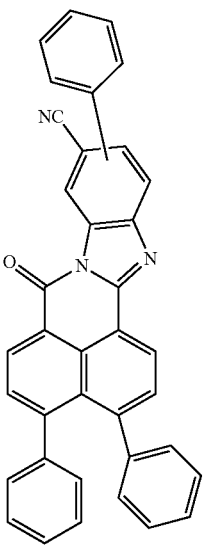

(II-17)
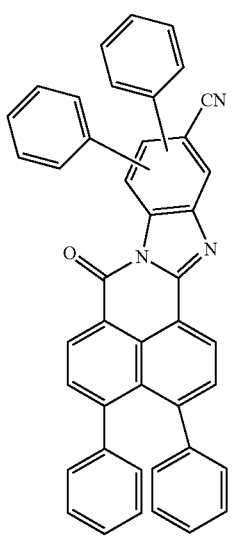
(II-18)
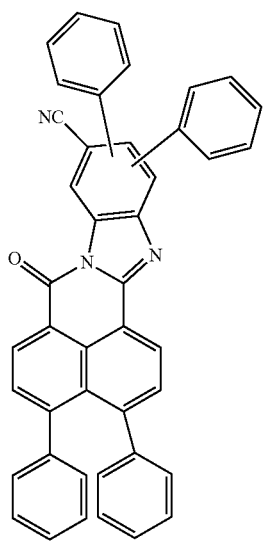
(II-19)
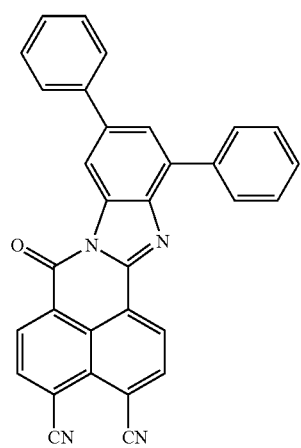
(II-20)
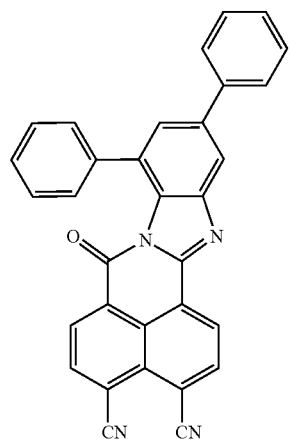
(II-21)
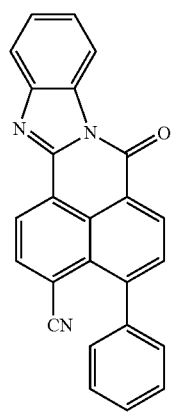
(II-22)

-continued
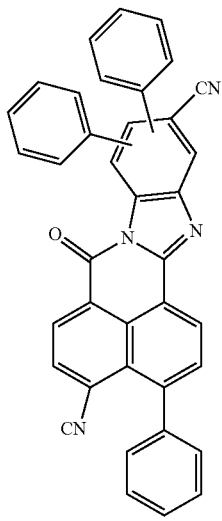
(II-23)
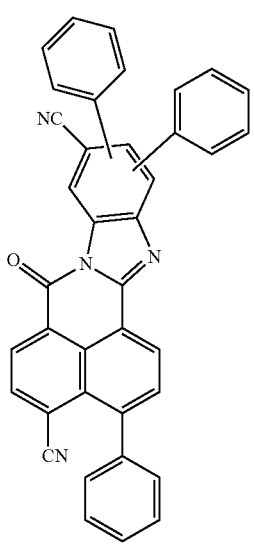
(II-24)
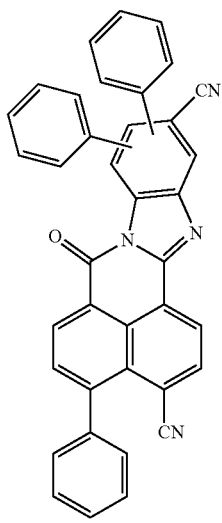
(II-25)
-continued
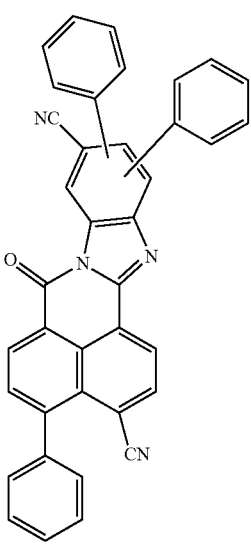
(II-26)
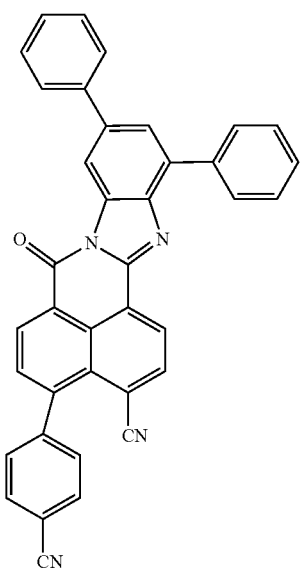
(II-27)
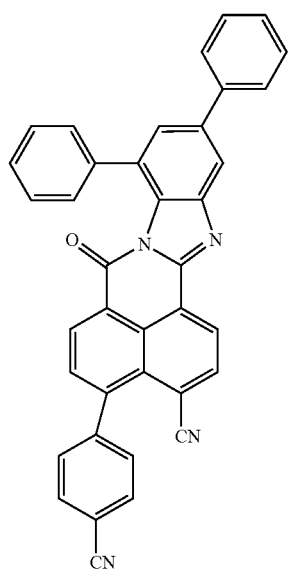
(II-28)

(II-29)
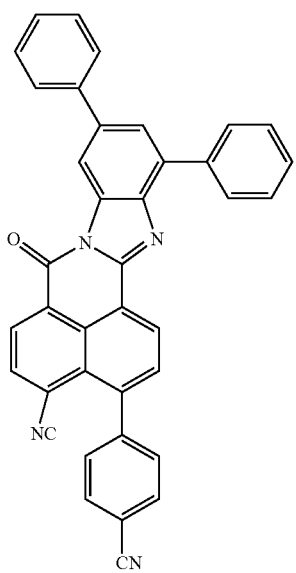
(II-30)
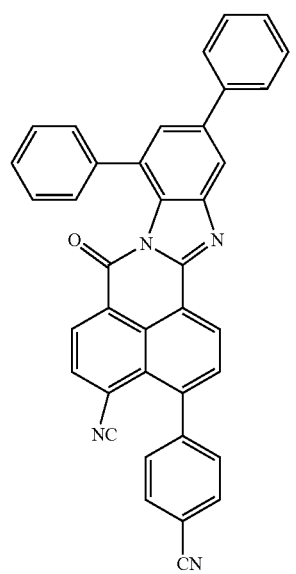
(II-31)
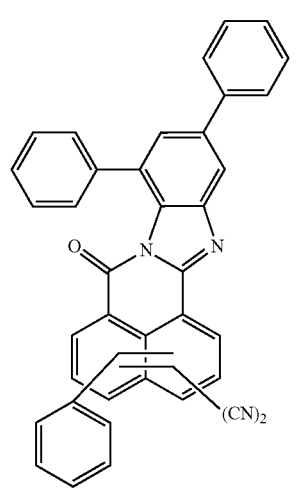
(II-32)
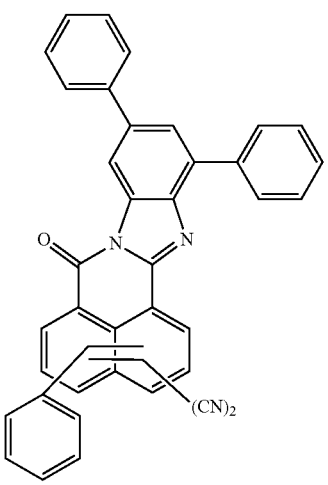
(II-33)
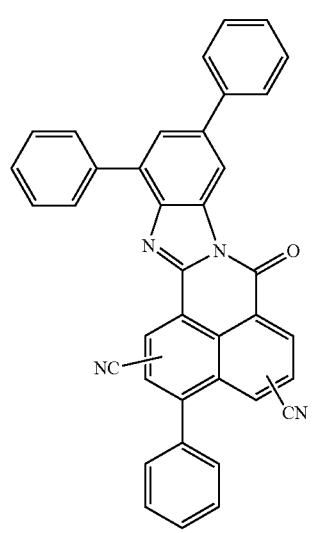
(II-34)
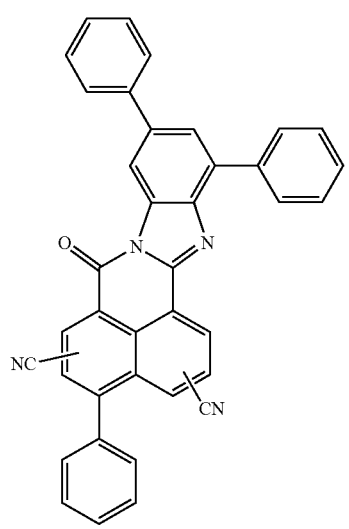

(II-35)
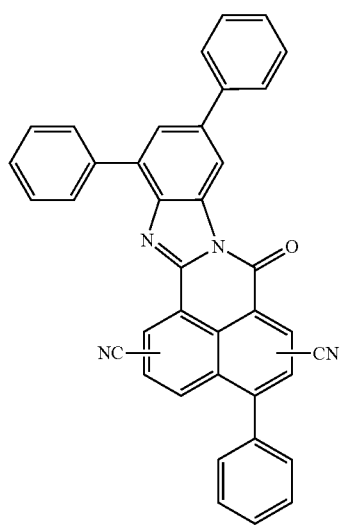
(II-36)
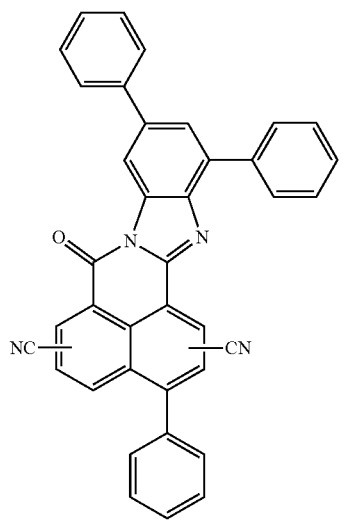
(II-37)
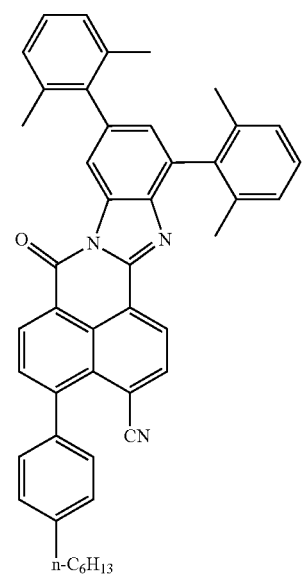
(II-38)
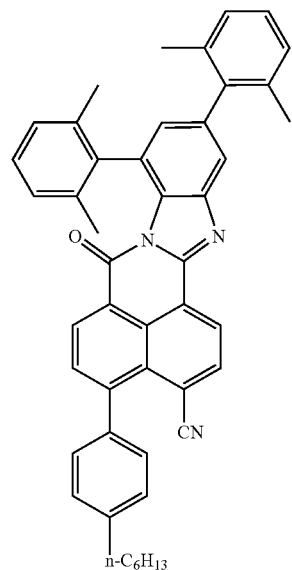
(II-39)
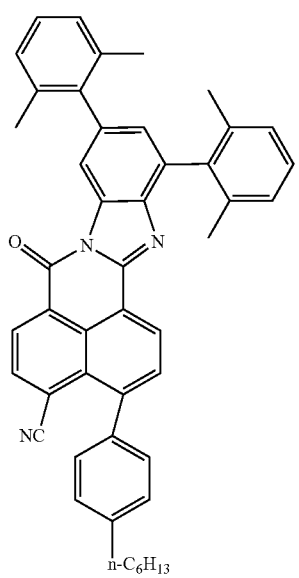

-continued
(II-40)
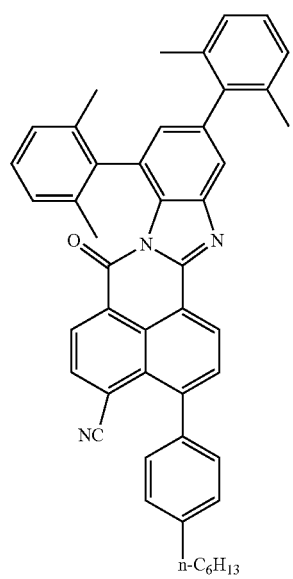
(II-41)
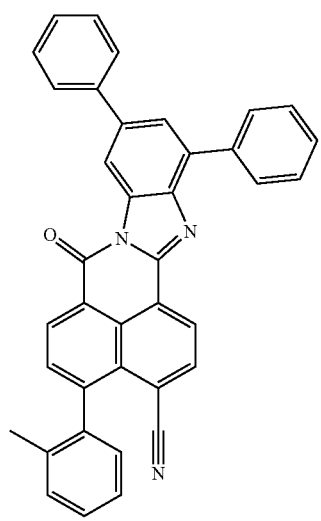
(II-42)
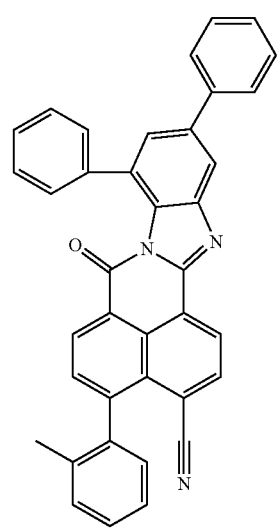
(II-43)
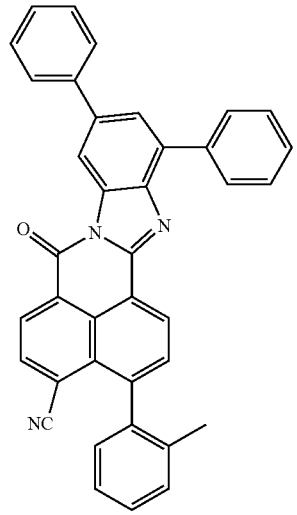
(II-44)
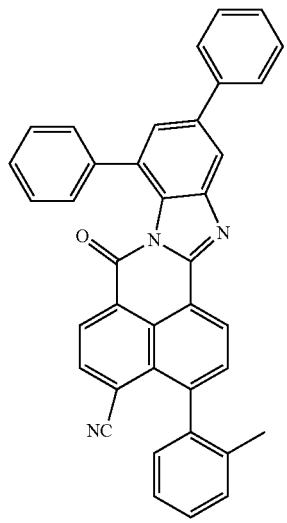
(II-45)
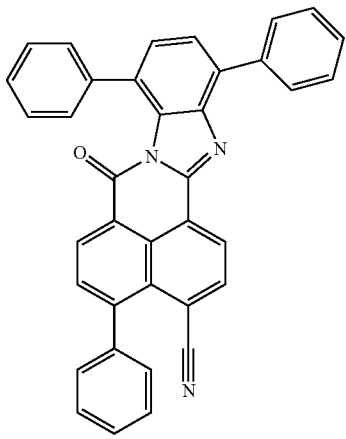

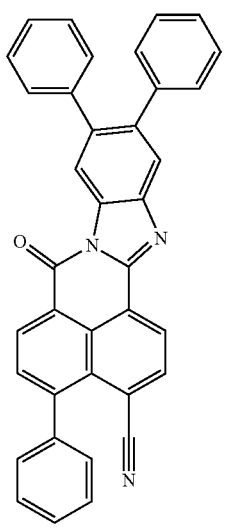 (II-46)
 (II-49)
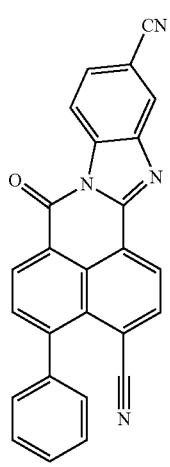 (II-47)
 (II-50)
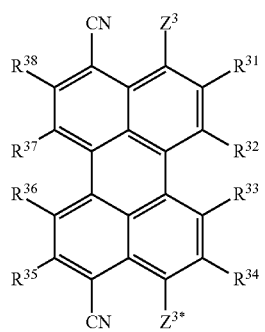 (II-48)
Compounds of the formula (II) are usually green, yellow-green or yellow fluorescent dyes.
Compounds of formula (III) are known from WO 2015/169935. Compounds of formula (III) encompass the following compounds of the formulae (III-a) and (III-b) as well as compounds of formulae (III-c) and (IIII-d):
(III-a)

-continued

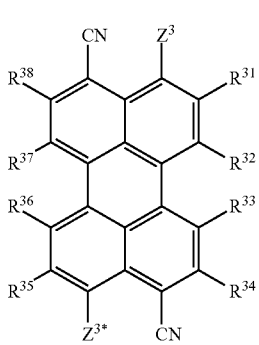
(III-b)

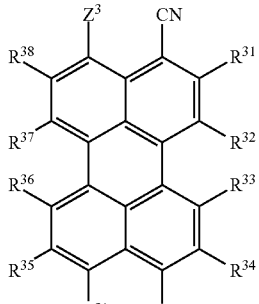
(III-c)

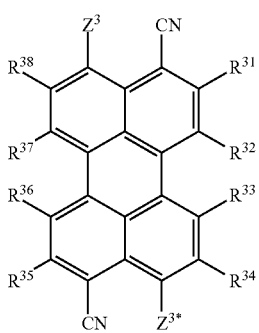
(III-d)

in which
$R^{31}$, $R^{32}$, $R^{33}$, $R^{34}$, $R^{35}$, $R^{36}$, $R^{37}$, $R^{38}$, $Z^3$ and $Z^{3*}$ are each as defined above,
individually and mixtures thereof.

More particularly, in compounds of the formulae (III-a), (III-b), (III-c) and (III-d), the $R^{31}$, $R^{32}$, $R^{33}$, $R^{34}$, $R^{35}$, $R^{36}$, $R^{37}$, $R^{38}$ substituents that are not cyano or hydrogen are all chlorine or all bromine.

In the perylene compounds of the formula (III) and mixtures thereof, 1, 2, 3, 4, 5, 6, 7 or 8 of the $R^{31}$, $R^{32}$, $R^{33}$, $R^{34}$, $R^{35}$, $R^{36}$, $R^{37}$ and $R^{38}$ substituents are cyano. The other $R^{31}$, $R^{32}$, $R^{33}$, $R^{34}$, $R^{35}$, $R^{36}$, $R^{37}$ and $R^{38}$ substituents are each independently hydrogen, bromine or chlorine. More particularly, the other $R^{31}$, $R^{32}$, $R^{33}$, $R^{34}$, $R^{35}$, $R^{36}$, $R^{37}$ and $R^{38}$ substituents are each independently hydrogen or bromine. In a further embodiment, the other $R^{31}$, $R^{32}$, $R^{33}$, $R^{34}$, $R^{35}$, $R^{36}$, $R^{37}$ and $R^{38}$ substituents are each independently hydrogen or chlorine.

Preferably, 1, 2, 3 or 4 of the $R^{31}$, $R^{32}$, $R^{33}$, $R^{34}$, $R^{35}$, $R^{36}$, $R^{37}$ and $R^{38}$ substituents are cyano. The other $R^{31}$, $R^{32}$, $R^{33}$, $R^{34}$, $R^{35}$, $R^{36}$, $R^{37}$ and $R^{38}$ substituents are each independently hydrogen, bromine or chlorine. Specifically, 1, 2, 3 or 4 of the $R^{32}$, $R^{33}$, $R^{36}$ and $R^{37}$ substituents are cyano. In a specific embodiment, none of the $R^{31}$, $R^{32}$, $R^3$, $R^{34}$, $R^{35}$, $R^6$, $R^{37}$ or $R^{38}$ substituents is bromine or chlorine.

In a further preferred embodiment, one of the $R^{31}$, $R^{32}$, $R^{33}$, $R^{34}$, $R^{35}$, $R^{36}$, $R^{37}$ and $R^{38}$ substituents is cyano, and the other $R^{31}$, $R^{32}$, $R^{33}$, $R^{34}$, $R^{35}$, $R^{36}$, $R^{37}$ and $R^{38}$ substituents are hydrogen. In particular, one of the $R^{32}$, $R^{33}$, $R^{36}$ and $R^{37}$ substituents is cyano, and the other $R^{31}$, $R^{32}$, $R^{33}$, $R^{34}$, $R^{35}$, $R^{36}$, $R^{37}$ and $R^{38}$ substituents are hydrogen.

In a further preferred embodiment, two of the $R^{31}$, $R^{32}$, $R^{33}$, $R^{34}$, $R^{35}$, $R^{36}$, $R^{37}$ and $R^{38}$ substituents are cyano, and the other $R^{31}$, $R^{32}$, $R^{33}$, $R^{34}$, $R^{35}$, $R^{36}$, $R^{37}$ and $R^{38}$ substituents are hydrogen. In particular, two of the $R^{32}$, $R^{33}$, $R^{36}$ and $R^{37}$ substituents are cyano, and the other $R^{31}$, $R^{32}$, $R^{33}$, $R^{34}$, $R^{35}$, $R^{36}$, $R^{37}$ and $R^{38}$ substituents are hydrogen.

In the perylene compounds of the formula (III) and mixtures thereof, one of the $Z^3$ substituents is cyano and one of the $Z^{3*}$ substituents is cyano. The other $Z^3$ substituent and the other $Z^{3*}$ substituent are each as defined above and are preferably selected independently from $C_1$-$C_{10}$-alkyl, $CO_2R^{39}$, phenyl-$C_1$-$C_{10}$-alkyl and phenyl, where phenyl and the phenyl moiety of phenyl-$C_1$-$C_{10}$-alkyl are unsubstituted or bear one or more, for example 1, 2 or 3, substituents selected from $C_1$-$C_6$-alkyl, where $R^{39}$ is as defined above. Preferably, $R^{39}$ is linear or branched $C_1$-$C_6$-alkyl, specifically methyl, ethyl, n-propyl, isopropyl, n-butyl or isobutyl.

Even more preferably, one of the $Z^3$ substituents is $C_1$-$C_6$-alkyl, $C_1$-$C_6$-alkoxycarbonyl or phenyl which is unsubstituted or bears 1, 2 or 3 $C_1$-$C_4$-alkyl groups. Specifically, one of the $Z^3$ substituents is $C_1$-$C_6$-alkyl such as methyl, ethyl, n-propyl, isopropyl, n-butyl, isobutyl, $C_1$-$C_6$-alkoxycarbonyl such as methoxycarbonyl, ethoxycarbonyl, n-propoxycarbonyl, isopropoxycarbonyl, n-butoxycarbonyl, isobutoxycarbonyl, phenyl, or phenyl bearing 1, 2 or 3 $C_1$-$C_4$-alkyl groups, such as 2-methylphenyl or 2,6-dimethylphenyl.

Even more preferably, one of the $Z^{3*}$ substituents is $C_1$-$C_6$-alkyl, $C_1$-$C_6$-alkoxycarbonyl or phenyl which is unsubstituted or bears 1, 2 or 3 $C_1$-$C_4$-alkyl groups. Specifically, one of the $Z^{3*}$ substituents is $C_1$-$C_6$-alkyl such as methyl, ethyl, n-propyl, isopropyl, n-butyl, isobutyl, $C_1$-$C_6$-alkoxycarbonyl such as methoxycarbonyl, ethoxycarbonyl, n-propoxycarbonyl, isopropoxycarbonyl, n-butoxycarbonyl, isobutoxycarbonyl, phenyl, 2-methylphenyl or 2,6-dimethylphenyl.

Especially, the perylene compound of the formula (III) is selected from compounds of the formulae (III-1), (III-2), (III-3), (III-4), (III-5), (III-6), (III-7), (III-8), (III-9), (III-10), (III-11), (III-12), (III-13), (III-14), (III-15), (III-16), (III-17), (III-18), (III-19), (III-20)

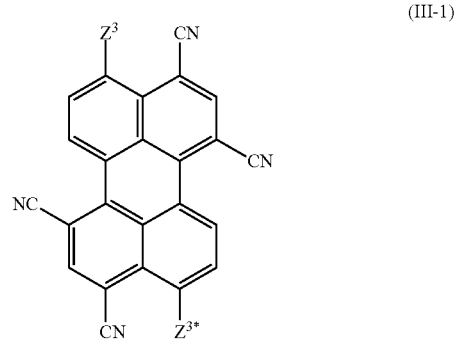
(III-1)

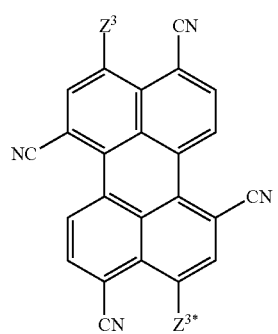
(III-2)
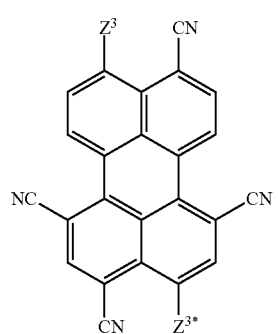
(III-3)
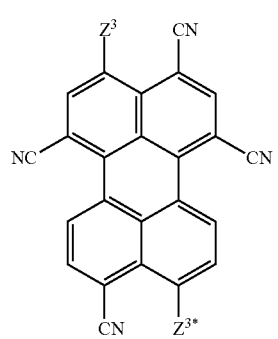
(III-4)
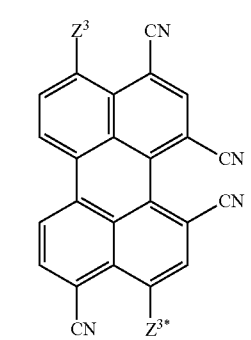
(III-5)
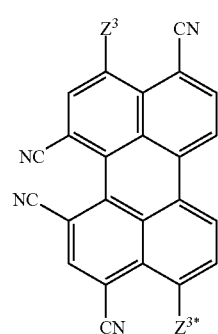
(III-6)
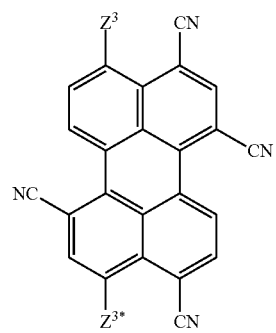
(III-7)
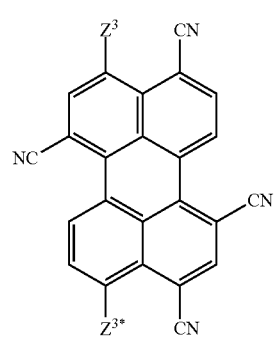
(III-8)
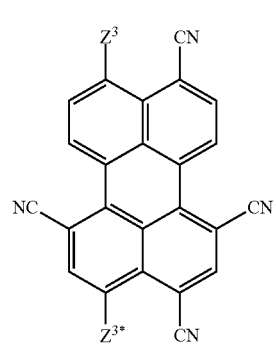
(III-9)
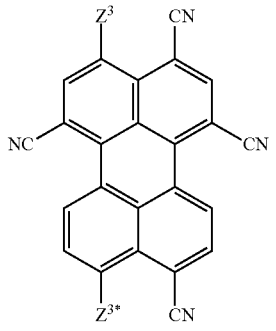
(III-10)

(III-11)
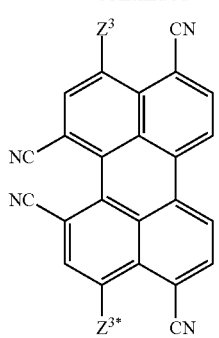
(III-12)
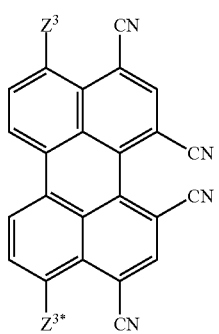
(III-13)
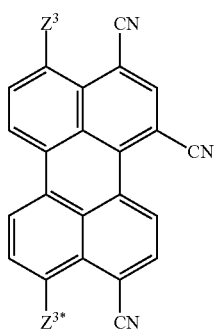
(III-14)
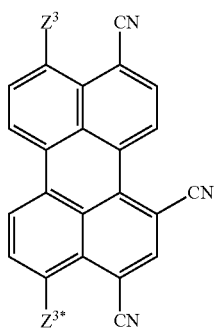
(III-15)
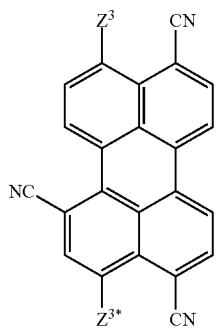
(III-16)
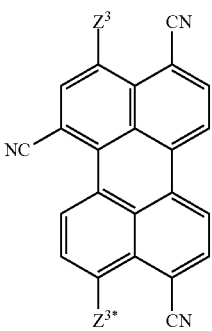
(III-17)
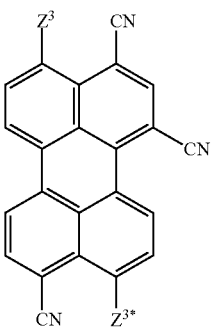
(III-18)
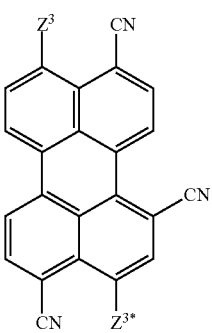
(III-19)
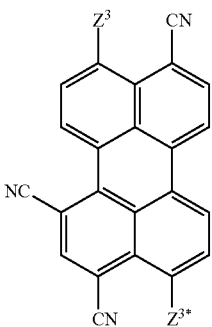

(III-20)

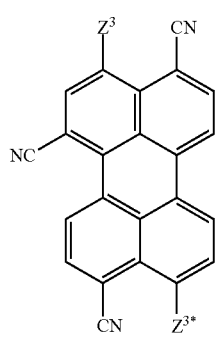

in which
Z³ is selected from C₁-C₆-alkyl, C₁-C₆-alkoxycarbonyl, phenyl, and phenyl bearing 1, 2 or 3 C₁-C₄-alkyl groups; and
Z³* is selected from C₁-C₆-alkyl, C₁-C₆-alkoxycarbonyl, phenyl, and phenyl bearing 1, 2 or 3 C₁-C₄-alkyl groups; and mixtures thereof.

Among these, specific preference is given to perylene compounds of the formulae (III-1), (III-2), (III-3), (III-4), (III-5), (III-6), (III-7), (III-8), (III-9), (III-10), (III-11), (III-12), (III-13), (III-14), (III-15), (III-16), (III-17), (III-18), (III-19), (III-20) in which Z and Z* have the same definition.

Compounds of the formula (III) are usually yellow or yellow-green fluorescent dyes.

Compounds of the formula (IV) are subject-matter of unpublished EP 15161081.3. Preferred are compounds of the formula (IV) and mixtures thereof, wherein $X^{40}$ is O. Also preferred are compounds of the formula (IV), wherein $X^{40}$ is S.

Preferred are compounds of the formula (IV), wherein two of the radicals $R^{42}$, $R^{43}$, $R^{44}$ and $R^{45}$ are cyano and the remaining two radicals $R^{42}$, $R^{43}$, $R^{44}$ and $R^{45}$ are selected from hydrogen and bromine. Even more preferred are compounds of formula (IV), wherein two of the radicals $R^{42}$, $R^{43}$, $R^{44}$ and $R^{45}$ are cyano and the remaining two radicals $R^{42}$, $R^{43}$, $R^{44}$ and $R^{45}$ are each hydrogen. In particular, $R^{42}$ and $R^{44}$ are each cyano and $R^{43}$ and $R^{45}$ are each hydrogen.

Preferred are compounds of the formula (IV), wherein m4 is 0, i.e $R^{41}$ is absent.

Preferred are also compounds of the formula (IV), wherein m4 is 1 or 2. In this context, each $R^{41}$ is preferably selected from cyano, bromine, chlorine, C₁-C₄-alkyl such as methyl, ethyl, n-propyl, isopropyl, n-butyl or isobutyl, C₁-C₄-alkoxy such as methoxy, ethoxy, n-propoxy, isopropoxy, n-butoxy or isobutoxy, C₁-C₄-haloalkyl, in particular C₁-C₂-haloalkyl, phenyl and phenyloxy, where the phenyl ring in the two last mentioned radicals is unsubstituted or carries 1, 2 or 3 substituents selected from C₁-C₁₀-alkyl. In particular, $R^{41}$ is selected from cyano, bromine, and phenyl which is unsubstituted or carries 1 or 2 radicals selected from C₁-C₄-alkyl; especially $R^{41}$ is cyano. Especially, m is 1. More especially, m4 is 1 and $R^{41}$ is cyano.

Compounds of the formula (IV) are preferred, wherein group A is a radical of the formula (A.1). Compounds of the formula (IV), where A is a radical of the formula (A.1) are also referred to as compounds of formula (IV-A.1), (IV-A.1)

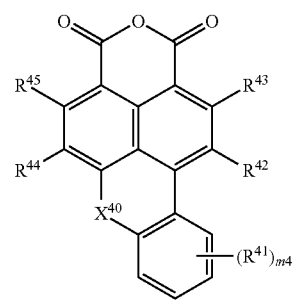

wherein
m4, $X^{40}$, $R^{41}$, $R^{42}$, $R^{43}$, $R^{44}$, and $R^{45}$ are as defined above and especially have one of the preferred meanings.

Examples for preferred compounds of formula (IV-A.1) are shown below:

(IV-A.1-1)

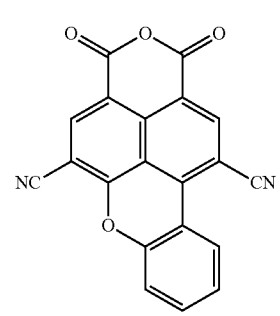

(IV-A.1-2)

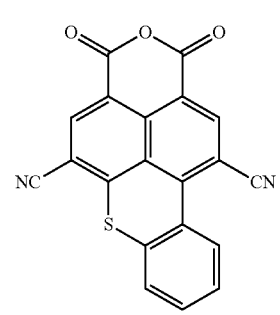

(IV-A.1-3)

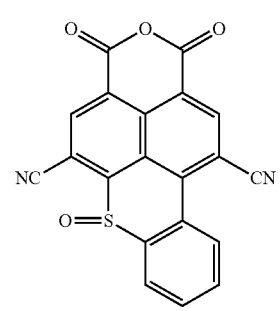

-continued (IV-A.1-4)
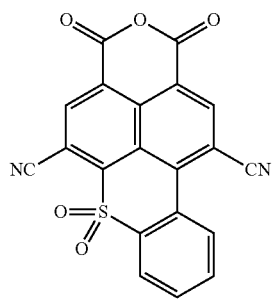

(IV-A.1-5)
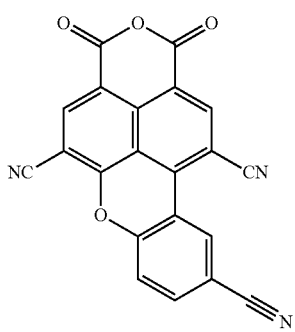

(IV-A.1-6)
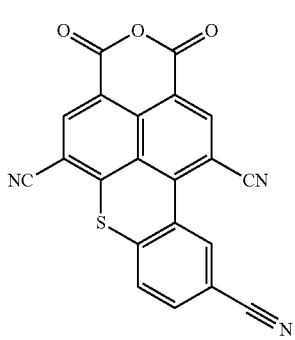

(IV-A.1-7)
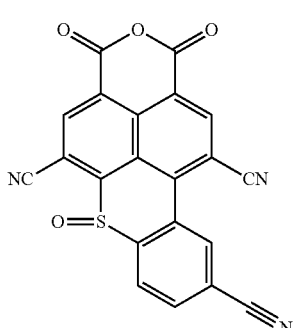

(IV-A.1-8)
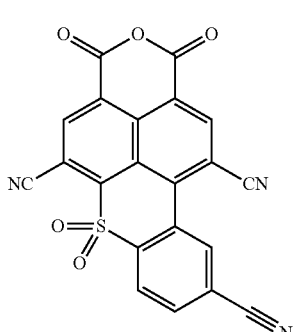

Likewise, compounds of the formula (IV) are preferred, wherein A is a radical of the formula (A.2). Compounds of the formula (IV), where A is a radical of the formula (A.2) are also referred to as compounds of formula (IV-A.2),

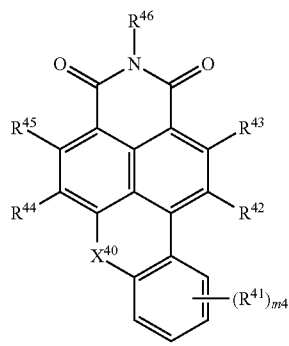

(IV-A.2)

wherein
m4, $X^{40}$, $R^{41}$, $R^{42}$, $R^{43}$, $R^{44}$, $R^{45}$ and $R^{46}$ are as defined above. In particular, m4, $X^{40}$, $R^{41}$, $R^{42}$, $R^{43}$, $R^{44}$ and $R^{45}$ have one of the preferred meanings mentioned above.

In the compounds of the formula (I-A.2), $R^{46}$ is preferably selected from hydrogen, linear $C_1$-$C_{24}$-alkyl, branched $C_3$-$C_{24}$-alkyl, $C_6$-$C_{10}$-aryl and $C_6$-$C_{10}$-aryl-$C_1$-$C_{10}$-alkylene, where the aryl ring in the two last mentioned moieties is unsubstituted or substituted with 1, 2, 3, 4 or 5 identical or different radicals $R^{46a}$. In a special embodiment, $R^{46}$ is selected from linear $C_1$-$C_{24}$-alkyl, a radical of the formula (B.1) and a radical of the formula (B.2)

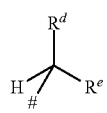

(B.1)

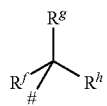

(B.2)

in which
\# is the bonding site to the nitrogen atom;
$R^d$ and $R^e$, in the formula (B.1), independently from each other are selected from $C_1$-$C_{23}$-alkyl, where the sum of the carbon atoms of the $R^d$ and $R^e$ radicals is an integer from 2 to 23;
$R^f$, $R^g$ and $R^h$, in the formula (B.2) are independently selected from $C_1$- to $C_{20}$-alkyl, where the sum of the carbon atoms of the $R^f$, $R^g$ and $R^h$ radicals is an integer from 3 to 23.

Preferred radicals of the formula (B.1) are: 1-ethylpropyl, 1-methylpropyl, 1-propylbutyl, 1-ethylbutyl, 1-methylbutyl, 1-butylpentyl, 1-propylpentyl, 1-ethylpentyl, 1-methylpentyl, 1-pentylhexyl, 1-butylhexyl, 1-propylhexyl, 1-ethylhexyl, 1-methylhexyl, 1-hexylheptyl, 1-pentylheptyl, 1-butylheptyl, 1-propylheptyl, 1-ethylheptyl, 1-methylheptyl, 1-heptyloctyl, 1-hexyloctyl, 1-pentyloctyl, 1-butyloctyl, 1-propyloctyl, 1-ethyloctyl, 1-methyloctyl, 1-octylnonyl, 1-heptylnonyl, 1-hexylnonyl, 1-pentylnonyl, 1-butylnonyl, 1-propylnonyl, 1-ethylnonyl, 1-methylnonyl, 1-nonyldecyl, 1-octyldecyl, 1-heptyldecyl, 1-hexyldecyl, 1-pentyldecyl, 1-butyldecyl, 1-propyldecyl, 1-ethyldecyl, 1-methyldecyl, 1-decylundecyl, 1-nonylundecyl, 1-octylundecyl, 1-heptylundecyl, 1-hexylundecyl, 1-pentylundecyl, 1-butylundecyl, 1-propylundecyl, 1-ethylundecyl, 1-methylundecyl, 1-undecyldodecyl, 1-decyldodecyl, 1-nonyldodecyl, 1-octyldodecyl, 1-heptyldodecyl, 1-hexyldodecyl, 1-pentyldodecyl, 1-butyldodecyl, 1-propyldodecyl, 1-ethyldodecyl, 1-methyldodecyl, 1-undecyltridecyl, 1-decyltridecyl, 1-nonyltridecyl, 1-octyltridecyl, 1-heptyltridecyl, 1-hexyltridecyl, 1-pentyltridecyl, 1-butyltridecyl, 1-propyltridecyl, 1-ethyltridecyl, 1-methyltridecyl, 1-tridecyltetradecyl, 1-decyltetradecyl, 1-nonyltetradecyl, 1-octyltetradecyl, 1-heptyltetradecyl, 1-hexyltetradecyl, 1-pentyltetradecyl, 1-butyltetradecyl, 1-propyltetradecyl, 1-ethyltetradecyl, 1-methyltetradecyl, 1-octylhexadecyl, 1-heptylhexadecyl, 1-hexylhexadecyl, 1-pentylhexadecyl, 1-butylhexadecyl, 1-propylhexadecyl, 1-ethylhexadecyl, 1-methylhexadecyl, 1-hexyloctadecyl, 1-pentyloctadecyl, 1-butyloctadecyl, 1-propyloctadecyl, 1-ethyloctadecyl, 1-methyloctadecyl, 1-pentadecyleicosanyl, 1-tetradecyleicosanyl, 1-tridecyleicosanyl, 1-dodecyleicosanyl, 1-undecyleicosanyl, 1-butyleicosanyl, 1-propyleicosanyl, 1-ethyleicosanyl, 1-methyleicosanyl.

Particularly preferred radicals of the formula (B.1) are: 1-methylethyl, 1-methylpropyl, 1-methylbutyl, 1-methylpentyl, 1-methylhexyl, 1-methylheptyl, 1-methyloctyl, 1-ethylpropyl, 1-ethylbutyl, 1-ethylpentyl, 1-ethylhexyl, 1-ethylheptyl, 1-ethyloctyl, 1-propylbutyl, 1-propylpentyl, 1-propylhexyl, 1-propylheptyl, 1-propyloctyl, 1-butylpentyl, 1-butylhexyl, 1-butylheptyl, 1-butyloctyl, 1-pentylhexyl, 1-pentylheptyl, 1-pentyloctyl, 1-hexylheptyl, 1-hexyloctyl, 1-heptyloctyl.

A particularly preferred radical of the formula (B.2) is tert.-butyl.

In a further special embodiment, $R^{46}$ is a radical of the formula (C.1), a radical of the formula (C.2) or a radical of the formula (C.3)

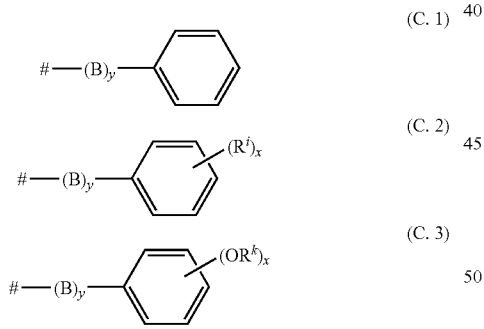

(C. 1)

(C. 2)

(C. 3)

where
# represents the bonding side to the nitrogen atom,
B where present, is a $C_1$-$C_{10}$-alkylene group which may be interrupted by one or more nonadjacent groups selected from —O— and —S—,
y is 0 or 1,
$R^i$ is independently of one another selected from $C_1$-$C_{24}$-alkyl, $C_1$-$C_{24}$-fluoroalkyl, fluorine, chlorine or bromine,
$R^k$ is independently of one another selected from $C_1$-$C_{24}$-alkyl,
x in formulae C.2 and C.3 is 1, 2, 3, 4 or 5.

Preferably, y is 0, i.e. the variable B is absent.

Irrespectively of its occurrence, $R^i$ is preferably selected from $C_1$-$C_{24}$-alkyl, more preferably linear $C_1$-$C_{10}$-alkyl or branched $C_3$-$C_{10}$-alkyl, especially isopropyl. Irrespectively of its occurrence, $R^k$ is preferably selected from $C_1$-$C_{30}$-alkyl, more preferably linear $C_1$-$C_{10}$-alkyl or branched $C_3$-$C_{10}$-alkyl. The variable x in formulae C.2 and C.3 is preferably 1, 2 or 3.

Examples for preferred compounds of formula (IV-A.2) are shown below:

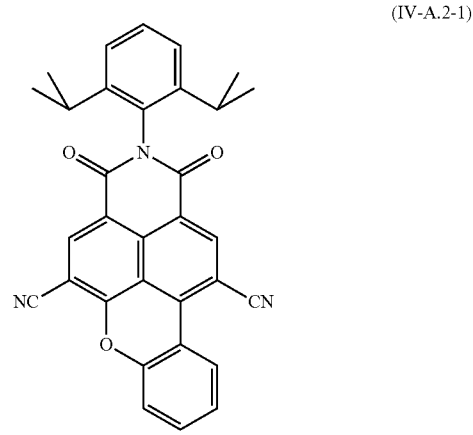

(IV-A.2-1)

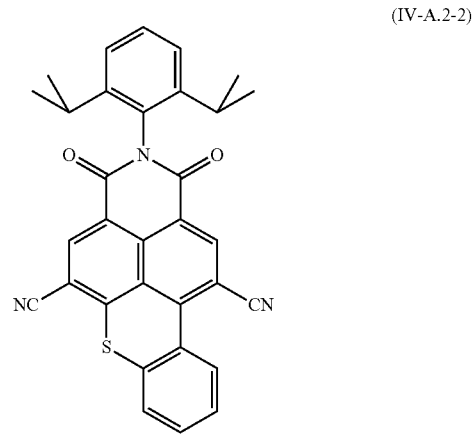

(IV-A.2-2)

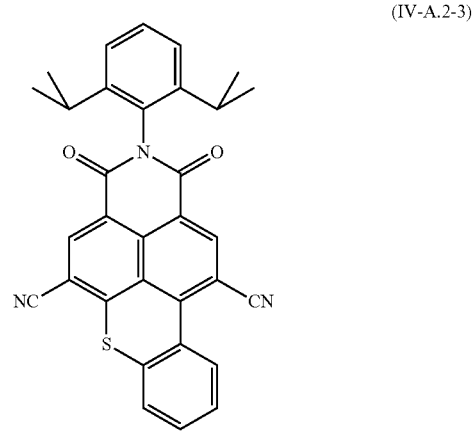

(IV-A.2-3)

(IV-A.2-4)
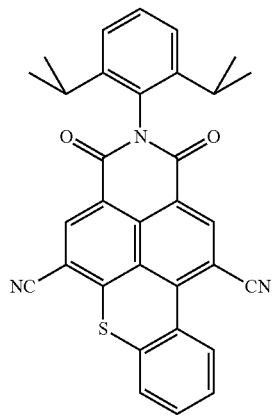
(IV-A.2-5)
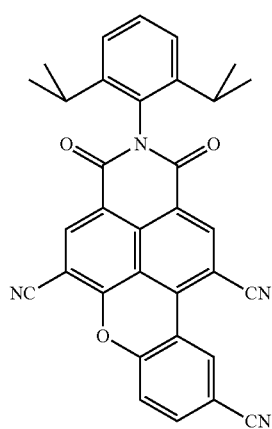
(IV-A.2-6)
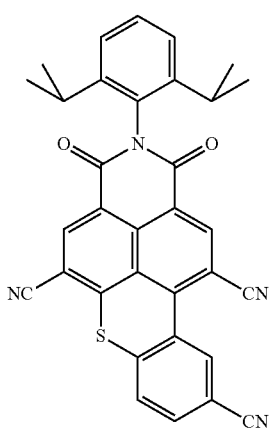
(IV-A.2-7)
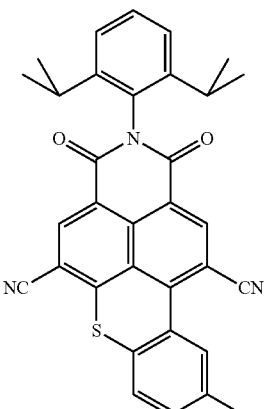
(IV-A.2-8)
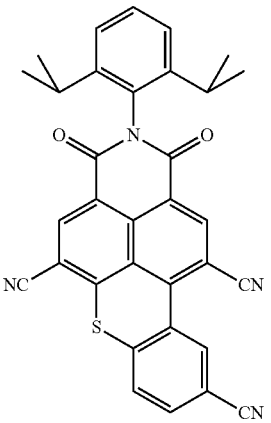
(IV-A.2-9)
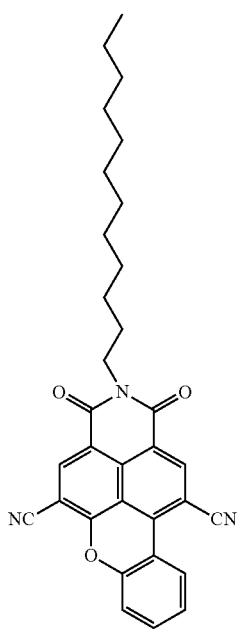

(IV-A.2-10)
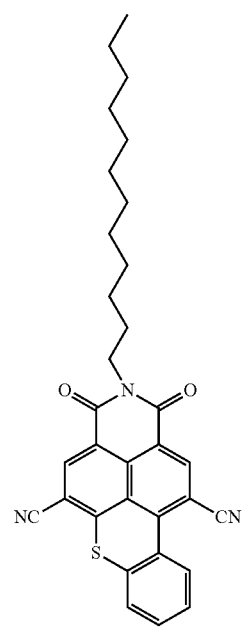
(IV-A.2-12)
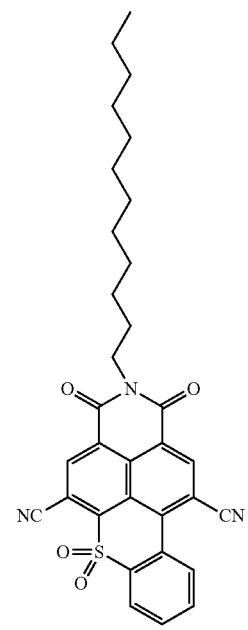
(IV-A.2-11)
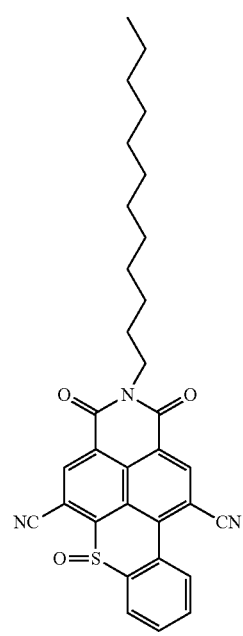
(IV-A.2-13)
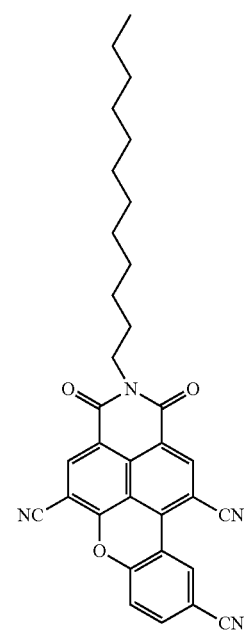

(IV-A.2-14)

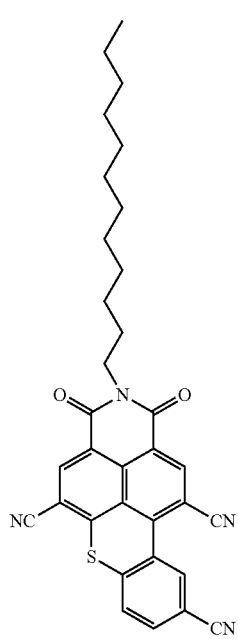

(IV-A.2-15)

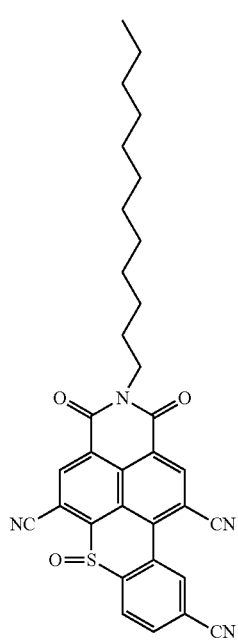

(IV-A.2-16)

A special group of embodiments relates to compounds of formula (IV-A.2), wherein the variables m4, $X^{40}$, $R^{41}$, $R^{42}$, $R^{43}$, $R^{44}$, and $R^{45}$ independently of each other or in particular in combination, have the following meanings:

$X^{40}$ is O or S;

$R^{42}$ and $R^{44}$ are each cyano;

$R^{43}$ and $R^{45}$ are each hydrogen or one of $R^{43}$ and $R^{45}$ is bromine and the other of $R^{43}$ and $R^{45}$ is hydrogen;

$R^{41}$ is selected from cyano, bromine, and phenyl which is unsubstituted or carries 1 or 2 radicals selected from $C_1$-$C_4$-alkyl;

$R^{46}$ is selected from hydrogen, $C_1$-$C_{24}$-linear alkyl, branched $C_3$-$C_{24}$-alkyl, a radical of the formula (C.1), a radical of the formula (C.2) and a radical of the formula (C.3);

m4 is 0 or 1.

Even more preferably, $X^{40}$ is O or S;

$R^{42}$ and $R^{44}$ are each cyano;

$R^{43}$ and $R^{45}$ are each hydrogen;

$R^{41}$ is selected from cyano, bromine, and phenyl which is unsubstituted or carries 1 or 2 radicals selected from $C_1$-$C_4$-alkyl; especially cyano;

$R^{46}$ is selected from linear $C_1$-$C_{24}$-alkyl, branched $C_3$-$C_{24}$-alkyl, a radical of the formula (C.1), a radical of the formula (C.2) and a radical of the formula (C.3); especially linear $C_1$-$C_{24}$-alkyl, branched $C_3$-$C_{24}$-alkyl, or phenyl which carries 1 or 2 radicals selected from $C_1$-$C_4$-alkyl such as 2,6-diisopropylphenyl;

m4 is 0 or 1.

Likewise, compounds of the formula (IV) are preferred, wherein A is a radical of the formula (A.3). This group of embodiments includes the pure regioisomer of the formula (IV-A.3a), the pure regioisomer of the formula (IV-A.3b) and mixtures thereof,

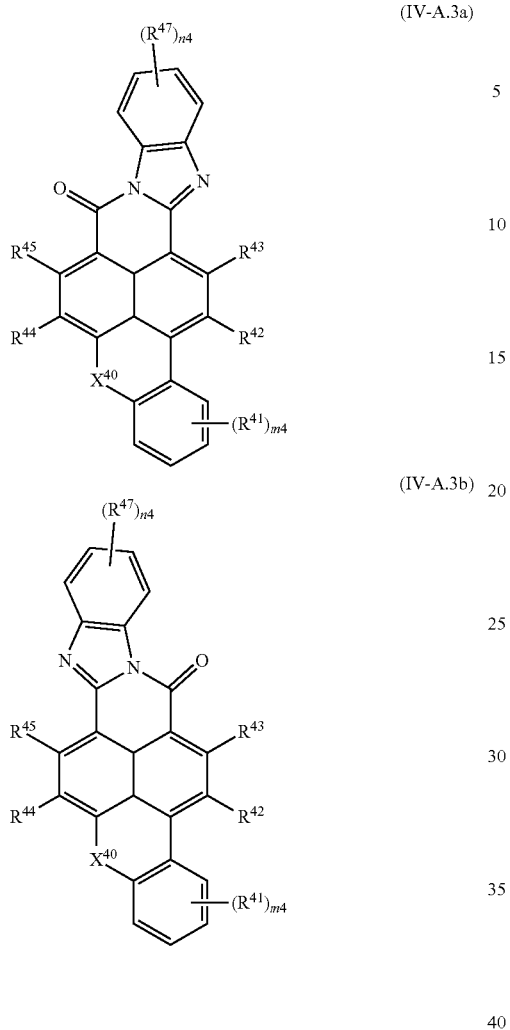

(IV-A.3a)

(IV-A.3b)

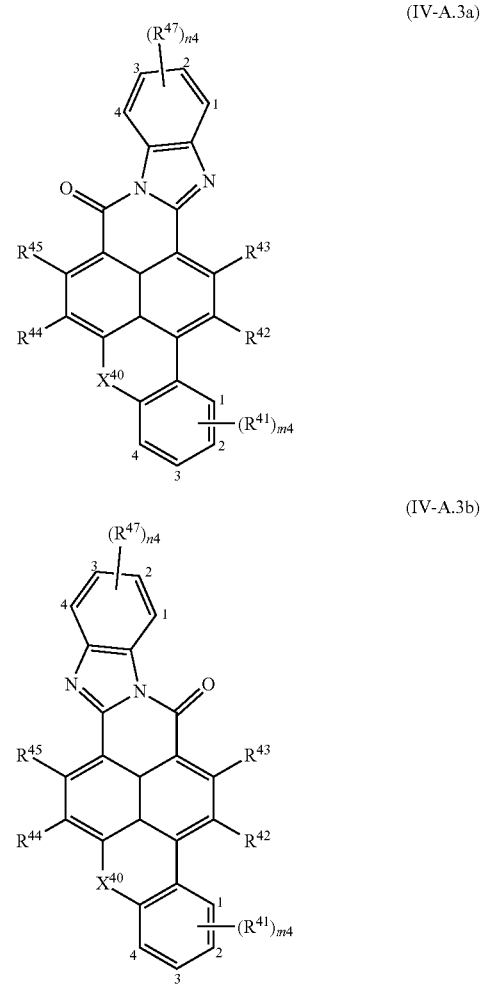

(IV-A.3a)

(IV-A.3b)

wherein $X^{40}$, $R^{41}$, $R^{42}$, $Rv^3$, $R^{44}$, $R^{45}$, $R^{47}$, n4 and m4 are as defined above. In particular, $X^{40}$, $R^{41}$, $R^{42}$, $R^{43}$, $R^{44}$, $R^{45}$, and m4 have one of the preferred meanings mentioned above.

Preferred are compounds of the formulae (IV-A.3a) and (IV-A.3b), wherein n4 is 0, i.e $R^{47}$ is absent. Preferred are also compounds of the formulae (IV-A.3a) and (IV-A.3b), wherein n4 is 1 or 2. In this context, each $R^{47}$ is preferably selected from cyano, bromine, chlorine, $C_1$-$C_4$-alkyl such as methyl, ethyl, n-propyl, isopropyl, n-butyl or isobutyl, $C_1$-$C_4$-alkoxy such as methoxy, ethoxy, n-propoxy, iso-propoxy, n-butoxy or isobutoxy, $C_1$-$C_4$-haloalkyl, in particular $C_1$-$C_2$-haloalkyl, phenyl and phenyloxy, wherein phenyl in the two last mentioned radicals is unsubstituted or carries 1, 2 or 3 substituents selected from $C_1$-$C_{10}$-alkyl. In particular, $R^{47}$ is selected from cyano, bromine and phenyl which is unsubstituted or carries 1 or 2 radicals selected from $C_1$-$C_4$-alkyl.

Examples for such preferred compounds are given in tables 1 to 4.

Table 1: Compounds of the formulae (IV-A.3a) or (IV-A.3b) and their mixtures, wherein $X^{40}$ is O, and wherein $R^{42}$, $R^{43}$, $R^{44}$, $R^{45}$, $(R^{41})_{n4}$ and $(R^{47})_{n4}$ have the meanings given in any of lines 1 to 10 of table A.

TABLE A

| | $R^{42}$ | $R^{44}$ | $R^{43}$ | $R^{45}$ | $(R^{41})_{m4}$ | $(R^{47})_{n4}$ |
|---|---|---|---|---|---|---|
| 1. | CN | CN | H | H | — | — |
| 2. | CN | CN | H | H | — | 1-Ph, 4-Ph |
| 3. | CN | CN | H | H | — | 1-Ph, 3-Ph |
| 4. | CN | CN | H | H | — | 2-Ph, 3-Ph |
| 5. | CN | CN | H | H | — | 2-Ph, 4-Ph |
| 6. | CN | CN | H | H | 2-CN | — |
| 7. | CN | CN | H | H | 2-CN | 1-Ph, 4-Ph |
| 8. | CN | CN | H | H | 2-CN | 1-Ph, 3-Ph |
| 9. | CN | CN | H | H | 2-CN | 2-Ph, 3-Ph |
| 10. | CN | CN | H | H | 2-CN | 2-Ph, 4-Ph |

In table A the sign "--" in the definition of $(R^{41})_{m4}$ has the meaning of m4 being 0, i.e. $R^{41}$ is absent; the sign "--" in the definition of $(R^{47})_{n4}$ has the meaning of n4 being 0, i.e. $R^{47}$ is absent; in case that m4 is different from 0, the number in the definition of $(R^{41})_{m4}$ indicates the position the radical $R^{41}$ is attached to the aromatic ring; in case that n4 is different from 0, the numbers in the definition of $(R^{47})_{n4}$ indicate the positions the radicals $R^{47}$ are attached to the benzimidazole ring; Ph is phenyl.

Amongst compounds of the formulae (IV-A.3a) or (IV-A.3b), preference is also given to the compounds defined in the following tables 2, 3 and 4:

Table 2:

Compounds of the formulae (IV-A.3a) or (IV-A.3b) and their mixtures, wherein $X^{40}$ is S, and wherein $R^{42}$, $R^{43}$, $R^{44}$, $R^{45}$, $(R^{41})_{m4}$ and $(R^{47})_{n4}$ have the meanings given in any of lines 1 to 10 of table A.

Table 3:

Compounds of the formulae (IV-A.3a) or (IV-A.3b) and their mixtures, wherein $X^{40}$ is SO, and wherein $R^{42}$, $R^{43}$, $R^{44}$, $R^{45}$, $(R^{41})_{m4}$ and $(R^{47})_{n4}$ have the meanings given in any of lines 1 to 10 of table A.

Table 4:

Compounds of the formulae (IV-A.3a) or (IV-A.3b) and their mixtures, wherein $X^{40}$ is $SO_2$, and wherein $R^{42}$, $R^{43}$, $R^{44}$, $R^{45}$, $(R^{41})_{m4}$ and $(R^{47})_{n4}$ have the meanings given in any of lines 1 to 10 of table A.

According to a further group of embodiments, compounds of the formula (IV) are preferred, wherein A is a radical of the formula (A.4). This group of embodiments includes the pure regioisomer of the formula (IV-A.4a), the pure regioisomer of the formula (IV-A.4b) and mixtures thereof,

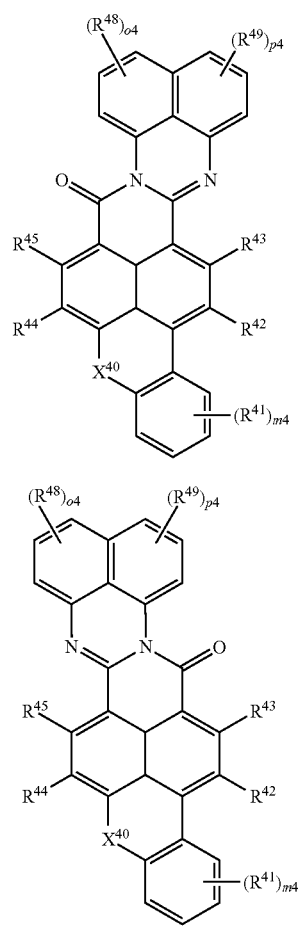

(IV-A.4a)

(IV-A.4b)

wherein $X^{40}$, $R^{41}$, $R^{42}$, $R^{43}$, $R^{44}$, $R^{45}$, $R^{48}$, $R^{49}$, o4, p4 and m4 are as defined above. In particular, $X^{40}$, $R^{41}$, $R^{42}$, $R^{43}$, $R^{44}$, $R^{45}$, and m4 have one of the preferred meanings mentioned above.

Preferred are compounds of the formulae (IV-A.4a) or (IV-A.4b) and their mixtures, wherein o4 and p4 are 0, i.e $R^{48}$ and $R^{49}$ are absent. Preferred are also compounds of the formulae (IV-A.4a) and (IV-A.4b), wherein the sum of o4 and p4 is 1, 2, 3 or 4. In this context, $R^{48}$ and $R^{49}$ are, independently of each other, preferably selected from cyano, bromine, chlorine, $C_1$-$C_4$-alkyl such as methyl, ethyl, n-propyl, isopropyl, n-butyl or isobutyl, $C_1$-$C_4$-alkoxy such as methoxy, ethoxy, n-propoxy, isopropoxy, n-butoxy or isobutoxy, $C_1$-$C_4$-haloalkyl, in particular $C_1$-$C_2$-haloalkyl, phenyl and phenyloxy, wherein phenyl in the two last mentioned radicals is unsubstituted or carries 1, 2 or 3 substituents selected from $C_1$-$C_{10}$-alkyl. In particular, $R^{48}$ and $R^{49}$ are, independently of each other, selected from cyano, bromine and phenyl which is unsubstituted or carries 1 or 2 radicals selected from $C_1$-$C_4$-alkyl.

Examples for preferred compounds of formulae (IV-A.4a) and (IV-A.4b) are shown below:

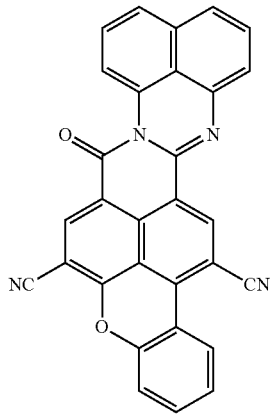

(IV-A.4a-1)

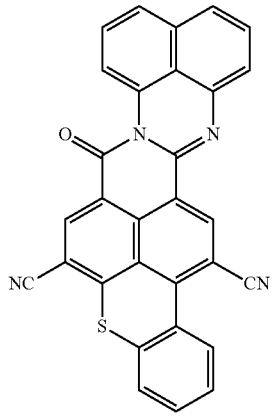

(IV-A.4a-2)

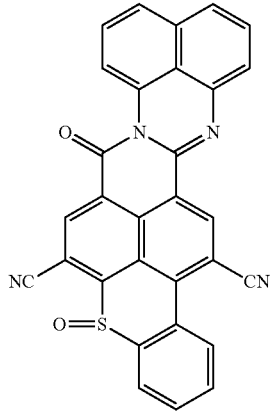

(IV-A.4a-3)

(IV-A.4a-4)
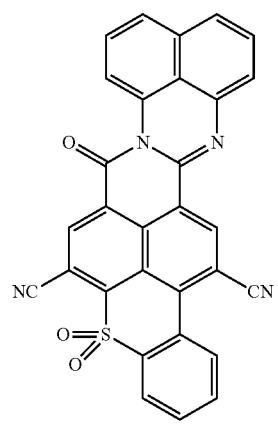
(IV-A.4a-7)
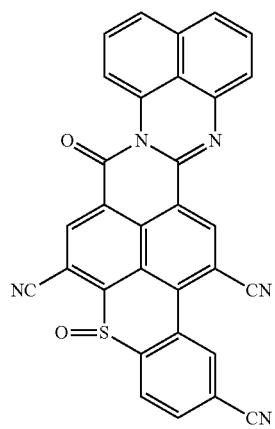
(IV-A.4a-5)
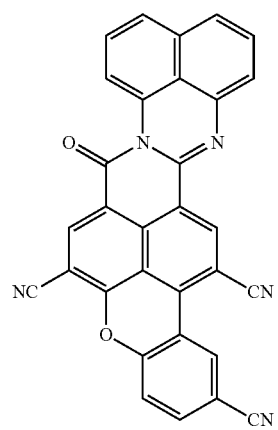
(IV-A.4a-8)
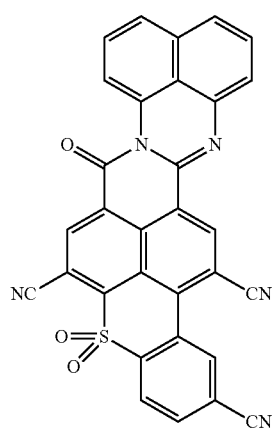
(IV-A.4a-6)
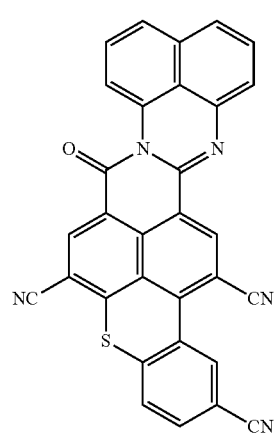
(IV-A.4b-1)
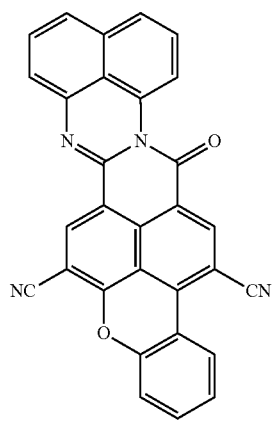

(IV-A.4b-2)
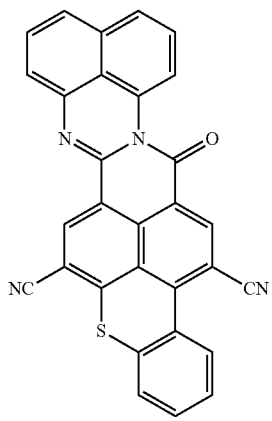
(IV-A.4b-5)
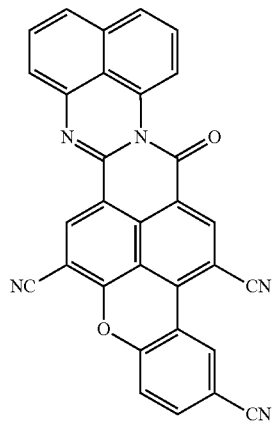
(IV-A.4b-3)
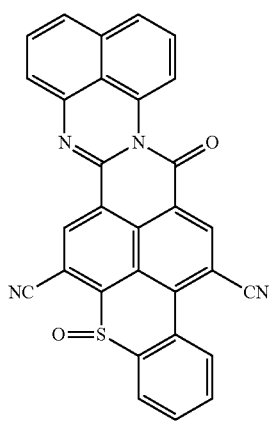
(IV-A.4b-6)
(IV-A.4b-4)
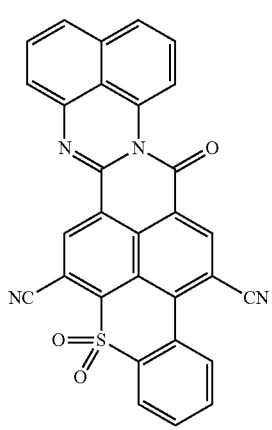
(IV-A.4b-7)
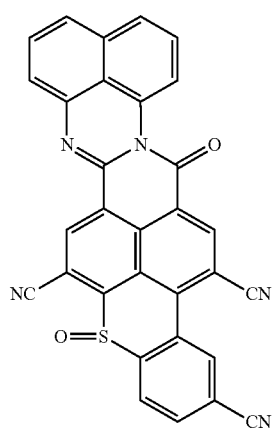

-continued (IV-A.4b-8)

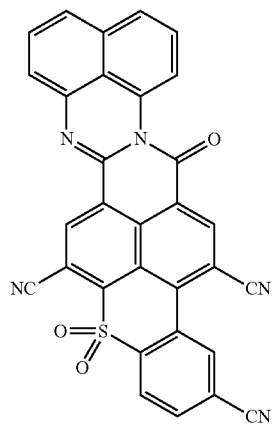

Compounds of the formula (IV) used according to the present invention can be prepared e.g. according to the preparation methods as described below by treating a compound of the formula (IV-II)

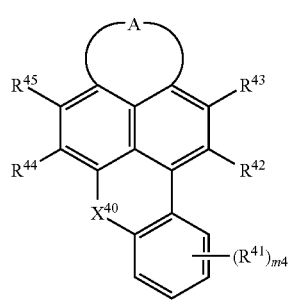

(IV-II)

wherein
at least one of the radicals $R^{42}$, $R^{43}$, $R^{44}$ and $R^{45}$ is selected from bromine and chlorine and the remaining radicals $R^{42}$, $R^{43}$, $R^{44}$ and $R^{45}$ are hydrogen;
$X^{40}$ is O, S, SO or $SO_2$;
A is a radical of the general formulae (A.1), (A.2), (A.3), or (A.4), wherein (A.1), (A.2), (A.3), and (A.4) are as defined above;
$R^{41}$ is bromine, chlorine, —$NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy, $C_6$-$C_{24}$-aryl-$C_1$-$C_{10}$-alkylene, where the rings of cycloalkyl, heterocycloalkyl, heteroaryl, aryl, aryloxy and -aryl-alkylene in the six last-mentioned radicals are unsubstituted or substituted with 1, 2, 3, 4 or 5 identical or different radicals $R^{41a}$ and where $C_1$-$C_{24}$-alkyl, $C_1$-$C_{24}$-haloalkyl, $C_1$-$C_{24}$-alkoxy, and the alkylene moiety of $C_6$-$C_{24}$-aryl-$C_1$-$C_{10}$-alkylene may be interrupted by one or more groups selected from O, S and $NR^{4c}$, wherein $R^{4a}$, $R^{4b}$ and $R^{4c}$ are as defined above; and
m is 0, 1, 2, 3 or 4,
with a cyanating agent. A suitable cyanating agent is for example copper(I) cyanide.

Suitable process conditions for the exchange of bromine or chlorine with cyano are described e.g. in J. March, Advanced Organic Chemistry, 4th edition, John Wiley & Sons Publishers (1992), p. 660-661, in WO 2004/029028 and WO 2015/019270.

Compounds of the formula (IV-II) can be prepared by treating a compound of the formula (IV-III)

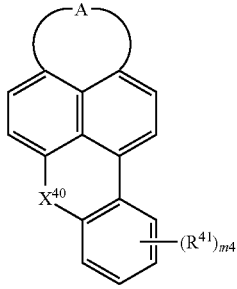

(IV-III)

wherein $X^{40}$, A, $R^{41}$ and m4 are as defined above
with a halogenating agent selected from brominating agents and chlorinating agents.

Bromination is typically carried out with elemental bromine in a solvent as described e.g. in WO 2014/131628. Further suitable brominating agents are N-bromosuccinimide and dibromoisocyanuric acid. Suitable solvents are water or aliphatic monocarboxylic acids, and chlorinated hydrocarbons such as chlorobenzene and chloroform. Suitable aliphatic monocarboxylic acids are those having 2 to 6 carbon atoms, such as acetic acid, propionic acid, butyric acid, pentanecarboxylic acid and hexanecarboxylic acid, and mixtures thereof. When an aliphatic monocarboxylic acid is used as a solvent, it may be advantageous to use iodine as a catalyst.

Chlorination is typically carried out with elemental chlorine, N-chlorosuccinimide, chlorosulfonic acid, sulfuryl chloride in an inert solvent as described e.g. in US 2011/0068328. A further suitable chlorinating agent is N-chlorosuccinimide.

Depending on the molar ratio of the halogenating agent to compound of the formula (IV-III), a mono-, di- or multihalogene-substituted compound of the formula (IV-II), i.e. a mono-, di-, or multibromo-substituted compound of the formula (IV-II) and mono-, di- or multichlorine-substituted compound of the formula (IV-II), respectively, is obtained which can be separated by column chromatography ($SiO_2$).

Benzoxanthene compounds or benzothioxanthene compounds of formula (IV), where A is a radical of formulae (A.1) or (A.2) are known in the art and for example described in U.S. Pat. Nos. 3,748,330, 3,812,051, GB 1 440 450 or WO 2014/131628. Benzoxanthene compounds or benzothioxanthene compounds of formula (IV), where A is a radical of formulae (A.3) or (A.4) can be prepared in analogy to the method described in WO 2015/019270.

Compounds of the formula (IV), wherein X is SO or $SO_2$, can be obtained by oxidizing compounds of the formula (IV), wherein X is S. Suitable oxidizing agents are meta-chloroperbenzoic acid, hypochlorite or hydrogen peroxide.

Benzoxanthene compounds of the formula (V) are known from WO 2014/131628. They are usually yellow or yellow-green fluorescent dyes.

Compounds having a structural unit of the formula (VI) are known from WO 2012/168395. Particular preference is given to the compounds specified in WO 2012/168395, at page 28, line 14 to page 32, line 5.

Especially preferably, organic fluorescent dyes having a structural unit of formula (VI) are selected from compounds of formulae (VI-1), (VI-2), (VI-3), (VI-4), (VI-5), (VI-6), (VI-7), (VI-8), (VI-9), (VI-10), (VI-11), (VI-12), (VI-13), (VI-14), (VI-15), (VI-16), (VI-17), (VI-18), (VI-19), (VI-20), (VI-21), (VI-22), (VI-23), (VI-24), (VI-25), (VI-26), (VI-27), (VI-28), (VI-29), (VI-30), (VI-31), (VI-32), (VI-33), (VI-34), (VI-35), (VI-36), (VI-37), (VI-38), (VI-39), (VI-40), (VI-41), (VI-42), (VI-43), (VI-44), (VI-45), (VI-46), (VI-47), (VI-48), (VI-49), (VI-50), (VI-51), (VI-52), (VI-53), (VI-54), (VI-55), and mixtures thereof
(VI-1)
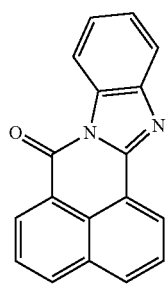
-continued
(VI-3)
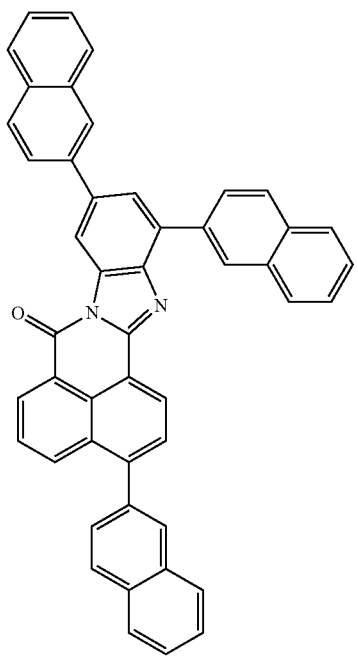
(VI-2)
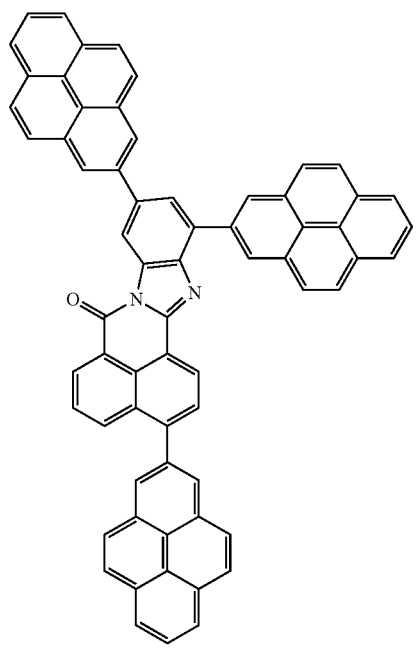
(VI-4)
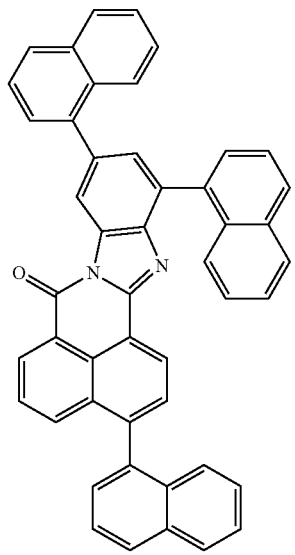

(VI-5)
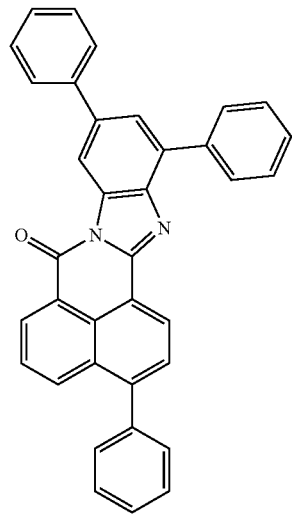
(VI-6)
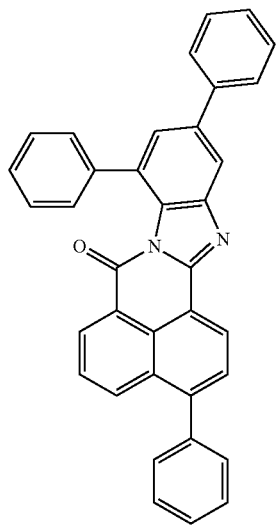
(VI-7)
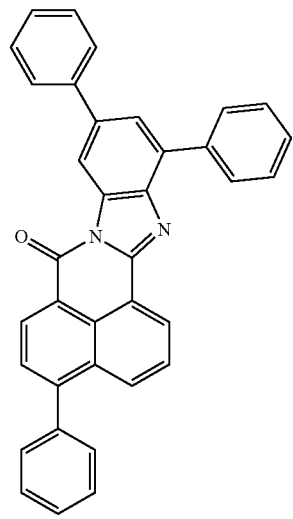
(VI-8)
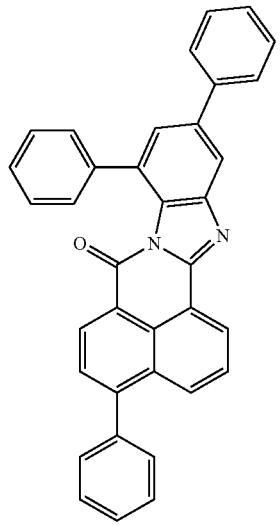
(VI-9)
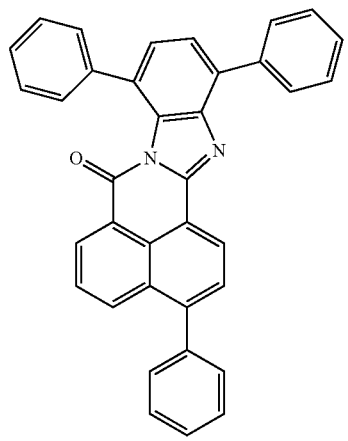
(VI-10)
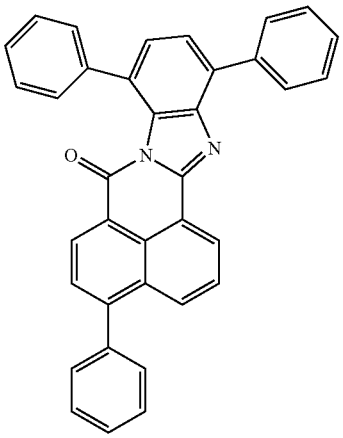

(VI-11)
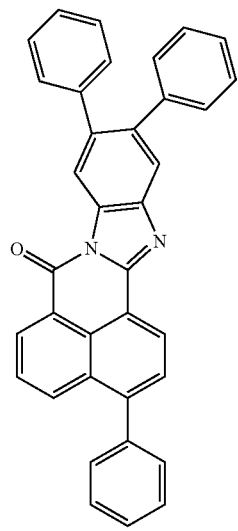
(VI-12)
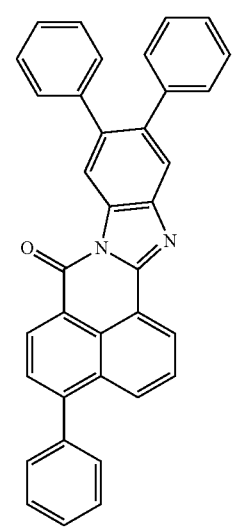
(VI-13)
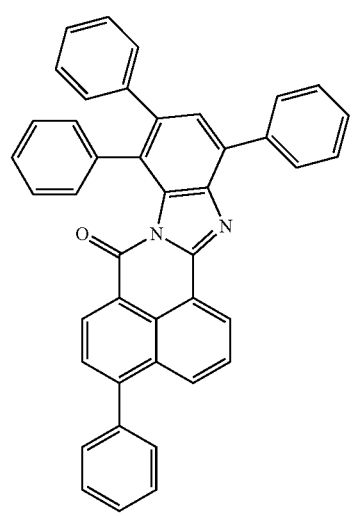
(VI-14)
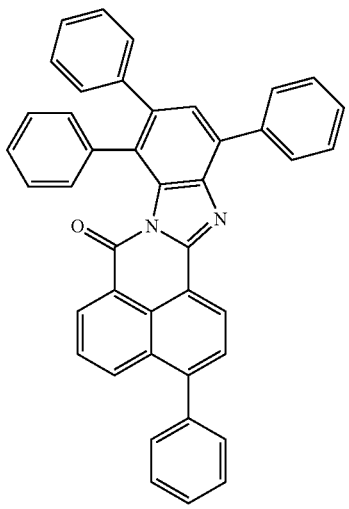
(VI-15)
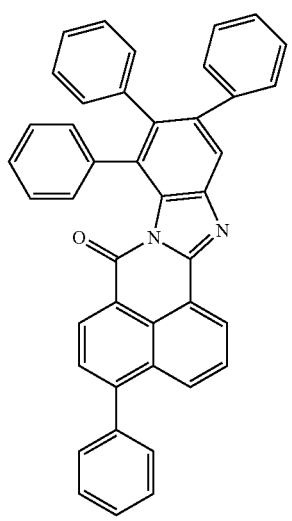
(VI-16)
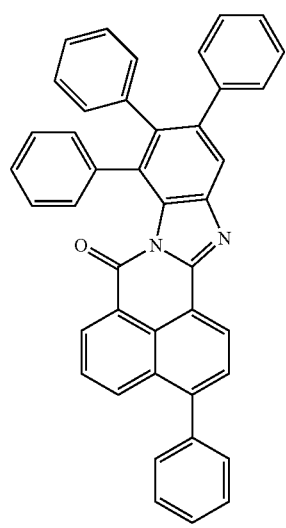

(VI-17)
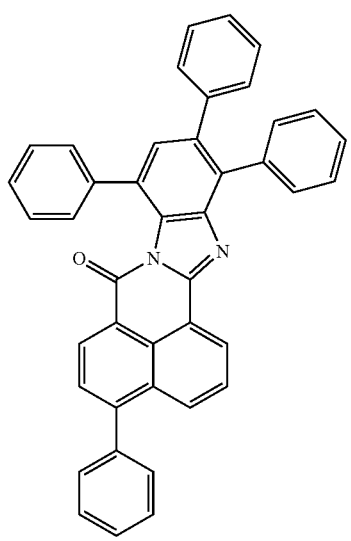
(VI-18)
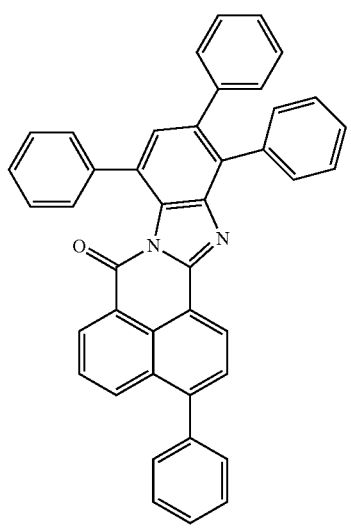
(VI-19)
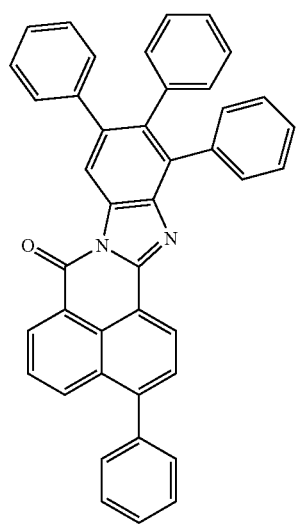
(VI-20)
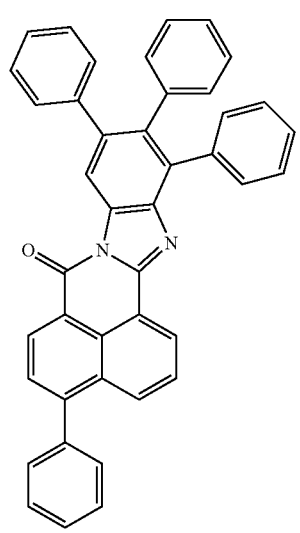
(VI-21)
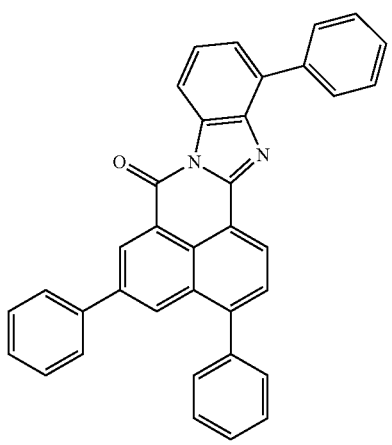
(VI-22)
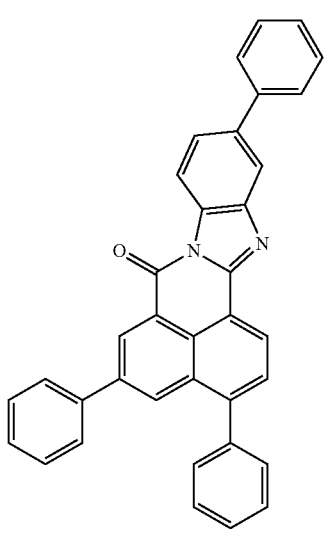

(VI-23)
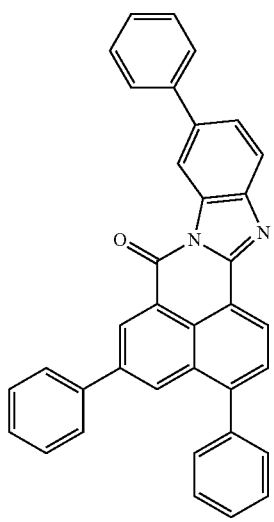
(VI-24)
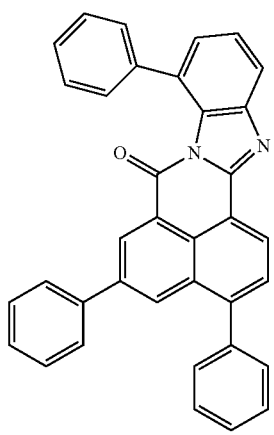
(V-25)
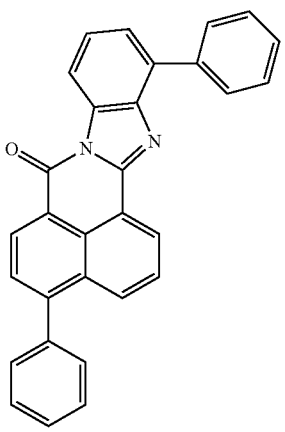
(VI-26)
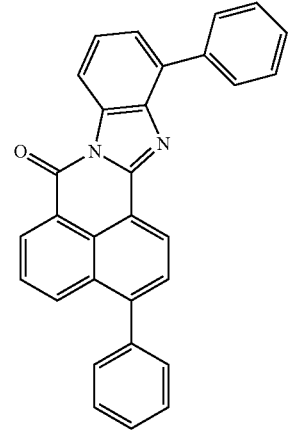
(VI-27)
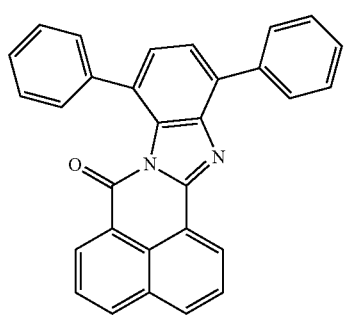
(VI-28)
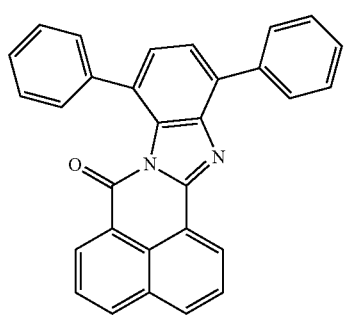
(VI-29)
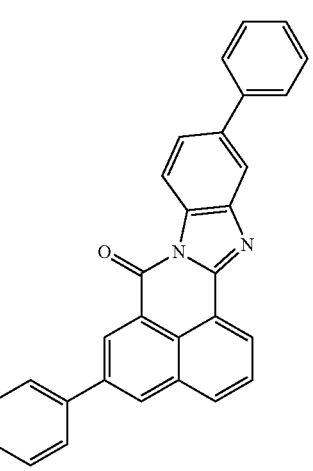

(VI-30)
(VI-31)
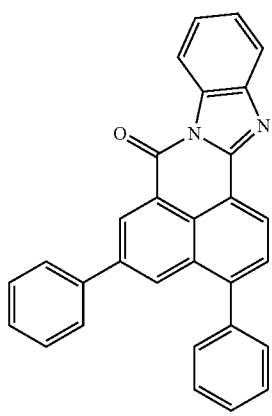
(VI-32)
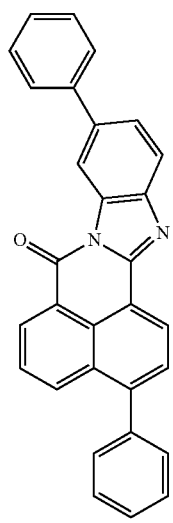
(VI-33)
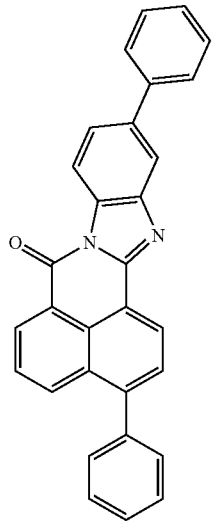
(VI-34)
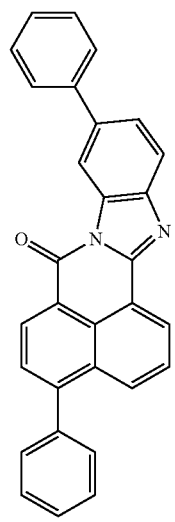
(VI-35)
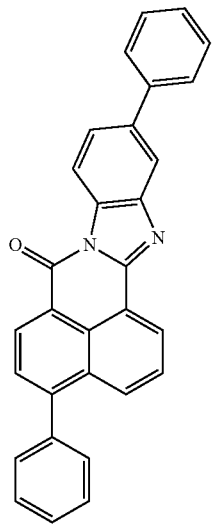

(VI-36)
(VI-37)
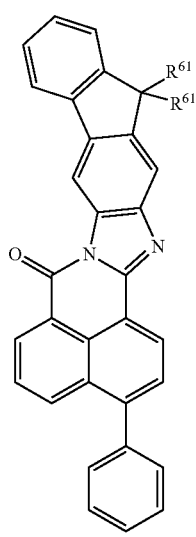
(VI-38)
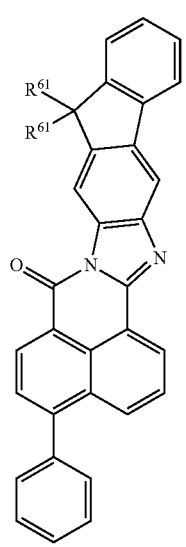
(VI-39)
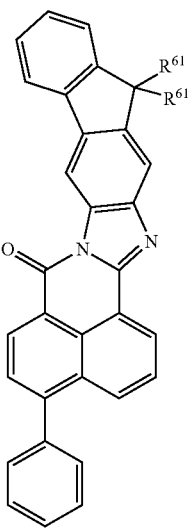
(VI-40)
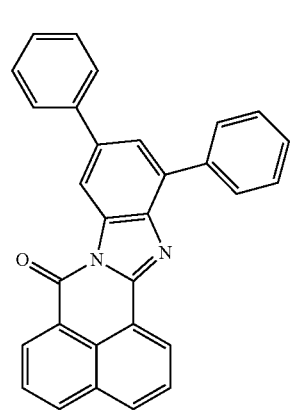
(VI-41)
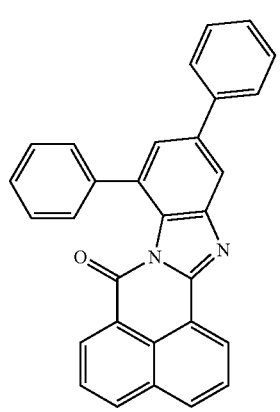

(VI-42)
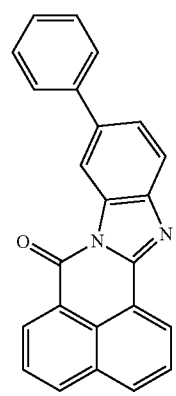
(VI-43)
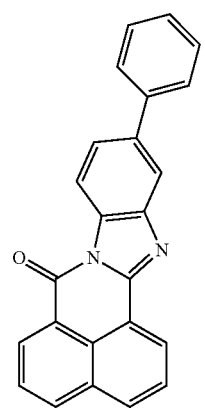
(VI-44)
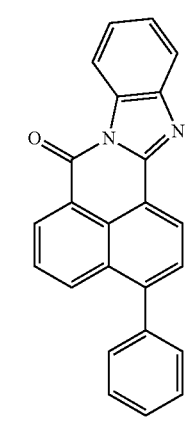
(VI-45)
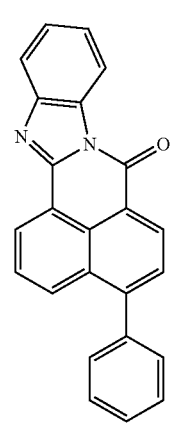
(VI-46)
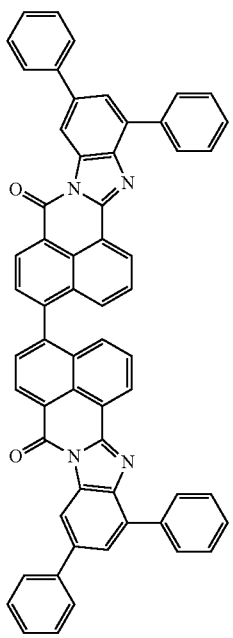
(VI-47)
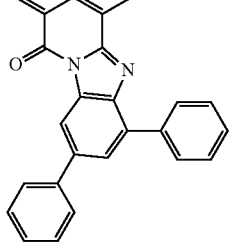

(VI-48)
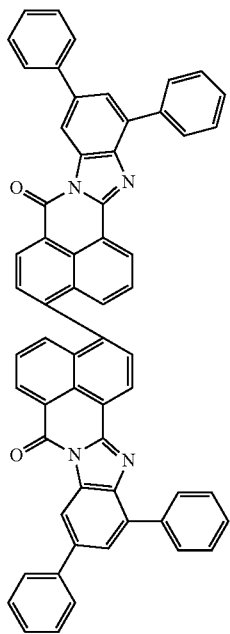
(VI-49)
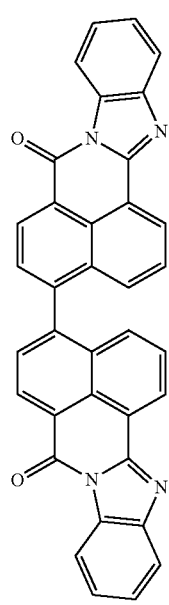
(VI-50)
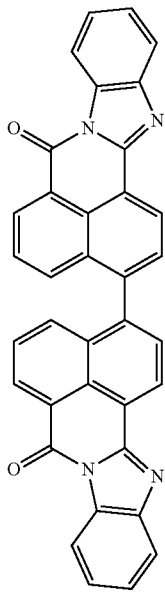
(VI-51)
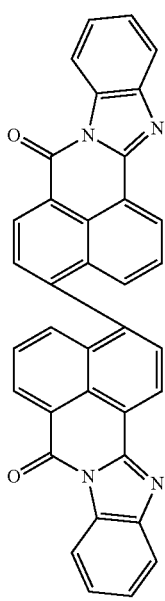
(VI-52)
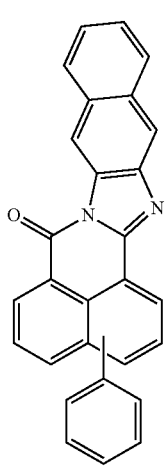

-continued

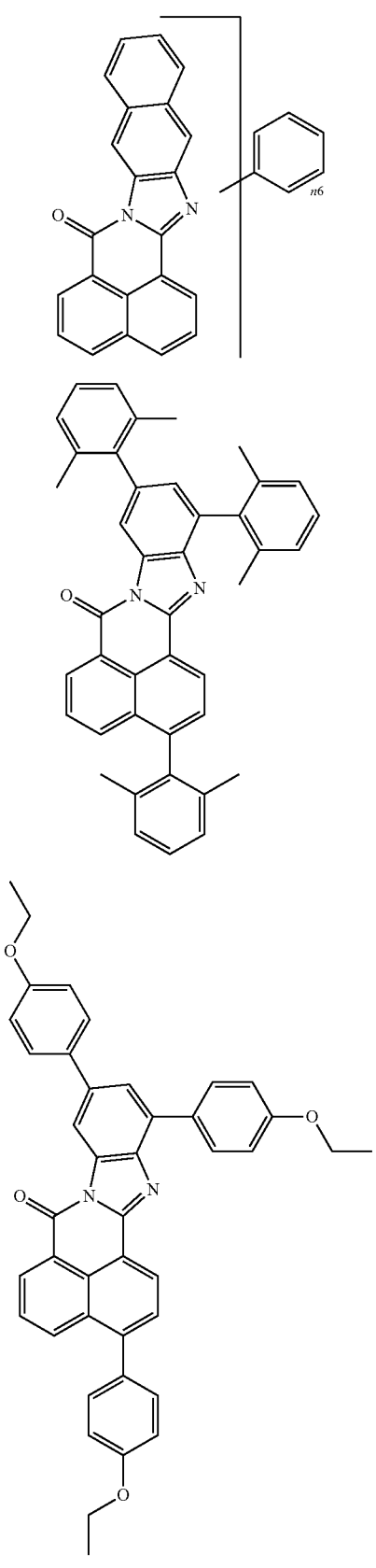

or mixtures thereof, where n6 is a number from 0, 1, 2, 3, 4, 5, 6, 7, 8, 9 or 10;
$R^{61}$ is independently hydrogen, $C_1$-$C_{18}$-alkyl or cycloalkyl, the carbon chain of which may comprise one or more —O—, —S—, —CO—, —SO— and/or —SO$_2$— moieties and which may be mono- or polysubstituted;
aryl or heteroaryl which may be mono- or polysubstituted.

Compounds having at least one structural unit of formula (VI) are especially preferred for use in combination with the inventive red-fluorescent dye. Especially preferred are the compounds of formulae (VI-5), (VI-6), (VI-7) and (VI-8) and mixtures thereof.

Compounds having at least one structural unit of the formula (VI) are usually yellow or yellow-green fluorescent dyes.

Likewise, preferred are compounds of the formula (VII) and mixtures thereof, wherein $R^{71}$ and $R^{72}$ are each independently selected from $C_1$-$C_{10}$-alkyl, 2,6-di($C_1$-$C_{10}$-alkyl)aryl and 2,4-di($C_1$-$C_{10}$-alkyl)aryl. More preferably, $R^{71}$ and $R^{72}$ are identical. Very particularly, $R^{71}$ and $R^{72}$ are each 2,6-diisopropylphenyl or 2,4-di-tert-butylphenyl.

$R^{73}$ is preferably phenoxy, or ($C_1$-$C_{10}$-alkyl)phenoxy, more preferably 2,6-(dialkyl)phenoxy or 2,4-(dialkyl)phenoxy. Especially preferably $R^{73}$ is phenoxy, 2,6-diisopropylphenoxy, 2,4-di-tert-butylphenoxy or 4-tert-octylphenoxy.

More particularly, suitable further organic fluorescent dyes are selected from the compounds of the formulae VII-1, VII-2 and VII-3

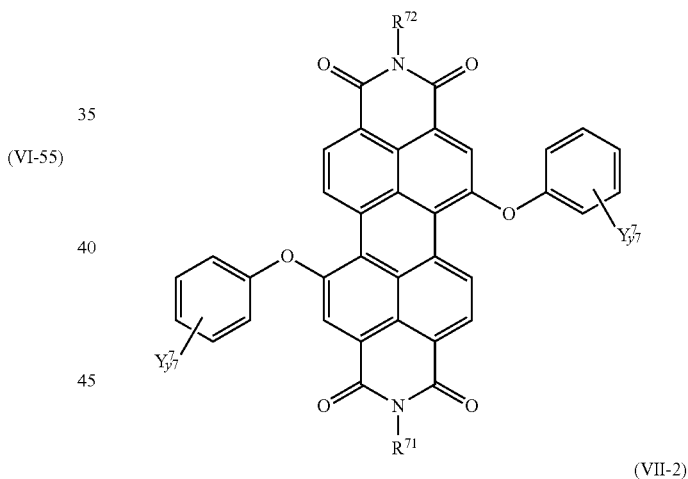

(VII-3)

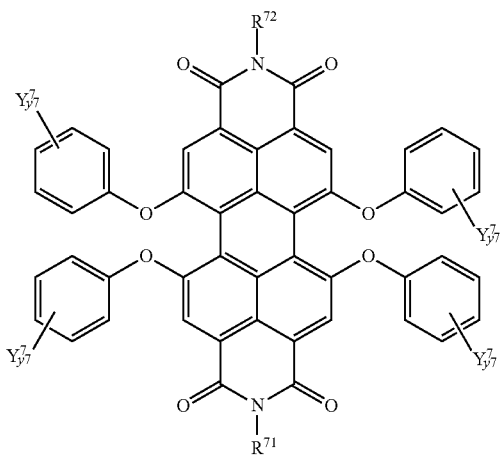

in which
R$^{71}$ and R$^{72}$ are each as defined above and especially have one of the preferred meanings;

Y$^7$ is linear C$_1$-C$_{10}$-alkyl or branched C$_3$-C$_{10}$-alkyl; and y7 is 0, 1, 2, or 3.

Further examples of particularly suitable further organic fluorescent dyes are the perylene derivatives specified in WO 2007/006717 at page 1, line 5 to page 22, line 6. Fluorescent dyes of formula (VII) are usually red-fluorescent dyes.

Particularly suitable further organic fluorescent dyes of formula (VII) are N,N'-bis(2,6-diisopropylphenyl)-1,6,7,12-tetraphenoxyperylene-3,4; 9,10-tetracarboximide, N,N'-bis(2,6-diisopropylphenyl)-1,7-di(2,6-diisopropylphenoxy)perylene-3,4; 9,10-tetracarboximide, N,N'-bis(2,6-diisopropylphenyl)-1,6-di(2,6-diisopropylphenoxy)perylene-3,4; 9,10-tetracarboximide, N,N'-bis(2,6-diisopropylphenyl)-1,7-di(p-tert-octylphenoxy)-perylene-3,4; 9,10-tetracarboximide, N,N'-bis(2,6-diisopropylphenyl)-1,6-di(p-tert-octylphenoxy)perylene-3,4; 9,10-tetracarboximide, N,N'-bis(2,6-diisopropylphenyl)-1,7-diphenoxyperylene-3,4; 9,10-tetracarboximide, N,N'-bis(2,6-diisopropylphenyl)-1,6-diphenoxyperylene-3,4; 9,10-tetracarboximide, and mixtures thereof.

In a further embodiment, inventive color converters additionally comprise at least one further organic fluorescent dye of the formula (VIII). Fluorescent dyes of the formula (VIII) are usually orange fluorescent dyes. Preferred are compounds of formula (VIII) and mixtures thereof (VIII)

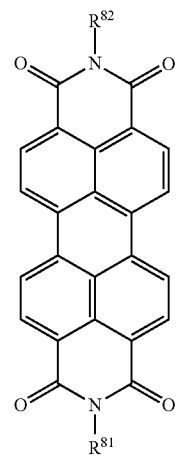

where
R$^{81}$ and R$^{82}$ are each independently selected from C$_1$-C$_{10}$-alkyl, 2,6-di(C$_1$-C$_{10}$-alkyl)aryl and 2,4-di(C$_1$-C$_{10}$-alkyl)aryl. More preferably, R$^{81}$ and R$^{22}$ are identical. Very particularly, R$^{81}$ and R$^{82}$ are each 2,6-diisopropylphenyl or 2,4-di-tert-butylphenyl.

Preferred are also compounds of formula (IX)

(IX)

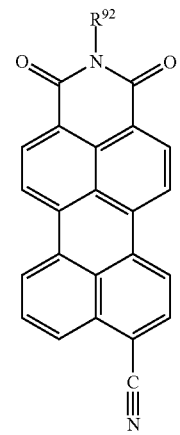

wherein
R$^{92}$ is C$_1$-C$_{10}$-alkyl, 2,6-di(C$_1$-C$_{10}$-alkyl)aryl or 2,4-di(C$_1$-C$_{10}$-alkyl)aryl, in particular R$^{92}$ is 2,6-diisopropylphenyl or 2,4-di-tert-butylphenyl.

Compounds of the formula (IX) are usually yellow-orange fluorescent dyes.

The number of organic fluorescent dyes to be used in combination with the inventive red-fluorescent dye can be any number, preferably 1, 2, 3 or 4, more preferably 1 or 2.

In a preferred embodiment, inventive color converters comprise, as well as the at least one organic fluorescent dye of the formula (I) present in accordance with the invention, at least one further organic fluorescent dye selected from
compounds of formula (II) and mixtures thereof,
compounds of formula (IV) and mixtures thereof,
compounds of formula (VII) and mixtures thereof,
compounds comprising at least one structural unit of formula (VI) and mixtures thereof, and mixtures thereof.

In particular, the at least one further organic fluorescent dye is a compound comprising at least one structural unit of the formula (VI), especially one of the compounds of formulae (VI-1), (VI-2), (VI-3), (VI-4), (VI-5), (VI-6), (VI-7), (VI-8), (VI-9), (VI-10), (VI-11), (VI-12), (VI-13), (VI-14), (VI-15), (VI-16), (VI-17), (VI-18), (VI-19), (VI-20), (VI-21), (VI-22), (VI-23), (VI-24), (VI-25), (VI-26), (VI-27), (VI-28), (VI-29), (VI-30), (VI-31), (VI-32), (VI-33), (VI-34), (VI-35), (VI-36), (VI-37), (VI-38), (VI-39), (VI-40), (VI-41), (VI-42), (VI-43), (VI-44), (VI-45), (VI-46), (VI-47), (VI-48), (VI-49), (VI-50), (VI-51), (VI-52), (VI-53), (VI-54), (VI-55), and mixtures thereof. Among these, especially preferred are the compounds of formulae (VI-5), (VI-6), (VI-7), (VI-8) and mixtures thereof.

In particular, the at least one compound of the formula (VII) is a compound of formula (VII-3)

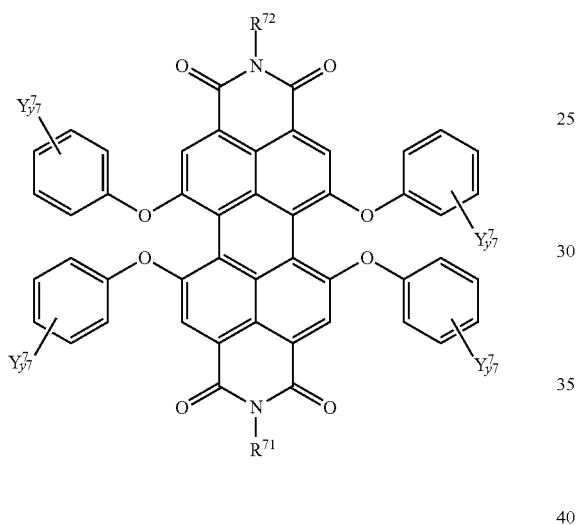

(VII-3)

where

R$^{71}$, R$^{72}$ are each independently phenyl, which is unsubstituted or mono- or polysubstituted by C$_1$-C$_{10}$-alkyl;

each Y$^7$ is independently selected from the group consisting of linear C$_1$-C$_{10}$-alkyl and branched C$_3$-C$_{10}$-alkyl; and y$^7$ is 0, 1, 2 or 3.

and mixtures thereof.

The orange-red or red fluorescent dye of formula (I) according to the invention used in combination with at least one further organic fluorescent dye, especially a yellow or yellow-green fluorescent dye, allows to provide white LEDs with high luminous efficacy.

According to a preferred embodiment, the color converter comprises at least one compound of the formula (I), wherein R$^1$ and R$^2$ are, independently of each other, selected from phenyl which is unsubstituted or substituted by 1, 2 or 3 C$_1$-C$_4$-alkyl; and R$^3$, R$^4$, R$^5$, R$^6$, R$^7$, R$^8$, R$^9$, R$^{10}$, R$^{11}$, R$^{12}$, R$^{13}$, R$^{14}$, R$^{15}$, R$^{16}$, R$^{17}$ and R$^{18}$ are each hydrogen; and at least one compound comprising at least one structural unit of formula (VI) selected from compounds of formulae (VI-5), (VI-6), (VI-7), (VI-8)

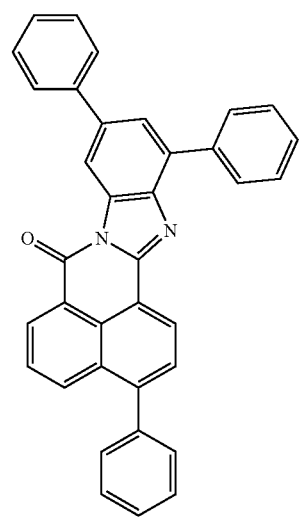

(VI-5)

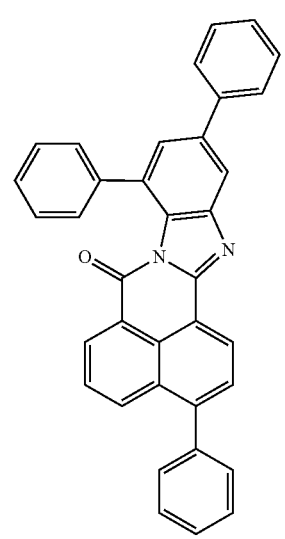

(VI-6)

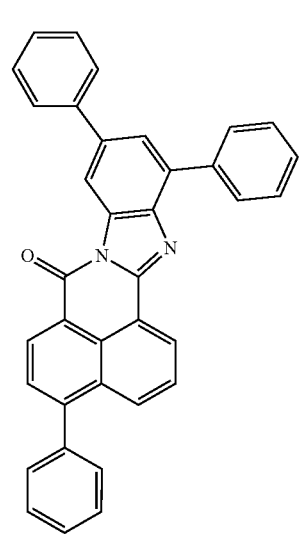

(VI-7)

-continued (VI-8)

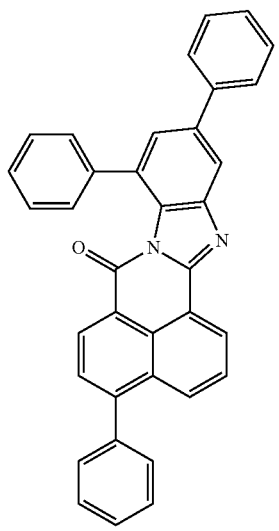

and mixtures thereof.

In a specific embodiment, the polymeric matrix consists of polycarbonate. According to a further specific embodiment, the polymeric matrix consists of polystyrene. According to a further specific embodiment, the polymeric matrix consists of polyethyleneterephthalate. The color converters have high quantum efficiency and high photopic efficacy for converting blue LED light to white light.

The concentration of the organic fluorescent dyes in the polymer is set as a function of the thickness of the color converter and the type of polymer. If a thin polymer layer is used, the concentration of the organic fluorescent dye(s) is generally higher than in the case of a thick polymer layer.

Typically, the amount of organic fluorescent dyes in the polymer also depends on the correlated color temperature CCT to be achieved. A skilled person will appreciate that by increasing the absolute amounts of yellow fluorescent dye and red fluorescent dye, the blue color from the LED is converted to more phosphor emission which leads to white light with decreased CCT.

Typically, the concentration of the red organic fluorescent dye of formula (I) according to the present invention is usually in the range from 0.0001 to 0.5% by weight, preferably 0.001 to 0.1% by weight, most preferably 0.002 to 0.05% by weight, based on the amount of polymer used. The concentration of a further yellow or yellow-green organic fluorescent dyes typically is 0.002 to 0.5% by weight, preferably 0.003 to 0.4% by weight, most preferably 0.005 to 0.35% by weight, based on the amount of the polymer used.

The ratio of the further yellow or yellow-green emitting organic fluorescent dye to the at least one red organic fluorescent dye of the formula (I) is typically in the range from 4:1 to 25:1, preferably 5:1 to 20:1, especially 6:1 to 18:1.

The orange-red or red fluorescent dye of formula (I) according to the invention used in combination with at least one further organic fluorescent dye, especially a yellow or yellow-green fluorescent dye and a further red fluorescent dye different from the dye of formula (I) according to the present invention, allows to provide white LEDs with high luminous efficacy and good color rendering.

In a further preferred embodiment, the color converter comprises at least one compound of the formula (I), wherein $R^1$ and $R^2$ are, independently of each other, selected from phenyl which is unsubstituted or substituted by 1, 2 or 3 $C_1$-$C_4$-alkyl; and $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ are each hydrogen;

at least one compound comprising at least one structural unit of formula (VI) selected from compounds of formulae (VI-5), (VI-6), (VI-7), (VI-8)

(VI-5)

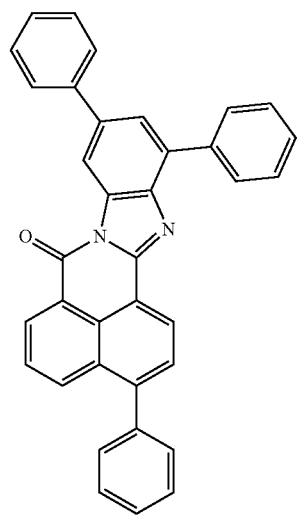

(VI-6)

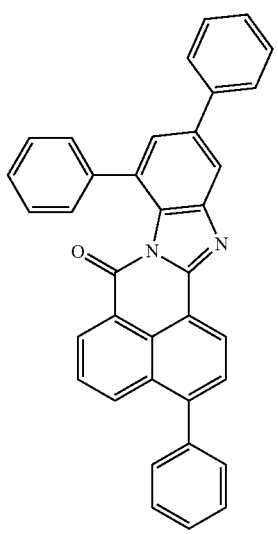

(VI-7)

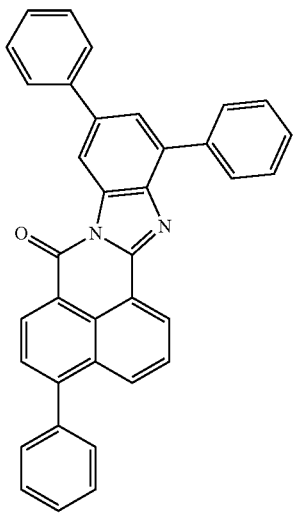

(VI-8)

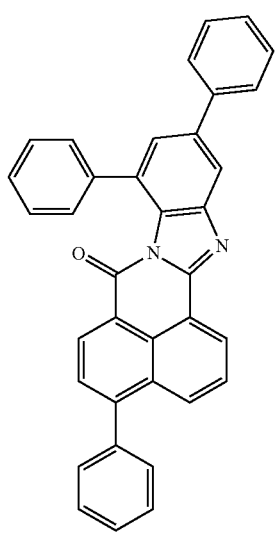

and mixtures thereof; and at least one compound of the formula (VII) selected from compounds of the formula (VII-3)

(VII-3)

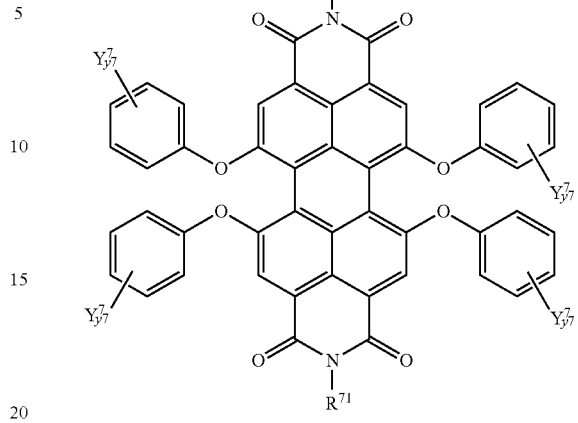

where $R^{71}$, $R^{72}$ are each independently phenyl, which is unsubstituted or mono- or polysubstituted by $C_1$-$C_{10}$-alkyl;

each $Y^7$ is independently selected from the group consisting of linear $C_1$-$C_{10}$-alkyl and branched $C_3$-$C_{10}$-alkyl; and $y^7$ is 0, 1, 2 or 3;

and mixtures thereof.

In a specific embodiment, the polymeric matrix consists of polycarbonate. According to a further specific embodiment, the polymeric matrix consists of polystyrene. According to a further specific embodiment, the polymeric matrix consists of polyethyleneterephthalate. The color converters have high quantum efficiency, photopic efficacy and color rendering index.

The ratio of the further red-emitting organic fluorescent dye of the formula (VII-3) to the at least one red organic fluorescent dye of the formula (I) is typically in the range from 5:1 to 1:5, preferably 3:1 to 1:3, in particular 2:1 to 1:2. This ratio can chosen either to achieve highest color rendering index at good photopic efficacy or to achieve highest photopic efficacy at good color rendering index or to achieve a tradeoff with good values for both.

In a further preferred embodiment, the color converter according to the present invention may comprise inorganic fluorescent materials. According to this embodiment, the color converter is preferably used for conversion of light which has been produced by a blue LED or a cool-white LED, using at least one compound of the formula (I) or a mixture thereof as a fluorescent dye in combination with at least one inorganic fluorescent colorant. In this embodiment, the blue LED and the cool-white LED, respectively, and the color converter are in a remote phosphor arrangement.

The at least one inorganic fluorescent material is preferably selected from garnets, silicates, sulfides, nitrides and oxynitrides.

Particularly preferred among these are those selected from garnets, silicates, sulfides, nitrides and oxynitrides. Suitable examples of garnets, silicates, sulfides, nitrides and oxynitrides are compiled in table I below:

TABLE I

| Class | Compounds | Excitation Peak nm | Emission Peak nm | Reference |
|---|---|---|---|---|
| Garnets | YAG:Ce<br>($Y_3Al_5O_{12}$:Ce)<br>(Y, Gd, Tb, Lu)$_3Al_5O_{12}$:Ce | 460-470 | 550 | U.S. Pat. No. 5,998,925 |
|  | TAG:Ce<br>($Tb_3Al_5O_{12}$:Ce) | 460-470 | 575 | U.S. Pat. No. 6,669,866,<br>U.S. Pat. No. 6,812,500,<br>U.S. Pat. No. 6,576,930,<br>U.S. Pat. No. 6,245,259,<br>U.S. Pat. No. 6,765,237 |
| Silicates | Eu-doped Silicates<br>$A_2Si(OD)_4$:Eu with A = Sr,<br>Ba, Ca, Mg, Zn and D = F,<br>Cl, S, N, Br | <460 | 510 to 610 | U.S. Pat. No. 7,311,858,<br>U.S. Pat. No. 7,267,787 |
|  | $(SrBaCa)_2SiO_4$:Eu |  |  | U.S. Pat. No. 6,809,347,<br>U.S. Pat. No. 6,943,380 |
|  | $Sr_3SiO_5$<br>$Ba_2MgSi_2O_7$:$Eu^{2+}$;<br>$Ba_2SiO_4$:$Eu^{2+}$<br>$(Ca,Ce)_3(Sc,Mg)_2Si_3O_{12}$ |  |  | U.S. Pat. No. 6,429,583<br>WO 02/11214 |
| Sulfides | (Ca, Sr)S:Eu | <460 | 615-660 |  |
| Nitrides | ($CaAlSiN_3$:$Eu^2$)<br>$(Sr,Ca)AlSiN_3$:$Eu^{2+}$ | 455 | red<br>orange | WO2005052087 |
| Oxy-<br>nitrides | SiAlON:Ce<br>ß-SiAlON:Eu<br>Ca-alpha-SiAlON:Eu<br>($Ba_3Si_6O_{12}N_2$:Eu)<br>General formula<br>$Ca_xEu_y(Si,Al)_{12}(O,N)_{16}$ | 300-580 | 490<br>540<br>585-595 |  |

According to a further embodiment, inventive color converters comprise, as well as the at least one organic fluorescent dye of formula (I) present in accordance with the invention, at least one further organic fluorescent dye selected from compounds of formula (II) and mixtures thereof, compounds of formula (III) and mixtures thereof, compounds of formula (IV) and mixtures thereof, compounds of formula (V) and mixtures thereof, compounds having a structural unit of formula (VI) and mixtures thereof, compounds of formula (VII) and mixtures thereof, compounds of formula (VIII) and mixtures thereof, compounds of formula (IX) and mixtures thereof, and mixtures thereof;

and at least one inorganic fluorescent material as defined above.

According to a further preferred embodiment, the inventive color converter comprises at least one quantum dot. Quantum dots are nanocrystals of a semiconductor material having a diameter of about 20 nm or less. The quantum dot may include one of a Si-based nanocrystal, a group II-VI compound semiconductor nanocrystal, a group III-V compound semiconductor nanocrystal, a group IV-VI compound nanocrystal and a mixture thereof. The group II-VI compound semiconductor nanocrystal may include one selected from a group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe and HgZnSTe. The group III-V compound semiconductor nanocrystal may include one selected from a group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. The IV-VI compound semiconductor nano crystal may be SnTe.

To synthesize a nanocrystal in form of a quantum dot, quantum dots may be prepared by vapor deposition such as metal organic chemical vapor deposition or molecular beam epitaxy, or by a wet chemical process in which a crystal is grown by adding one or more precursors into an organic solvent.

According to a further embodiment, inventive color converters comprise, as well as the at least one organic fluorescent dye present in accordance with the invention, at least one further organic fluorescent dye selected from compounds of formulae (II), (III), (IV), (V), (VI), (VII), (VIII), (IX) and mixtures thereof and at least one quantum dot as defined above.

In a more preferred embodiment of the invention, the inventive color converter does not comprise quantum dots. Likewise, in a more preferred embodiment of the invention, the inventive color converter does not comprise inorganic fluorescent materials.

In one embodiment of the invention, inventive color converters have a laminate structure. They may either have a monolayer structure or a multilayer structure, generally composed of a plurality of polymer layers comprising one or more fluorescent dyes and/or scattering bodies. If the color converter has a multilayer structure, one layer comprises the red fluorescent dye according to the invention and another layer comprises at least one fluorescent dye encompassed by the present invention.

In one embodiment, the at least one red organic fluorescent dye is present in the layer of the color converter facing the LED. In another embodiment, the at least one further fluorescent dye is present in the layer of the color converter facing the LED.

According to a preferred embodiment, the color converter additionally comprises at least one inorganic white pigment as a scattering body.

In a preferred embodiment, at least one of the layers or matrices comprising organic fluorescent dye comprises scattering bodies for light.

Suitable scattering bodies are inorganic white pigments, for example titanium dioxide, barium sulphate, lithopone, zinc oxide, zinc sulphide, calcium carbonate with a mean particle size to DIN 13320 of 0.01 to 10 µm, preferably 0.1 to 1 µm, more preferably 0.15 to 0.4 µm, especially scattering bodies based on $TiO_2$.

Scattering bodies are included typically in an amount of 0.01 to 2.0% by weight, preferably 0.05 to 1% by weight, more preferably 0.1 to 0.5% by weight, based in each case on the polymer of the layer comprising scattering bodies.

In a preferred embodiment, the color converter has a two-layer structure with a red-fluorescing layer and a green-yellow-fluorescing layer comprising at least one fluorescent dye present in accordance with the invention, with the red layer facing the blue light source. In this embodiment, both layers comprise $TiO_2$ as a scattering body.

In one embodiment, the color converters consist of a plurality of polymer layers which have been laminated together to form a composite and wherein the various fluorescent dyes/colorants and/or scattering bodies may be present in different polymer layers.

If inventive color converters comprise more than one fluorescent dyes/colorant, it is possible in one embodiment of the invention for a plurality of fluorescent dyes/colorants to be present alongside one another in one layer.

In another embodiment, the various fluorescent dyes/colorants are present in various layers.

In a preferred embodiment, inventive color converters comprise the at least one organic fluorescent dye present in accordance with the invention and mixtures thereof; at least one further organic fluorescent dye selected from compounds of formula (II) and mixtures thereof, compounds of formula (IV) and mixtures thereof, compounds having a structural unit of formula (VI) and mixtures thereof, compounds of formula (VII) and mixtures thereof, and mixtures thereof; scattering bodies based on $TiO_2$; and at least one polymer consisting essentially of polystyrene, polyethylene terephthalate or polycarbonate.

In an even more preferred embodiment, inventive color converters comprise
 at least one organic fluorescent dye present in accordance with the invention and mixtures thereof;
 at least one further organic fluorescent dye selected from compounds of formula (II) and mixtures thereof, compounds of formula (IV) and mixtures thereof, compounds having a structural unit of formula (VI) and mixtures thereof, and compounds of formula (VII) and mixtures thereof,
 and mixtures thereof;
 scattering bodies based on $TiO_2$; and
 at least one polymer consisting essentially of polyethylene terephthalate.

Likewise, in an even more preferred embodiment, inventive color converters comprise
 at least one organic fluorescent dye present in accordance with the invention and mixtures thereof;
 at least one further organic fluorescent dye selected from compounds of formula (II) and mixtures thereof, compounds of formula (IV) and mixtures thereof, compounds having a structural unit of formula (VI) and mixtures thereof, and compounds of formula (VII) and mixtures thereof,
 and mixtures thereof;
 scattering bodies based on $TiO_2$; and
 at least one polymer consisting essentially of polystyrene.

In an even more preferred embodiment, inventive color converters comprise
 at least one organic fluorescent dye present in accordance with the invention and mixtures thereof;
 at least one further organic fluorescent dye selected from compounds of formula (II) and mixtures thereof, compounds of formula (IV) and mixtures thereof, compounds having a structural unit of formula (VI) and mixtures thereof, and compounds of formula (VII) and mixtures thereof,
 and mixtures thereof;
 scattering bodies based on $TiO_2$; and
 at least one polymer consisting essentially of polycarbonate.

In a particularly preferred embodiment, inventive color converters comprise at least one organic fluorescent dye present in accordance with the invention and mixtures thereof; at least one further organic fluorescent dye having a structural unit of formula (VI) and mixtures thereof; scattering bodies based on $TiO_2$; and at least one polymer consisting essentially of polystyrene, polyethylene terephthalate or polycarbonate.

In an even more particularly preferred embodiment, inventive color converters comprise the at least one organic fluorescent dye present in accordance with the invention and mixtures thereof, at least one further organic fluorescent dye of formula (VI) and mixtures thereof, scattering bodies based on $TiO_2$ and at least one polymer consisting essentially of polyethylene terephthalate.

In an even more particularly preferred embodiment, inventive color converters comprise the at least one organic fluorescent dye present in accordance with the invention and mixtures thereof, at least one further organic fluorescent dye of formula (VI) and mixtures thereof, scattering bodies based on $TiO_2$ and at least one polymer consisting essentially of polystyrene.

Likewise, in a particularly preferred embodiment, inventive color converters comprise the at least one organic fluorescent dye present in accordance with the invention and mixtures thereof, at least one further organic fluorescent dye having a structural unit of formula (VI) and mixtures thereof, scattering bodies based on $TiO_2$ and at least one polymer consisting essentially polycarbonate.

In a further particularly preferred embodiment, inventive color converters comprise, at least one organic fluorescent dye present in accordance with the invention and mixtures thereof, at least one further organic fluorescent dye having a structural unit of formula (VI) and mixtures thereof and at least one compound of the formula (VII) and mixtures thereof, scattering bodies based on $TiO_2$ and at least one polymer consisting essentially of polystyrene, polyethylene terephthalate or polycarbonate.

In a particularly preferred embodiment, inventive color converters comprise the at least one organic fluorescent dye present in accordance with the invention and mixtures thereof, at least one further organic fluorescent dye having a structural unit of formula (VI) and mixtures thereof and at least one compound of the formula (VII) and mixtures thereof, scattering bodies based on $TiO_2$ and at least one polymer consisting essentially polystyrene.

Likewise, in a particularly preferred embodiment, inventive color converters comprise, the at least one organic fluorescent dye present in accordance with the invention and mixtures thereof, at least one further organic fluorescent dye having a structural unit of formula (VI) and mixtures thereof and at least one compound of the formula (VII) and mixtures thereof, scattering bodies based on $TiO_2$ and at least one polymer consisting essentially of polyethylene terephthalate.

Likewise, in a particularly preferred embodiment, inventive color converters comprise, the at least one organic fluorescent dye present in accordance with the invention and mixtures thereof, at least one further organic fluorescent dye having a structural unit of formula (VI) and mixtures thereof and at least one compound of the formula (VII) and mixtures thereof, scattering bodies based on $TiO_2$ and at least one polymer consisting essentially polycarbonate.

In one embodiment, at least one polymer layer of the color converter has been mechanically reinforced with glass fibers.

Inventive color converters may be in any desired geometric arrangement. The color converters may, for example, be in the form of films, sheets or plaques. Equally, the matrix containing organic fluorescent dyes may be in droplet form or hemispherical form or in the form of lenses with convex and/or concave, flat or spherical surfaces.

"Casting" refers to the embodiment where LEDs or components comprising LEDs are cast or enveloped fully with a polymer comprising organic fluorescent dye.

In one embodiment of the invention, the polymer layers (matrices) comprising organic fluorescent dye are 25 to 400 micrometers (μm) thick, preferably 35 to 300 μm and particularly 50 to 200 μm.

In another embodiment, the polymer layers comprising organic fluorescent dyes are 0.2 to 5 millimeters thick, preferably 0.3 to 3 mm and more preferably 0.4 to 1 mm.

If the color converters consist of one layer or they have a laminate structure, the individual layers, in a preferred embodiment, are continuous and do not have any holes or interruptions.

Inventive color converters may optionally comprise further constituents such as a backing layer.

Backing layers serve to impart mechanical stability to the color converter. The type of material for the backing layers is not crucial, provided that it is transparent and has the desired mechanical strength. Suitable materials for backing layers are, for example, glass or transparent rigid organic polymers such as polycarbonate, polystyrene or polymethacrylates or polymethylmethacrylates.

Backing layers generally have a thickness of 0.1 mm to 10 mm, preferably 0.2 mm to 5 mm, more preferably 0.3 mm to 2 mm.

In one embodiment of the invention, inventive color converters have at least one barrier layer against oxygen and/or water, as disclosed in WO 2012/152812. Examples of suitable barrier materials for barrier layers are, for example, glass, quartz, metal oxides, $SiO_2$, a multilayer system composed of alternating layers of $Al_2O_3$ and $SiO_2$ layers, titanium nitride, $SiO_2$/metal oxide multilayer materials, polyvinyl alcohol, polyacrylonitrile, polyvinylidene chloride (PVDC), liquid crystal polymers (LCP), polystyrene-acrylonitrile (SAN), polybutylene terephthalate (PBT), polybutylene naphthalate (PBN), polyethylene terephthalate (PET), polyethylene naphthalate (PEN), polyvinyl butyrate (PBT), polyvinyl chloride (PVC), polyamides, polyoxymethylenes, polyimides, polyetherimides, epoxy resins, polymers which derive from ethylene-vinyl acetate (EVA) and polymers which derive from ethylene-vinyl alcohol (EVOH).

A preferred material for barrier layers is glass or a multilayer system composed of alternating layers of $Al_2O_3$ and $SiO_2$ layers.

Preferably, suitable barrier layers have low permeability for oxygen.

More preferably, suitable barrier layers have low permeability for oxygen and water.

Inventive color converters are especially suitable for the conversion of blue light to white light.

More particularly, they are suitable for conversion of light emitted by blue LEDs. Suitable LEDs are, for example, those based on gallium nitride (GaN) or indium gallium nitride (InGaN). Likewise possible is their use for conversion of light produced by mercury lamps, by organic light-emitting diodes (OLEDs) or by white LEDs.

According to a further embodiment, they are suitable for conversion of light emitted by green LEDs. Suitable LEDs are, for example, those based on GaInNAs, such as Te-doped GaInNAs and Mg-doped GaInNAs.

Particularly, they are suitable for conversion of light emitted by white LEDs with high luminous efficacy. More particularly, they are suitable for conversion of light emitted by white LEDs having a color temperature of 20000 K to 4500 K, preferably 12000 K to 7000 K.

Particularly, they are suitable for conversion of light emitted by white LEDs which offer high photopic luminous efficacy as well as high color rendering index.

They are additionally suitable for applications as a light-collecting system (fluorescence collector) in photovoltaics and in fluorescence conversion solar cells.

In a further embodiment, the inventive color converters are used for the conversion of blue light.

Inventive color converters on irradiation with light, especially with blue LED light, exhibit a high quantum yield and overall photopic luminous efficacy. The inventive color converter allows to provide white LEDs with high photopic luminous efficacy. In addition, the compounds of formula (I) have a high photostability on illumination with light generated by LEDs, especially generated by a blue LED or a cool-white LED. Moreover, they are stable toward oxygen and water.

Inventive color converters can be produced by different processes.

In one embodiment, the process for producing inventive color converters comprises the dissolution of the at least one polymer and the at least one organic fluorescent dye and, if present, further organic fluorescent dyes, in a solvent and subsequent removal of the solvent.

In another embodiment, the process for producing inventive color converters comprises the extrusion of the at least one organic fluorescent dye and, if present, further organic fluorescent dyes with the at least one polymer.

The invention further provides lighting devices comprising at least one LED and at least one color converter according to the invention. The at least one LED is preferably a blue one and emits light preferably with a center wavelength from 400 to 500 nm, preferably 420 to 480 nm, most preferably 430 to 470 nm or 440 to 470 nm.

In one embodiment, inventive lighting devices comprise exactly one LED. In another embodiment, inventive lighting devices comprise two or more LEDs.

In one embodiment, inventive lighting devices comprise a plurality of LEDs, all of which are blue ones. In another embodiment, inventive lighting devices comprise a plurality of LEDs, at least one LED being blue and at least one LED not being a blue one but emitting light in another color, for example red.

Furthermore, the type of LED used is not crucial for the inventive lighting devices. In a preferred embodiment, the power density of the blue LED light impinging the surface of the converter plate is usually less than 200 mW/cm$^2$, preferably less than 120 mW/cm$^2$, more preferably less than 80 mW/cm$^2$. The use of LEDs of higher power densities, such as 150 or 200 mW/cm$^2$, is likewise possible. However, a higher power density of the LED at the converter surface can reduce the lifetime of the fluorescent dyes and the color converters.

Inventive color converters can be used in combination with LEDs in virtually any geometric form and irrespective of the construction of the lighting device.

In one embodiment, color converter and LED are in a phosphor on a chip arrangement.

Preferably, inventive color converters are used in a remote phosphor setup. In this case, the color converter is spatially separated from the LED. In general, the distance between LED and color converter is from 0.1 cm to 50 cm, preferably 0.2 to 10 cm and most preferably 0.5 to 3 cm. Between color converter and LED may be different media such as air, noble gases, nitrogen or other gases or mixtures thereof.

The color converter may, for example, be arranged concentrically around the LED or have a planar geometry. It may take the form, for example, of a plaque, sheet or film, be in droplet form or take the form of a casting.

Inventive lighting devices are suitable for lighting in interiors, outdoors, of offices, of vehicles, in torches, games consoles, streetlights, traffic signs.

Inventive lighting devices exhibit a high quantum yield and high photopic luminous efficacy. In addition, they have a long lifetime, especially a high photostability on illumination with blue light.

The inventive perylene bisimide compound of the formula (I) and mixtures thereof are also notable for use in color converters for converting light emitted from a light source, in particular a light source selected from LEDs and OLEDs, into light of a second, longer wavelength, for coloring coatings, printing inks and plastics, producing aqueous polymer dispersions which absorb and/or emit electromagnetic radiation, for data storage, for optical labels, for security labels in documents and for brand protection or as a fluorescent label for biomolecules.

Owing to their remarkable optical properties, the perylene bisimide compounds of formula (I) and mixtures thereof are also of particular interest for use in security inks for security printing. The wavelength of the emitted light may be from 500 to about 750 nm.

Accordingly, the present invention also relates to a printing ink formulation for security printing, comprising at least one compound of the formula (I) or a mixture thereof as defined above.

Security printing is the field that deals with the printing of items such as currency, passports, tamper-evident labels, stock certificates, tax stamps, postage stamps, identity cards, etc. The main goal of security printing is to prevent forgery, tampering or counterfeiting.

In the field of automated banknote processing, UV absorption plays an important role. Most of the actually circulating currency carries not only visibly coloured printings, but also specific features which are only detectable upon exposure to UV light. Generally, these features are implemented for use by automatic currency processing equipment, in banking and vending applications (automatic teller machines, automatic vending machines, etc.), in order to recognize a determined currency bill and to verify its authenticity, in particular to discriminate it from replicas made by colour copiers.

All security documents are required to have good stability and durability. In the case of bank notes, these requirements are extreme, as bank notes are subjected to toughest use conditions by the public—they are subjected to material stress by folding, crumpling etc., subjected to abrasion, exposed to weather, exposed to bodily fluids such as perspiration, laundered, dry-cleaned, ironed etc.—and, after having been subjected to this, are expected to be as legible as when they started. Furthermore, it is essential that the documents nevertheless should have a reasonable life time, ideally of some years, despite suffering the afore-mentioned conditions. During this time, the documents, and thus the inks on them (including invisible security markings), should be resistant to fading or colour change. Hence, any ink used in a security printing process should, when cured, be robust, water-resistant, resistant to various chemicals and flexible. Moreover, as certain states are moving away from the use of paper as the substrate for bank notes, the employed printing ink formulations should be useable on plastics as well as paper. It has now been found that the compounds of the general formula (I) because of their unique application properties are especially suitable for printing ink formulations that are employed for security printing and in particular for bank notes.

In security printing, the fluorescent dye of formula (I) is added to a printing ink formulation. Suitable printing inks are water-based, oil-based, or solvent-based printing inks, based on pigment or dye, for inkjet printing, flexographic printing, gravure printing, screen printing, intaglio printing, offset printing, laser printing or letterpress printing and for use in electrophotography. Printing inks for these printing processes usually comprise solvents, binders, and also various additives, such as plasticizers, antistatic agents or waxes. Printing inks for offset printing, letterpress printing and intaglio printing are usually formulated as high-viscosity paste printing inks, whereas printing inks for flexographic printing and inkjet printing are usually formulated as liquid printing inks with comparatively low viscosity.

In the context of the present invention, the expression "printing ink" also encompasses formulations that in addition to at least one fluorescent dye of the general formula (I) comprise a colorant. The expression "printing ink" also encompasses printing lacquers that comprise no colorant.

The printing ink formulation for security printing according to the invention preferably comprises
a) at least one compound of the formula (I) or a mixture thereof as defined above;
b) a polymeric binder;
c) optionally an organic solvent;
d) optionally at least one colorant; and
e) optionally at least one further additive.

Suitable components of printing inks are conventional and are well known to those skilled in the art. Examples of such components are described in "Printing Ink Manual", fourth edition, Leach R. H. et al. (eds.), Van Nostrand Reinhold, Wokingham, (1988). Details of printing inks and their formulation are also disclosed in "Printing Inks"-Ullmann's Encyclopedia of Industrial Chemistry, Sixth Edition, 1999 Electronic Release.

The printing ink formulation according to the invention contains in general from 0.0001 to 25% by weight, preferably from 0.001 to 15% by weight, in particular from 0.01 to 5% by weight, based on the total weight of the printing ink formulation, of component a).

The compounds of the general formula (I) are present in the printing ink formulation in dissolved form or in solid form (in a finely divided state).

The printing ink formulation according to the invention contains in general from 5 to 75% by weight, preferably from 10 to 60% by weight, more preferably from 15 to 40% by weight, based on the total weight of the printing ink formulation, of component b).

Suitable polymeric binders b) for the printing ink formulation according to the invention are for example selected from natural resins, phenol resin, phenol-modified resins, alkyd resins, polystyrene homo- and copolymers, terpene resins, silicone resins, polyurethane resins, urea-formaldehyde resins, melamine resins, polyamide resins, polyacrylates, polymethacrylates, chlorinated rubber, vinyl ester resins, acrylic resins, epoxy resins, nitrocellulose, hydrocarbon resins, cellulose acetate, and mixtures thereof.

The printing ink formulation according to the invention can also comprise components that form a polymeric binder by a curing process. Thus, the printing ink formulation according to the invention can also be formulated to be energy-curable, e.g. able to be cured by UV light or EB (electron beam) radiation. In this embodiment, the binder comprises one or more curable monomers and/oligomers. Corresponding formulations are known in the art and can be found in standard textbooks such as the series "Chemistry & Technology of UV & EB Formulation for Coatings, Inks & Paints", published in 7 volumes in 1997-1998 by John Wiley & Sons in association with SITA Technology Limited.

Suitable monomers and oligomers (also referred to as prepolymers) include epoxy acrylates, acrylated oils, urethane acrylates, polyester acrylates, silicone acrylates, acrylated amines, and acrylic saturated resins. Further details and examples are given in "Chemistry & Technology of UV & EB Formulation for Coatings, Inks & Paints", Volume II: Prepolymers & Reactive Diluents, edited by G Webster.

If a curable polymeric binder is employed, it may contain reactive diluents, i.e. monomers which act as a solvent and which upon curing are incorporated into the polymeric binder. Reactive monomers are typically chosen from acrylates or methacrylates, and can be monofunctional or multifunctional. Examples of multifunctional monomers include polyester acrylates or methacrylates, polyol acrylates or methacrylates, and polyether acrylates or methacrylates.

In the case of printing ink formulations to be cured by UV radiation, it is usually necessary to include at least one photoinitiator to initiate the curing reaction of the monomers upon exposure to UV radiation. Examples of useful photoinitiators can be found in standard textbooks such as "Chemistry & Technology of UV & EB Formulation for Coatings, Inks & Paints", Volume III, "Photoinitiators for Free Radical Cationic and Anionic Polymerisation", 2nd edition, by J. V. Crivello & K. Dietliker, edited by G. Bradley and published in 1998 by John Wiley & Sons in association with SITA Technology Limited. It may also be advantageous to include a sensitizer in conjunction with the photoinitiator in order to achieve efficient curing.

The printing ink formulation according to the invention contains in general from 0 to 94.9999% by weight, preferably from 5 to 90% by weight, in particular from 10 to 85% by weight, based on the total weight of the printing ink formulation, of a solvent c).

Suitable solvents are selected from water, organic solvents and mixtures thereof. For the purpose of the invention, reactive monomers which also act as solvents are regarded as part of the afore-mentioned binder component b).

Examples of solvents comprise water; alcohols, e.g. ethanol, 1-propanol, 2-propanol, ethylene glycol, propylene glycol, diethylene glycol and ethoxy propanol; esters, e.g. ethyl acetate, isopropyl acetate, n-propyl acetate and n-butyl acetate; hydrocarbons, e.g. toluene, xylene, mineral oils and vegetable oils, and mixtures thereof.

The printing ink formulation according to the invention may contain an additional colorant d). Preferably, the printing ink formulation contains from 0 to 25% by weight, more preferably from 0.1 to 20% by weight, in particular from 1 to 15% by weight, based on the total weight of the printing ink formulation, of a colorant d).

Suitable colorants d) are selected conventional dyes and in particular conventional pigments. The term "pigment" is used in the context of this invention comprehensively to identify all pigments and fillers, examples being colour pigments, white pigments, and inorganic fillers. These include inorganic white pigments, such as titanium dioxide, preferably in the rutile form, barium sulfate, zinc oxide, zinc sulfide, basic lead carbonate, antimony trioxide, lithopones (zinc sulfide+barium sulfate), or coloured pigments, examples being iron oxides, carbon black, graphite, zinc yellow, zinc green, ultramarine, manganese black, antimony black, manganese violet, Paris blue or Schweinfurt green. Besides the inorganic pigments the printing ink formulation of the invention may also comprise organic colour pigments, examples being sepia, gamboge, Cassel brown, toluidine red, para red, Hansa yellow, indigo, azo dyes, anthraquinonoid and indigoid dyes, and also dioxazine, quinacridone, phthalocyanine, isoindolinone, isoindoline, perylene and metal complex pigments. Also suitable are synthetic white pigments with air inclusions to increase the light scattering, such as the Rhopaque® dispersions. Suitable fillers are, for example, aluminosilicates, such as feldspars, silicates, such as kaolin, talc, mica, magnesite, alkaline earth metal carbonates, such as calcium carbonate, in the form for example of calcite or chalk, magnesium carbonate, dolomite, alkaline earth metal sulfates, such as calcium sulfate, silicon dioxide, etc.

The printing ink formulation according to the invention may contain at least one additive e). Preferably, the printing ink formulation contains from 0 to 25% by weight, more preferably from 0.1 to 20% by weight, in particular from 1 to 15% by weight, based on the total weight of the printing ink formulation, of at least one component e).

Suitable additives (component e)) are selected from plasticizers, waxes, siccatives, antistatic agents, chelators, antioxidants, stabilizers, adhesion promoters, surfactants, flow control agents, defoamers, biocides, thickeners, etc. and combinations thereof. These additives serve in particular for fine adjustment of the application-related properties of the printing ink, examples being adhesion, abrasion resistance, drying rate, or slip.

In particular, the printing ink formulation for security printing according to the invention preferably contains
a) 0.0001 to 25% by weight of at least one compound of the formula (I) or a mixture thereof as defined above;
b) 5 to 75% by weight of at least one polymeric binder,
c) 0 to 94.9999% by weight of at least one solvent,
d) 0 to 25% by weight of at least one colorant, and
e) 0 to 25% by weight of at least one further additive,
wherein the sum of components a) to e) adds up to 100%.

The printing ink formulations according to the invention are advantageously prepared in a conventional manner, for example by mixing the individual components. As mentioned earlier, the fluorescent dye of formula (I) is present in the printing ink formulations in a dissolved or finely divided solid form. Additional colorants may be employed in the printing ink formulation of the invention or in a separate ink formulation. When additional colorants are to be employed in a separate formulation, the time of application of the printing ink formulation according to the invention is usually immaterial. The printing ink formulation according to the invention can for example be applied first and then be overprinted with conventional printing inks. But it is also possible to reverse this sequence or, alternatively, to apply the printing ink formulation according to the invention in a mixture with conventional printing inks. In every case the prints are readable with suitable light sources.

Primers can be applied prior to the printing ink formulation according to the invention. By way of example, the primers are applied in order to improve adhesion to the substrate. It is also possible to apply additional printing lacquers, e.g. in the form of a covering to protect the printed image. Additional printing lacquers may also be applied to serve aesthetic purposes, or serve to control application-related properties. By way of example, suitably formulated additional printing lacquers can be used to influence the roughness of the surface of the substrate, the electrical properties, or the water-vapour-condensation properties. Printing lacquers are usually applied in-line by means of a lacquering system on the printing machine employed for printing the printing ink formulation according to the invention.

The printing ink formulations according to the invention are also suitable for use in multilayer materials. Multilayer materials are e.g. composed of two or more plastics foils, such as polyolefin foils, metal foils, or metallised plastics foils, which are bonded to one another, by way of example, via lamination or with the aid of suitable laminating adhesives. These composites may also comprise other functional layers, such as optically variable layers, odour-barrier layers or water-vapour barriers.

The printing ink formulations according to the present invention are especially suitable for offset, letterpress, gravure and intaglio printing.

When a transparent substrate is used, the type of lamp for exciting the fluorescent dye of formula (I) is generally not critical, i.e. all light sources emitting light at wavelength within the absorption profile of the fluorescent dye of formula (I). For example high or medium pressure mercury lamps are sufficient. Any ultraviolet light source may be employed as a radiation source, such as, a high or low pressure mercury lamp, a black light, an ultraviolet LED, or an ultraviolet laser.

A further object of the present invention is a process for the manufacture of a security document comprising the steps printing on a substrate a printing ink formulation as defined above.

A further object is a security document, comprising a substrate, a cured ink which ink comprises at least one compound of the formula (I) or a mixture thereof as defined above.

A further object is a security document as defined above obtainable by a printing process wherein a printing ink formulation as defined above is employed. The security document is preferably selected from a bank note, a passport, a check, a voucher, an ID- or transaction card, a stamp and a tax label. The security document can also be part of a rigid or flexible packaging, of a carton board or of a brand or product label.

A further object relates to novel compounds of formula (I)

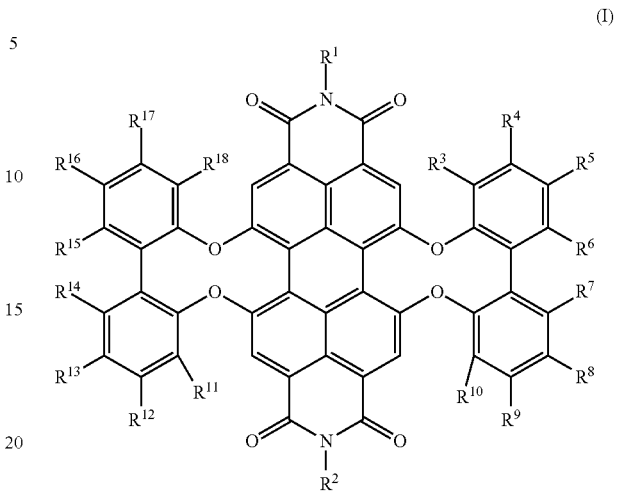

(I)

or a mixture thereof
wherein
$R^1$ and $R^2$, independently of each other, are selected from hydrogen,
in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_2$-cycloalkyloxy, $C_6$-$C_{24}$-aryl and $C_6$-$C_{24}$-aryloxy;
$R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ independently of each other, are selected from hydrogen, halogen, cyano, hydroxyl, mercapto, nitro,
—$NE^1E^2$, —$NR^{Ar1}COR^{Ar2}$, —$CONR^{Ar1}R^{Ar2}$, —$SO_2NR^{Ar1}R^{Ar2}$, —$COOR^{Ar1}1$, —$SO_3R^{Ar2}$,
in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkoxy, $C_6$-$C_{24}$-aryl, $C_6$-$C_{24}$-aryloxy and $C_6$-$C_{24}$-arylthio,
where $R^3$ and $R^4$, $R^4$ and $R^5$, $R^5$ and $R^6$, $R^6$ and $R^7$, $R^7$ and $R^8$, $R^8$ and $R^9$, $R^9$ and $R^{10}$, $R^{10}$ and $R^{11}$, $R^{11}$ and $R^{12}$, $R^{12}$ and $R^{13}$, $R^{13}$ and $R^{14}$, $R^{14}$ and $R^{15}$, $R^{15}$ and $R^{16}$, $R^{16}$ and $R^{17}$ and/or $R^{17}$ and $R^{18}$ together with the carbon atoms of the biphenylyl moiety to which they are bonded, may also form a further fused aromatic or non-aromatic ring system wherein the fused ring system is unsubstituted or substituted;
where
$E^1$ and $E^2$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl;
$R^{Ar1}$ and $R^{Ar2}$, each independently of each, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl;
except for the compound of the formula (I), where $R^1$ and $R^2$ are each n-$C_4H_9$ and $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ are each hydrogen.

Preferably, in the compounds of the formula (I) $R^1$ and $R^2$, independently of each other are selected from $C_1$-$C_{10}$-alkyl, $C_3$-$C_8$-cycloalkyl and $C_6$-$C_{10}$-aryl, wherein the carbon atoms of the aforementioned aliphatic, cycloaliphatic and aromatic radicals may optionally be substituted.

More preferred are compounds of formula (I), wherein $R^1$ and $R^2$, independently of each other are selected from C$_1$-C$_{10}$-alkyl, which is unsubstituted or substituted by C$_6$-C$_{10}$-aryl which in turn is unsubstituted or substituted by 1, 2 or 3 C$_1$-C$_{10}$-alkyl;

C$_3$-C$_8$-cycloalkyl, which is unsubstituted or substituted by 1, 2 or 3 C$_1$-C$_{10}$-alkyl; and C$_6$-C$_0$-aryl which is unsubstituted or substituted by 1, 2 or 3 C$_1$-C$_{10}$-alkyl.

Even more preferred are compounds of formula (I), wherein $R^1$ and $R^2$ are independently from each other selected from the group consisting linear C$_1$-C$_8$-alkyl; branched C$_3$-C$_8$-alkyl; C$_1$-C$_8$-alkyl, which is substituted by C$_6$-C$_{10}$-aryl, in particular phenyl; C$_1$-C$_8$-alkyl, which is substituted by C$_6$-C$_{10}$-aryl which in turn is substituted by 1, 2 or 3 C$_1$-C$_6$-alkyl; C$_3$-C$_8$-cycloalkyl; C$_3$-C$_8$-cycloalkyl which carries 1, 2 or 3 C$_1$-C$_6$-alkyl substituents; C$_6$-C$_{10}$-aryl; and C$_6$-C$_{10}$-aryl which carries 1, 2 or 3 C$_1$-C$_6$-alkyl substituents. In particular, $R^1$ and $R^2$, independently of each other are selected from linear C$_1$-C$_8$-alkyl, branched C$_3$-C$_8$-alkyl, C$_3$-C$_8$-cycloalkyl; C$_3$-C$_8$-cycloalkyl which carries 1, 2 or 3 C$_1$-C$_6$-alkyl substituents; C$_6$-C$_{10}$-aryl; and C$_6$-C$_{10}$-aryl which carries 1, 2 or 3 C$_1$-C$_6$-alkyl substituents Especially, $R^1$ and $R^2$ are independently of each other are selected from methyl, ethyl, n-propyl, n-butyl, n-pentyl, n-hexyl, n-heptyl or n-octyl, isopropyl, sec-butyl, iso-butyl, tert-butyl, isopentyl, 2-pentyl, tert-pentyl, 2-ethylhexyl, cyclopentyl, cyclohexyl, cycloheptyl, 2-methylcyclohexyl, 2,4-dimethylcyclohexyl, 2,6-dimethylcyclohexyl, 2-ethylcyclohexyl, 2,4-diethylcyclohexyl, 2,6-diethylcyclohexyl, 2-isopropylcyclohexyl, 2,4-diisopropylcyclohexyl, 2,6-diisopropylcyclohexyl, phenyl, naphthyl, 2-methylphenyl, 2,4-dimethylphenyl, 2,6-dimethylphenyl, 2-ethylphenyl, 2,4-diethylphenyl, 2,6-diethylphenyl, 2-n-propylphenyl, 2,4-di-n-propylphenyl 2,6-di-(n-propyl)phenyl, 2-isopropylphenyl, 2,4-diisopropylphenyl and 2,6-diisopropylphenyl.

Preferably, $R^1$ and $R^2$ have the same meaning. Especially more preferred are compounds of the formula (I), wherein $R^1$ and $R^2$ are both phenyl, which carries 1, 2 or 3 C$_1$-C$_4$-alkyl substituents, in particular 2 C$_1$-C$_4$-alkyl substituents. If phenyl carries 2 or 3 C$_1$-C$_4$-alkyl substituents, and especially 2, the alkyl substituents have the same meaning. Especially, $R^1$ and $R^2$ are both phenyl which carries 2 C$_1$-C$_4$-alkyl substituents. More especially, $R^1$ and $R^2$ are both phenyl which carries 2 C$_1$-C$_4$-alkyl substituents where the alkyl substituents are located in the 2- and 6-position of the phenyl ring, i.e. adjacent to the carbon atom bound to the imide nitrogen atom.

Preferably, in the compounds of the formula (I), $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$, independently of each other, are selected from hydrogen, halogen, C$_1$-C$_{20}$-alkyl, C$_3$-C$_{20}$-cycloalkyl, C$_3$-C$_{20}$-cycloalkyloxy, C$_6$-C$_{24}$-aryl, C$_6$-C$_{24}$-aryl-C$_1$-C$_{10}$-alkylene, C$_6$-C$_{24}$-aryloxy and C$_6$-C$_{24}$-arylthio, where the aryl moiety of C$_6$-C$_{10}$-aryl, C$_6$-C$_{10}$-aryl-C$_1$-C$_{10}$-alkylene, C$_6$-C$_{10}$-aryloxy and C$_6$-C$_{10}$-arylthio is unsubstituted or substituted by one or more C$_1$-C$_{10}$-alkyl.

More, preferably, in the compounds of the formula (I), $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$, independently of each other, are selected from hydrogen, halogen, C$_1$-C$_{18}$-alkyl, C$_6$-C$_{10}$-aryl, C$_6$-C$_{10}$-aryl-C$_1$-C$_{10}$-alkylene, C$_6$-C$_{10}$-aryloxy and C$_6$-C$_{10}$-arylthio, where the aryl moiety of C$_6$-C$_{10}$-aryl, C$_6$-C$_{10}$-aryl-C$_1$-C$_{10}$-alkylene, C$_6$-C$_{10}$-aryloxy and C$_6$-C$_{10}$-arylthio is unsubstituted or substituted by one or more C$_1$-C$_{10}$-alkyl. Especially, in the compounds of the formula (I), $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$, independently of each other, are selected from hydrogen, fluorine, chlorine, bromine, methyl, ethyl, propyl, 1-methylethyl, 1-methylpropyl, 2-methylpropyl, 1,1-dimethylethyl, pentyl, 1-methylbutyl, 2-methylbutyl, 3-methylbutyl, 2,2-dimethylpropyl, 1-ethylpropyl, hexyl, 1,1-dimethylpropyl, 1,2-dimethylpropyl, 1-methylpentyl, 2-methylpentyl, 3-methylpentyl, 4-methylpentyl, 1,1-dimethylbutyl, 1,2-dimethylbutyl, 1,3-dimethylbutyl, 2,2-dimethylbutyl, 2,3-dimethylbutyl, 3,3-dimethylbutyl, 1-ethylbutyl, 2-ethylbutyl, 1,1,2-trimethylpropyl, 1,2,2-trimethylpropyl, 1-ethyl-1-methylpropyl, 1-ethyl-2-methylpropyl, heptyl, octyl, 2-ethylhexyl, nonyl, decyl, phenyl, naphthyl, benzyl, 1-phenylethyl, 2-phenylethyl, 1-naphthylmethyl, 2-naphthylmethyl, phenyloxy, naphthyloxy, phenylthio and naphthylthio, where the aromatic moiety of the 11 last-mentioned radicals is unsubstituted or substituted by one or more C$_1$-C$_{10}$-alkyl. Even more preferred are compounds of formula (I), wherein $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$, independently of each other, are selected from hydrogen or C$_1$-C$_{18}$-alkyl, especially hydrogen.

Even more preferred are compounds of formula (I), wherein $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$, independently of each other, are selected from hydrogen or C$_1$-C$_{18}$-alkyl, especially hydrogen.

Preferred are also compounds of the formula (I), where $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ in formula (I) independently of each other, are selected from hydrogen, halogen, C$_1$-C$_{18}$-alkyl, C$_6$-C$_{10}$-aryl, C$_6$-C$_{10}$-aryl-C$_1$-C$_{10}$-alkylene, C$_6$-C$_{10}$-aryloxy and C$_6$-C$_{10}$-arylthio, where the aryl moiety of C$_6$-C$_{10}$-aryl, C$_6$-C$_{10}$-aryl-C$_1$-C$_{10}$-alkylene, C$_6$-C$_{10}$-aryloxy and C$_6$-C$_{10}$-arylthio is unsubstituted or substituted by one or more C$_1$-C$_{10}$-alkyl, and in addition $R^4$ and $R^5$, $R^5$ and $R^6$, $R^6$ and $R^7$, $R^7$ and $R^8$, $R^8$ and $R^9$, $R^{12}$ and $R^{13}$, $R^{13}$ and $R^{14}$, $R^{14}$ and $R^{15}$, $R^{15}$ and $R^{16}$, and/or $R^{16}$ and $R^{17}$ together with the carbon atoms of the biphenylyl moiety to which they are bonded, may also form a further fused benzene ring system, wherein the ring system is unsubstituted or carries one or more substituents selected from halogen, cyano, C$_1$-C$_{18}$-alkyl, C$_1$-C$_{18}$-alkoxy or C$_1$-C$_{18}$-alkylthio. If $R^4$ and $R^5$, $R^5$ and $R^6$, $R^6$ and $R^7$, $R^7$ and $R^8$, $R^8$ and $R^9$, $R^{12}$ and $R^{13}$, $R^{13}$ and $R^{14}$, $R^{14}$ and $R^{15}$, $R^{15}$ and $R^{16}$, and/or $R^{16}$ and $R^{17}$ together with the carbon atoms of the biphenylyl moiety to which they are bonded, may also form a further fused benzene ring system, the ring system is preferably unsubstituted. More preferred are compounds of formula (I), wherein $R^5$ and $R^6$, $R^6$ and $R^7$, $R^7$ and $R^8$, $R^{13}$ and $R^{14}$, $R^{14}$ and $R^{15}$, and/or $R^{15}$ and $R^{16}$ together with the carbon atoms of the biphenylyl moiety to which they are bonded, may also be a fused benzene, while the remaining radicals $R^5$, $R^6$, $R^7$, $R^8$, $R^{13}$, $R^{14}$, $R^{15}$ and $R^{16}$, independently of each other, are selected from hydrogen and C$_1$-C$_{18}$-alkyl, $R^4$, $R^9$, $R^{12}$ and $R^{17}$ are selected from hydrogen and C$_1$-C$_{18}$-alkyl and $R^3$, $R^{10}$, $R^{11}$ and $R^{18}$ are each hydrogen. In particular, $R^3$, $R^{10}$, $R^{11}$ and $R^{18}$ are each hydrogen; $R^4$, $R^5$, $R^6$, $R^7$, $R^8$, $R^9$, $R^{12}$, $R^{13}$, $R^{14}$, $R^{15}$, $R^{16}$ and $R^{17}$ are selected from hydrogen and C$_1$-C$_{18}$-alkyl, and in addition $R^5$ and $R^6$, $R^7$ and $R^8$, $R^{13}$ and $R^{14}$, and/or $R^{15}$ and $R^{16}$ together with the carbon atoms of the biphenylyl moiety to which they are bonded, may also be a fused benzene ring system.

In particular, preference is given to the compound of the formula (I), wherein $R^1$ and $R^2$ are each phenyl which carries 1, 2 or 3 $C_1$-$C_4$-alkyl substituents and $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ are all hydrogen.

The following examples illustrate the invention without restricting it.

The following abbreviations are used:

Ex. means example; PC means polycarbonate; CCT means correlated color temperature;

QY means quantum yield; lum. efficacy means photopic luminous efficacy; av. CRI means average color rendering index, calculated from the differences in the chromaticities of 8 CIE standard color samples.

Example 1

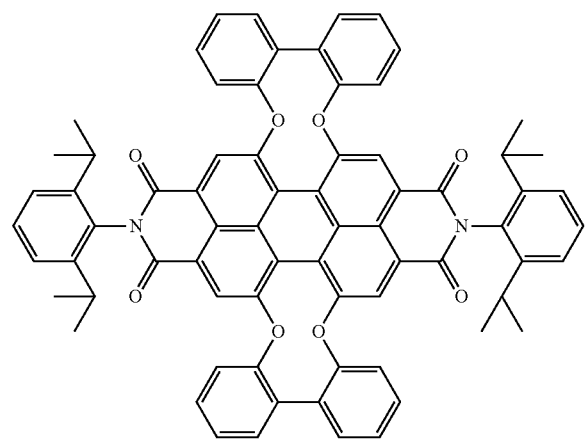 [SMILES: CC(C)c1cccc(C(C)C)c1N1C(=O)c2cc3c4c5c(cc6c7c(cc8c(c9c(cc(c2c49)C1=O)Oc1ccccc1-c1ccccc1O8)c75)C(=O)N(c1c(C(C)C)cccc1C(C)C)C6=O)Oc1ccccc1-c1ccccc1O3]

A mixture of 15 g (17.7 mmol) of N,N'-(2,6-diisopropylphenyl)-1,6,7,12-tetrachloro-perylene-3,4;9,10 diimide, 6.9 g (37.1 mmol) of 2,2'-biphenol, 5.13 g (37.1 mmol) of $K_2CO_3$ und 90 mL of N-Methyl-2-pyrrolidone (NMP) were heated at 110° C. for 21 h and then at 140° C. for 24 h. The reaction mixture was allowed to cool to 80° C. followed by adding 90 mL of acetic acid/water (1/2) within 60 min under stirring (125 rpm) and subsequently stirring over night. The residue was filtered off and washed with a mixture of 90 mL of ethanol and 20 mL of NMP und then with warm water. The residue was dried to give a crude product (16.81 g). Purification by chromatography affords the title compound. $R_f$ (cyclohexane/ethyl acetate 10:1)=0.1.

Materials Used:

Polymer 1: transparent polycarbonate based on a polycondensate of bisphenol A and phosgene (Makrolon® 2805 from Bayer MaterialScience AG)

Polymer 2: transparent polystyrene based on a homopolymer of styrene with a density of 1048 kg/m3 and a Vicat softening temperature of 98° C. to DIN EN ISO 306 (PS 168 N from BASF SE)

Polymer 3: transparent polyethylene terephthalate PET Terez® 3200, from TER Plastics Dye 1: Yellow fluorescent dye Compound of formula (VI-5)

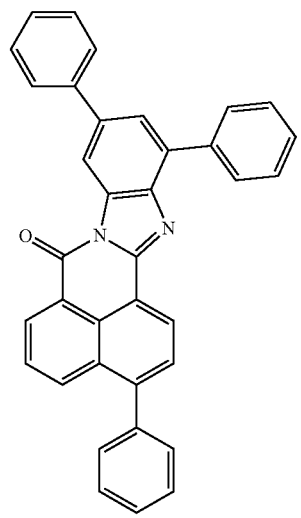

(VI-5)

obtained as described in example 10 of WO 2012/168395, followed by purification with chromatography. The mixture comprising the compound VI-5 was subjected to a further column chromatography to give the pure compound VI-5.

Dye 2: Inventive orange-red fluorescent dye

Compound from example 1

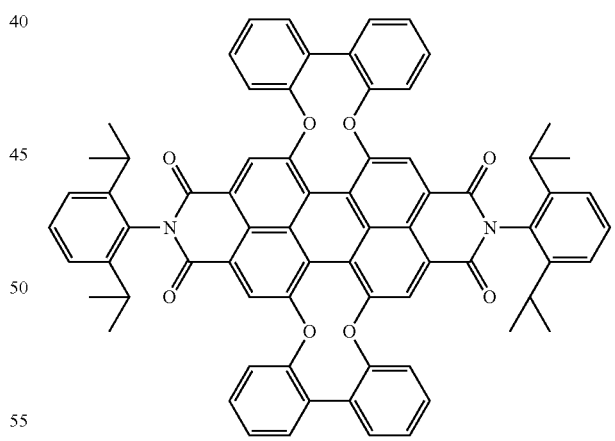

Dye 3: Red-fluorescent dye

N,N'-bis(2,6-diisopropylphenyl)-1,6,7,12-tetraphenoxyperylene-3,4;9,10-tetracarboxylic acid diimide

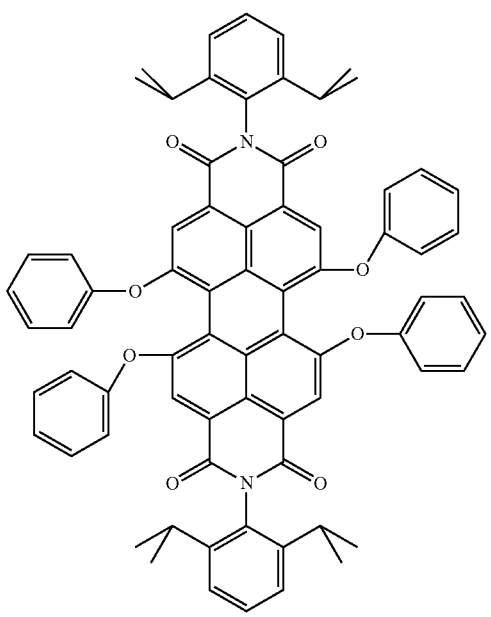 [SMILES: CC(C)c1cccc(C(C)C)c1N1C(=O)c2cc(Oc3ccccc3)c3c4c(Oc5ccccc5)cc5c6c(cc(Oc7ccccc7)c(c7c(Oc8ccccc8)cc(c2c37)C1=O)c64)C(=O)N(c1c(C(C)C)cccc1C(C)C)C5=O]

available from BASF SE.
Titanium dioxide: TiO$_2$ rutile pigment: Kronos® 2233—from Kronos Titan Spectroscopic Measurements The fluorescence spectra and fluorescence quantum yields were recorded using an absolute quantum yield measurement instrument (C9920-02) manufactured by Hamamatsu, and, if necessary, equipped with cuvettes for liquid samples. The spectra were recorded at an excitation wavelength of 450 and 510 nm.

Production of Color Converters:

To produce the converter materials, i.e. polycarbonate, dyes and TiO$_2$ (Kronos 2233) according to the desired concentrations (see Table II), were mixed with methylene chloride. The solution/dispersion obtained was coated onto a glass surface using an applicator frame (wet film thickness 800 μm from Ericsen). After the solvent had dried off, the film was detached from the glass and dried. Circular polymer plates with a diameter of 61.5 mm were obtained.

Characterization of the Lighting Devices:

The light irradiated from the surface of the converter plate was subjected to a photometric measurement, where the total light irradiated from the device was measured by an integral measurement with an Ulbricht sphere, ISP 500-100, and a CAS 140CT-156 CCD detector (from Instrument Systems, Munich). This radiance spectrum was used to derive all relevant photometric data such as CCT (=correlated color temperature) in Kelvin [K], average color rendering index CRI, color rendering index for reference color no. 9 (R9), luminous flux etc.

The optical luminous conversion efficacy for the converter device (in lumen per watt) is calculated from the luminous flux of the output of the device as perceived to the human eye divided by the optical radiance (in Watt) of the blue light which is used for pumping the device.

TABLE II

| Ex. | Polymer | mean thickness | dye 1* | dye 2* | dye 3* | TiO$_2$* | CCT [K] | QY [%] | optical lum. efficacy [lumen/W] |
|---|---|---|---|---|---|---|---|---|---|
| C1 | PC | 130 μm | 0.0902 | — | 0.0062 | 0.80 | 4032 | 84.63 | 192.65 |
| C2 | PC | 135 μm | 0.1298 | — | 0.0090 | 0.80 | 3042 | 80.85 | 183.49 |
| A1 | PC | 137 μm | 0.1097 | 0.01001 | — | 0.80 | 3311 | 81.02 | 225.32 |
| A2 | PC | 136 μm | 0.0891 | 0.00811 | — | 0.80 | 3609 | 81.54 | 221.89 |
| A3 | PC | 133 μm | 0.0800 | 0.00720 | — | 0.80 | 3959 | 82.27 | 225.88 |
| A4 | PC | 131 μm | 0.0782 | 0.00705 | — | 0.80 | 3970 | 82.91 | 224.05 |

*% by weight based on the amount of polymer used

Table II shows that both the inventive color converters (examples A1, A2, A3 and A4) as well as the non-inventive color converters (examples C1 and C2) have good quantum yields. However, color converters comprising the inventive orange-red fluorescent dye 2 of example 1 allow to provide white LEDs with much higher photopic luminous efficacy in comparison to color converters (examples C1 and C2) comprising the red fluorescent dye 3 known from prior art.

TABLE III

| Ex. | Polymer | dye 1* | dye 2* | dye 3* | dye 2:dye 3 | TiO$_2$* | mean thickness | CCT [K] | av. CRI | R9 | QY [%] | optical lum. efficacy [lumen/W] |
|---|---|---|---|---|---|---|---|---|---|---|---|---|
| c3 | PC | 0.1047 | — | 0.006432 | 0:100 | 0.80 | 133 μm | 4072 | 94.79 | 61.56 | 76.69 | 182.58 |
| A5 | PC | 0.0782 | 0.007046 | — | 0:100 | 0.80 | 131 μm | 3970 | 74.33 | -33.35 | 82.91 | 224.05 |
| A6 | PC | 0.0782 | 0.005601 | 0.00140 | 80:20 | 0.80 | 138 μm | 3921 | 79.89 | -9.92 | 83.15 | 216.87 |
| A7 | PC | 0.0787 | 0.005160 | 0.00172 | 75:25 | 0.80 | 142 μm | 3995 | 83.16 | 6.01 | 83.81 | 213.44 |
| A8 | PC | 0.0759 | 0.00330 | 0.0033 | 50:50 | 0.80 | 134 μm | 3939 | 86.42 | 18.28 | 83.34 | 210.61 |
| C4 | PC | 0.1368 | — | 0.0094 | 0:100 | 0.75 | 135 μm | 3066 | 93.60 | 64.69 | 82.20 | 187.60 |
| A9 | PC | 0.1182 | 0.01087 | — | 0:100 | 0.75 | 131 μm | 3184 | 70.14 | -50.64 | 81.40 | 226.62 |
| A10 | PC | 0.1184 | 0.007644 | 0.00328 | 80:20 | 0.80 | 134 μm | 2959 | 83.27 | 0.50 | 82.01 | 204.48 |

TABLE III-continued

| Ex. | Polymer | dye 1* | dye 2* | dye 3* | dye 2:dye 3 | $TiO_2$* | mean thickness | CCT [K] | av. CRI | R9 | QY [%] | optical lum. efficacy [lumen/W] |
|---|---|---|---|---|---|---|---|---|---|---|---|---|
| A11 | PC | 0.1200 | 0.008150 | 0.00272 | 75:25 | 0.80 | 136 µm | 3080 | 82.22 | −2.21 | 82.44 | 208.10 |
| A12 | PC | 0.1222 | 0.00538 | 0.00538 | 50:50 | 0.75 | 134 µm | 2941 | 89.18 | 20.45 | 81.45 | 199.17 |

*% by weight based on the amount of polymer used

Table III shows that a mixture of the orange-red fluorescent dye 2 of example 1 according to the invention, the prior art red fluorescent dye 3 and the prior art yellow fluorescent dye allow to make converters having a good average color rendering index, a good $R^9$ value as well as a high photopic luminous conversion efficacy. It is evident that the admixture of the inventive dye improves the overall property profile of converters.

The invention claimed is:

1. A color converter comprising in a polymeric matrix material a fluorescent dye,
wherein the fluorescent dye is a perylene bisimide compound of formula (I):

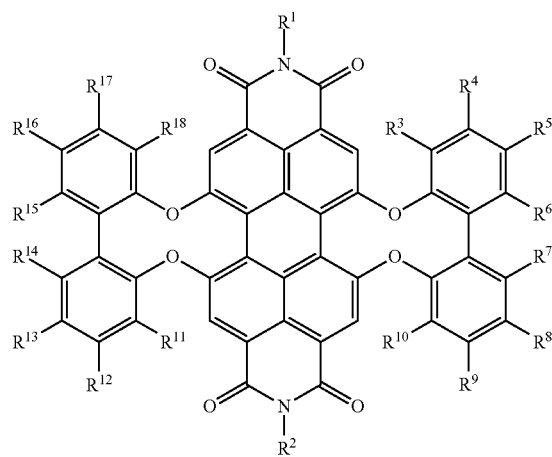

or a mixture thereof,
wherein
$R^1$ and $R^2$, independently of each other, are selected from the group consisting of hydrogen, in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkyloxy, $C_6$-$C_{24}$-aryl and $C_6$-$C_{24}$-aryloxy; and
$R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ independently of each other, are selected from the group consisting of hydrogen, halogen, cyano, hydroxyl, mercapto, nitro, —$NE^1E^2$, —$NR^{Ar1}COR^{Ar2}$, —$CONR^{Ar1}R^{Ar2}$, —$SO_2NR^{Ar1}R^{Ar2}$, —$COOR^{Ar1}$, —$SO_3R^{Ar2}$, in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkyloxy, $C_6$-$C_{24}$-aryl, $C_6$-$C_{24}$-aryloxy and $C_6$-$C_{24}$-arylthio,
wherein $R^3$ and $R^4$, $R^4$ and $R^5$, $R^5$ and $R^6$, $R^6$ and $R^7$, $R^7$ and $R^8$, $R^8$ and $R^9$, $R^9$ and $R^{10}$, $R^{11}$ and $R^{12}$, $R^{12}$ and $R^{13}$, $R^{13}$ and $R^{14}$, $R^{14}$ and $R^{15}$, $R^{15}$ and $R^{16}$, $R^{16}$ and $R^{17}$ and/or $R^{17}$ and $R^{18}$ together with the carbon atoms of the biphenylyl moiety to which they are bonded, also optionally form a further fused aromatic or non-aromatic ring system wherein the fused ring system is unsubstituted or substituted;
$E^1$ and $E^2$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl; and
$R^{Ar1}$ and $R^{Ar2}$, each independently of each, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl.

2. The color converter as claimed in claim 1,
wherein $R^1$ and $R^2$ independently of each other are selected from the group consisting of $C_1$-$C_{10}$-alkyl, which is unsubstituted or substituted by $C_6$-$C_{10}$-aryl which in turn is unsubstituted or substituted by 1, 2 or 3 $C_1$-$C_{10}$-alkyl, $C_3$-$C_8$-cycloalkyl, which is unsubstituted or substituted by 1, 2 or 3 $C_1$-$C_{10}$-alkyl, and $C_6$-$C_{10}$-aryl which is unsubstituted or substituted by 1, 2 or 3 $C_1$-$C_{10}$-alkyl.

3. The color converter as claimed in claim 1,
wherein $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ independently of each other, are selected from the group consisting of hydrogen, halogen, $C_1$-$C_{18}$-alkyl, $C_6$-$C_{10}$-aryl, $C_6$-$C_{10}$-aryl-$C_1$-$C_{10}$-alkylene, $C_6$-$C_{10}$-aryloxy and $C_6$-$C_{10}$-arylthio, wherein the aryl moiety of $C_6$-$C_{10}$-aryl, $C_6$-$C_{10}$-aryl-$C_1$-$C_{10}$-alkylene, $C_6$-$C_{10}$-aryloxy and $C_6$-$C_{10}$-arylthio is unsubstituted or substituted by one or more $C_1$-$C_{10}$-alkyl, and in addition $R^4$ and $R^5$, $R^5$ and $R^6$, $R^6$ and $R^7$, $R^7$ and $R^8$, $R^8$ and $R^9$, $R^{12}$ and $R^{13}$, $R^{13}$ and $R^{14}$, $R^{14}$ and $R^{15}$, $R^{15}$ and $R^{16}$, and/or $R^{16}$ and $R^{17}$ together with the carbon atoms of the biphenylyl moiety to which they are bonded, also optionally form a further fused benzene ring system.

4. The color converter as claimed in claim 1,
wherein $R^3$, $R^{10}$, $R^{11}$ and $R^{18}$ are each hydrogen and $R^4$, $R^5$, $R^6$, $R^7$, $R^8$, $R^9$, $R^{12}$, $R^{13}$, $R^{14}$, $R^{15}$, $R^{16}$ and $R^{17}$ independently of each other, are selected from the group consisting of hydrogen and $C_1$-$C_{18}$-alkyl, and in addition $R^5$ and $R^6$, $R^6$ and $R^7$, $R^7$ and $R^8$, $R^{13}$ and $R^{14}$, $R^{14}$ and $R^{15}$, and/or $R^{15}$ and $R^{16}$ together with the carbon atoms of the biphenylyl moiety to which they are bonded, are also optionally a benzene ring system.

5. The color converter as claimed in claim 1,
wherein the polymeric matrix material consists essentially of at least one polymer selected from the group consisting of polystyrene, polycarbonate, polymethylmethacrylate, polyvinylpyrrolidone, polymethacrylate, polyvinyl acetate, polyvinyl chloride, polybutene, silicone, polyacrylate, epoxy resin, polyvinyl alcohol, poly(ethylene vinylalcohol)-copolymer, polyacrylonitrile, polyvinylidene chloride, polystyrene acrylonitrile, polybutylene terephthalate, polyethylene terephthalate, polyvinyl butyrate, polyvinyl chloride, a polyamide, a polyoxymethylene, a polyimide, and a polyetherimide.

6. The color converter as claimed in claim 1, wherein the color converter additionally comprises an inorganic white pigment as a scattering body.

7. The color converter as claimed in claim 1, comprising at least one additional organic fluorescent dye selected from the group consisting of
(i) a cyanated naphthalene benzimidazole compound of formula II:

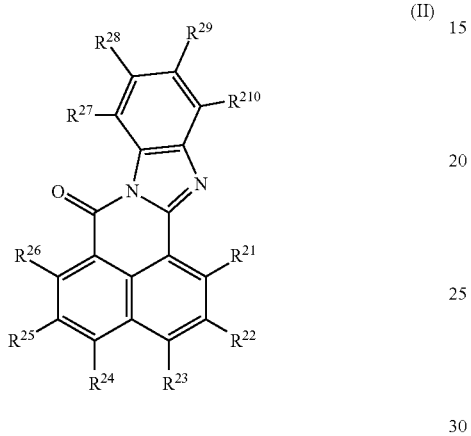

wherein
$R^{21}$, $R^{22}$, $R^{23}$, $R^{24}$, $R^{25}$, $R^{26}$, $R^{27}$, $R^{28}$, $R^{29}$ and $R^{210}$ are each independently hydrogen, cyano or aryl which is unsubstituted or has one or more identical or different substituents $R^{2Ar}$,
wherein each $R^{2Ar}$ is independently selected from the group consisting of cyano, hydroxyl, mercapto, halogen, $C_1$-$C_{20}$-alkoxy, $C_1$-$C_{20}$-alkylthio, nitro, —NR$^{2Ar2}$R$^{2Ar3}$, —NR$^{2Ar2}$COR$^{2Ar3}$, —CONR$^{2Ar2}$R$^{2Ar3}$, —SO$_2$NR$^{2Ar2}$R$^{2Ar3}$, —COOR$^{2Ar2}$, —SO$_3$R$^{2Ar2}$, $C_1$-$C_{30}$-alkyl, $C_2$-$C_{30}$-alkenyl, $C_2$-$C_{30}$-alkynyl, wherein the three latter radicals are unsubstituted or bear one or more $R^{2a}$ groups, $C_3$-$C_8$-cycloalkyl, 3- to 8-membered heterocyclyl, wherein the two latter radicals are unsubstituted or bear one or more $R^{2b}$ groups, aryl, U-aryl, heteroaryl and U-heteroaryl, wherein the four latter radicals are unsubstituted or bear one or more $R^{2b}$ groups,
each $R^{2a}$ is independently selected from the group consisting of cyano, hydroxyl, oxo, mercapto, halogen, $C_1$-$C_{20}$-alkoxy, $C_1$-$C_{20}$-alkylthio, nitro, —NR$^{2Ar2}$R$^{Ar3}$, —NR$^{2Ar2}$COR$^{2Ar3}$, —CONR$^{2Ar2}$R$^{Ar3}$, —SO$_2$NR$^{2Ar2}$R$^{Ar3}$, —COOR$^{2Ar2}$, —SO$_3$R$^{2Ar2}$, $C_3$-$C_8$-cycloalkyl, 3- to 8-membered heterocyclyl, aryl and heteroaryl, wherein the cycloalkyl, heterocyclyl, aryl and heteroaryl radicals are unsubstituted or bear one or more $R^{2b}$ groups;
each $R^{2b}$ is independently selected from the group consisting of cyano, hydroxyl, oxo, mercapto, halogen, $C_1$-$C_{20}$-alkoxy, $C_1$-$C_{20}$-alkylthio, nitro, —NR$^{2Ar2}$R$^{2Ar3}$, —NR$^{2Ar2}$COR$^{2Ar3}$, —CONR$^{2Ar2}$R$^{2Ar3}$, —SO$_2$NR$^{2Ar2}$R$^{2Ar3}$, —COOR$^{2Ar2}$, —SO$_3$R$^{2Ar2}$, $C_1$-$C_{18}$-alkyl, $C_2$-$C_{18}$-alkenyl, $C_2$-$C_{18}$-alkynyl, $C_3$-$C_8$-cycloalkyl, 3- to 8-membered heterocyclyl, aryl and heteroaryl, wherein the four latter radicals are unsubstituted or bear one or more $R^{2b1}$ groups,
each $R^{2b1}$ is independently selected from the group consisting of cyano, hydroxyl, mercapto, oxo, nitro, halogen, —NR$^{2Ar2}$R$^{2Ar3}$, —NR$^{2Ar2}$COR$^{2Ar3}$, —CONR$^{2Ar2}$R$^{2Ar3}$, —SO$_2$NR$^{2Ar2}$R$^{2Ar3}$, —COOR$^{2Ar2}$, —SO$_3$R$^{2Ar2}$, —SO$_3$R$^{2Ar2}$, $C_{1-18}$-alkyl, $C_2$-$C_{18}$-alkenyl, $C_2$-$C_{18}$-alkynyl, $C_1$-$C_{12}$-alkoxy, and $C_1$-$C_{12}$-alkylthio,
U is an —O—, —S—, —NR$^{2Ar1}$—, —CO—, —SO— or —SO$_2$— moiety;
$R^{2Ar1}$, $R^{2Ar2}$ and $R^{2Ar3}$ are each independently hydrogen, $C_1$-$C_{18}$-alkyl, 3- to 8-membered cycloalkyl, 3- to 8-membered heterocyclyl, aryl or heteroaryl, wherein alkyl is unsubstituted or bears one or more $R^{2a}$ groups, wherein 3- to 8-membered cycloalkyl, 3- to 8-membered heterocyclyl, aryl and heteroaryl are unsubstituted or bear one or more $R^{2b}$ groups; and
wherein the cyanated naphthalene benzimidazole compound of formula II comprises a cyano group,
or mixtures thereof;
(ii) a cyanated perylene compound of formula (III):

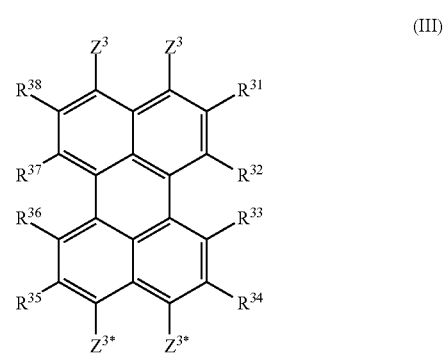

wherein
one of the $Z^3$ substituents is cyano and the other $Z^3$ substituent is $CO_2R^{39}$, $CONR^{310}R^{311}$, $C_1$-$C_{18}$-alkyl, $C_2$-$C_{18}$-alkenyl, $C_2$-$C_{18}$-alkynyl, $C_3$-$C_{12}$-cycloalkyl or $C_6$-$C_{14}$-aryl, wherein $C_1$-$C_{18}$-alkyl, $C_2$-$C_{18}$-alkenyl, $C_2$-$C_{18}$-alkynyl are unsubstituted or bear one or more identical or different $Z^{3a}$ substituents, $C_3$-$C_{12}$-cycloalkyl is unsubstituted or bears one or more identical or different $Z^{3b}$ substituents, and $C_6$-$C_{14}$-aryl is unsubstituted or bears one or more identical or different $Z^{3Ar}$ substituents;
one of the $Z^{3*}$ substituents is cyano and the other $Z^{3*}$ substituent is $CO_2R^{39}$, $CONR^{310}R^{311}$, $C_1$-$C_{18}$-alkyl, $C_2$-$C_{18}$-alkenyl, $C_2$-$C_{18}$-alkynyl, $C_3$-$C_{12}$-cycloalkyl or $C_6$-$C_{14}$-aryl, wherein $C_1$-$C_{18}$-alkyl, $C_2$-$C_{18}$-alkenyl, $C_2$-$C_{18}$-alkynyl are unsubstituted or bear one or more identical or different $Z^{3a}$ substituents, $C_3$-$C_{12}$-cycloalkyl is unsubstituted or bears one or more identical or different $Z^{3b}$ substituents, and $C_6$-$C_{14}$-aryl is unsubstituted or bears one or more identical or different $Z^{3Ar}$ substituents; and
$R^{31}$, $R^{32}$, $R^{33}$, $R^{34}$, $R^{35}$, $R^{36}$, $R^{37}$ and $R^{38}$ are each independently selected from the group consisting of hydrogen, cyano, bromine and chlorine, wherein 1, 2, 3, 4, 5, 6, 7 or 8 of the $R^{31}$, $R^{32}$, $R^{33}$, $R^{34}$, $R^{35}$, $R^{36}$, $R^{37}$ or $R^{38}$ substituents are cyano;
wherein
$R^{39}$ is hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl, wherein $C_1$-$C_{10}$-alkyl, $C_2$-$C_{10}$-alkenyl, $C_2$-$C_{10}$-alkynyl are unsubstituted or bear one or more identical or different $R^{3a}$ substituents, $C_3$-$C_{12}$-cycloalkyl is unsubstituted or bears one or more identical or different $R^{3b}$ substituents and $C_6$-$C_{14}$-aryl is unsubstituted or bears one or more identical or different $R^{3Ar}$ substituents;

$R^{310}$ and $R^{311}$ are each independently hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl, wherein $C_1$-$C_{10}$-alkyl, $C_2$-$C_{10}$-alkenyl, $C_2$-$C_{10}$-alkynyl are unsubstituted or bear one or more identical or different $R^{3a}$ substituents, $C_3$-$C_{12}$-cycloalkyl is unsubstituted or bears one or more identical or different $R^{3b}$ substituents and $C_6$-$C_{14}$-aryl is unsubstituted or bears one or more identical or different $R^{3Ar}$ substituents;

each $Z^{3a}$ is independently halogen, hydroxyl, $NR^{310a}R^{311a}$, $C_1$-$C_{10}$-alkoxy, $C_1$-$C_{10}$-haloalkoxy, $C_1$-$C_{10}$-alkylthio, $C_3$-$C_{12}$-cycloalkyl, $C_6$-$C_{14}$-aryl, $C(=O)R^{39a}$; $C(=O)OR^{39}a$ or $C(O)NR^{310a}R^{311a}$, wherein $C_3$-$C_{12}$-cycloalkyl is unsubstituted or bears one or more identical or different $R^{3b}$ substituents and $C_6$-$C_{14}$-aryl is unsubstituted or bears one or more identical or different $R^{3Ar}$ substituents;

each $Z^{3b}$ and each $Z^{3Ar}$ is independently halogen, hydroxyl, $NR^{310a}R^{311a}$, $C_1$-$C_{10}$-alkyl, $C_1$-$C_{10}$-haloalkoxy, $C_1$-$C_{10}$-alkylthio, $C(=O)R^{39a}$; $C(=O)OR^{39a}$ or $C(O)NR^{310a}R^{311a}$;

each $R^{3a}$ is independently halogen, hydroxyl, $C_1$-$C_{10}$-alkoxy, $C_3$-$C_{12}$-cycloalkyl or $C_6$-$C_{14}$-aryl;

each $R^{3b}$ is independently halogen, hydroxyl, $C_1$-$C_{10}$-alkyl, $C_1$-$C_{10}$-alkoxy, $C_1$-$C_{10}$-haloalkoxy, $C_1$-$C_{10}$-alkylthio, $C_2$-$C_{10}$-alkenyl, $C_2$-$C_{10}$-alkynyl, $C_3$-$C_{12}$-cycloalkyl or $C_6$-$C_{14}$-aryl;

each $R^{3Ar}$ is independently halogen, hydroxyl, $C_1$-$C_{10}$-alkyl, $C_1$-$C_{10}$-alkoxy, $C_1$-$C_{10}$-haloalkoxy, $C_1$-$C_{10}$-alkylthio, $C_2$-$C_{10}$-alkenyl, $C_2$-$C_{10}$-alkynyl, $C_3$-$C_{12}$-cycloalkyl or $C_6$-$C_{14}$-aryl;

$R^{39a}$ is hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl; and $R^{310a}$, $R^{311a}$ are each independently hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl, and mixtures thereof (iii) a cyanated compound of formula (IV):

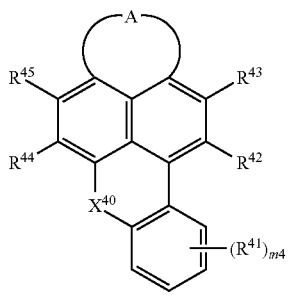

(IV)

wherein m4 is 0, 1, 2, 3 or 4;

each $R^{41}$ independently from each other is selected from the group consisting of bromine, chlorine, cyano, $-NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy $C_3$-$C_{24}$-cycloalkyl, heterocycloalkyl, heteroaryl, $C_6$-$C_{24}$-aryl, $C_6$-$C_{24}$-aryloxy, $C_6$-$C_{24}$-aryl-$C_1$-$C_{10}$-alkylene, wherein the rings of cycloalkyl, heterocycloalkyl, heteroaryl, aryl, aryloxy in the six last-mentioned radicals are unsubstituted or substituted with 1, 2, 3, 4 or 5 identical or different radicals $R^{41a}$ and wherein $C_1$-$C_{24}$-alkyl, $C_1$-$C_{24}$-haloalkyl, $C_1$-$C_{24}$-alkoxy, and the alkylene moiety of $C_6$-$C_{24}$-aryl-$C_1$-$C_{10}$-alkylene are optionally interrupted by one or more groups selected from the group consisting of O, S and $NR^{4c}$;

at least one of the radicals $R^{42}$, $R^{43}$, $R^{44}$ and $R^{45}$ is CN, and the remaining radicals, independently from each other, are selected from the group consisting of hydrogen, chlorine and bromine;

$X^{40}$ is O, S, SO or $SO_2$;

A is a diradical selected from the group consisting of diradicals of formulae (A.1), (A.2), (A.3), and (A.4)

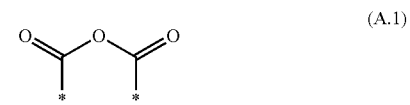
(A.1)

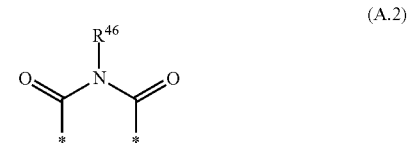
(A.2)

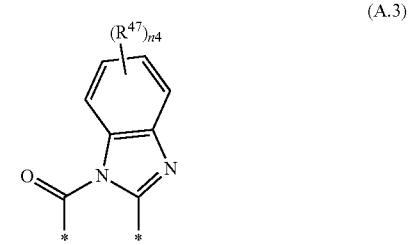
(A.3)

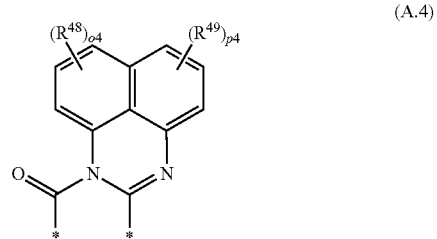
(A.4)

wherein

* in each case denotes the point of attachments to the remainder of the molecule;

n4 is 0, 1, 2, 3 or 4;

o4 is 0, 1, 2 or 3;

p4 is 0, 1, 2 or 3;

$R^{46}$ is hydrogen, $C_1$-$C_{24}$-alkyl, $C_1$-$C_{24}$-haloalkyl, $C_3$-$C_{24}$-cycloalkyl, $C_6$-$C_{24}$-aryl or $C_6$-$C_{24}$-aryl-$C_1$-$C_{10}$-alkylene, wherein the rings of cycloalkyl, aryl, and aryl-alkylene in the three last-mentioned radicals are unsubstituted or substituted with 1, 2, 3, 4 or 5 identical or different radicals $R^{46a}$, and wherein $C_1$-$C_{24}$-alkyl, $C_1$-$C_{24}$-haloalkyl and the alkylene moiety of $C_6$-$C_{24}$-aryl-$C_1$-$C_{10}$-alkylene are optionally interrupted by one or more heteroatoms or heteroatomic groups selected from the group consisting of O, S and $NR^{4c}$;

each $R^{47}$ independently from each other is selected from the group consisting of bromine, chlorine, cyano, $-NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_{6-24}$-aryloxy, $C_6$-$C_{24}$-aryl-$C_1$-$C_{10}$-alkylene, wherein the rings of cycloalkyl, heterocycloalkyl, heteroaryl, aryl and aryl-alkylene in the six last-mentioned radicals are unsubstituted or substituted with 1, 2, 3, 4 or 5 identical or different radicals $R^{47a}$ and wherein $C_1$-$C_{24}$-alkyl, $C_1$-$C_{24}$-haloalkyl, $C_1$-$C_{24}$-alkoxy, $C_1$-$C_{24}$-haloalkoxy and the alkylene moiety of $C_6$-$C_{24}$-aryl-$C_1$-$C_{10}$-alkylene are optionally interrupted by one or more groups selected from the group consisting of O, S and $NR^{4c}$, each $R^{48}$ independently from each other is selected from the group consisting of bromine, chlorine, cyano, $NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy, and $C_6$-$C_{24}$-aryl-$C_1$-$C_{10}$-alkylene, wherein the rings of cycloalkyl, heterocycloalkyl, heteroaryl, aryl and aryl-alkylene in the six last-mentioned radicals are unsubstituted or substituted with 1, 2, 3, 4 or 5 identical or different radicals $R^{48a}$ and wherein $C_1$-$C_{24}$-alkyl, $C_1$-$C_{24}$-haloalkyl, $C_1$-$C_{24}$-alkoxy, $C_1$-$C_{24}$-haloalkoxy and the alkylene moiety of $C_6$-$C_{24}$-aryl-$C_1$-$C_{10}$-alkylene are optionally interrupted by one or more groups selected from the group consisting of O, S and $NR^{4c}$, each $R^{49}$ independently from each other is selected from the group consisting of bromine, chlorine, cyano, $NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy, and $C_6$-$C_{24}$-aryl-$C_1$-$C_{10}$-alkylene, wherein the rings of cycloalkyl, heterocycloalkyl, heteroaryl, aryl and aryl-alkylene in the six last-mentioned radicals are unsubstituted or substituted with 1, 2, 3, 4 or 5 identical or different radicals $R^{49a}$ and wherein $C_1$-$C_{24}$-alkyl, $C_1$-$C_{24}$-haloalkyl, $C_1$-$C_{24}$-alkoxy, $C_1$-$C_{24}$-haloalkoxy, and the alkylene moiety of $C_6$-$C_{24}$-aryl-$C_1$-$C_{10}$-alkylene are optionally interrupted by one or more groups selected from the group consisting of O, S and $NR^{4c}$, $R^{41a}$, $R^{46a}$, $R^{47a}$, $R^{48a}$, $R^{49a}$ are independently of one another selected from the group consisting of $C_1$-$C_{24}$-alkyl, $C_1$-$C_{24}$-fluoroalkyl, $C_1$-$C_{24}$-alkoxy, fluorine, chlorine and bromine;

$R^{4a}$, $R^{4b}$, $R^{4c}$ are independently of one another are selected from the group consisting of hydrogen, $C_1$-$C_{20}$-alkyl, $C_3$-$C_{24}$-cycloalkyl, heterocycloalkyl, heteroaryl and $C_6$-$C_{24}$-aryl;

and mixtures thereof;

(iv) a benzoxanthene compound of formula (V):

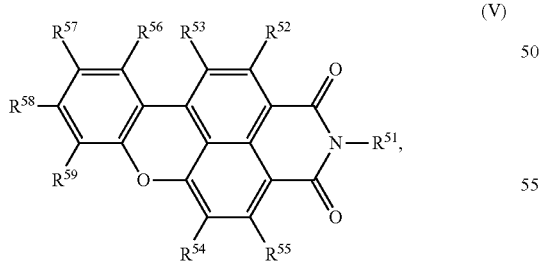

wherein $R^{51}$ is phenyl which is unsubstituted or carries 1, 2, 3, 4, or 5 substituents selected from the group consisting of halogen, $R^{511}$, $OR^{552}$, $NHR^{552}$ and $NR^{552}R^{557}$; and $R^{52}$, $R^{53}$, $R^{54}$, $R^{55}$, $R^{56}$, $R^{57}$, $R^{58}$ and $R^{59}$ are independently of each other selected from the group consisting of hydrogen, halogen, $R^{553}$, $OR^{553}$, $NHR^{553}$ and $NR^{553}R^{554}$, and wherein $R^{511}$ is selected from the group consisting of $C_2$-$C_{18}$-alkyl, $C_6$-$C_{24}$-aryl and heteroaryl;

$R^{552}$ and $R^{557}$ are independently of each other selected from the group consisting of $C_6$-$C_{24}$-aryl and heteroaryl; and $R^{553}$ and $R^{554}$ are independently of each other selected from the group consisting of $C_6$-$C_{24}$-aryl and heteroaryl;

and mixtures thereof;

(v) a fluorescent compound comprising a structural unit of formula (VI):

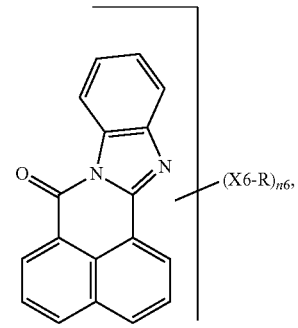

wherein one or more CH groups of the six-membered ring of the benzimidazole structure shown are optionally replaced by nitrogen and wherein n6 is a number from 0 to (10-p6) for each structural unit of formula (VI); wherein p6 is the number of CH units which have been replaced by nitrogen in the six-membered ring of the benzimidazole structure shown X6 is a chemical bond, O, S, SO, $SO_2$, $NR^{61}$; and R is an aliphatic radical, cycloaliphatic radical, aryl, heteroaryl, each of which optionally bears substituents, an aromatic or heteroaromatic ring or ring system, each of which is fused to other aromatic rings of the structural unit of formula (VI) is F, Cl, Br, CN, H when X6 is not a chemical bond;

R radicals are optionally joined to give one cyclic radical and

X6 and R, when n6>one, are the same or different;

$R^{61}$ is each independently hydrogen, $C_1$-$C_{18}$-alkyl or cycloalkyl, the carbon chain of which optionally comprises one or more —O—, —S—, —CO—, —SO— and/or —$SO_2$— moieties and which is optionally mono- or polysubstituted;

aryl or heteroaryl which is optionally mono- or polysubstituted;

and mixtures thereof;

and (vi) a perylene compound of formulae (VII), (VIII) or (IX):

(VII)

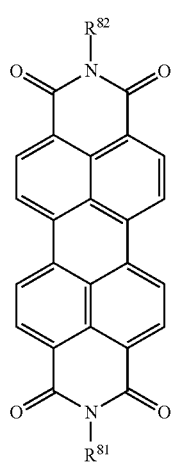

(VIII)

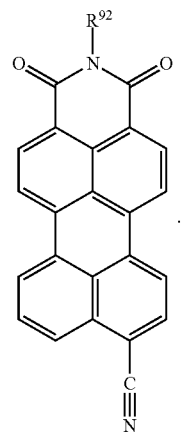

(IX)

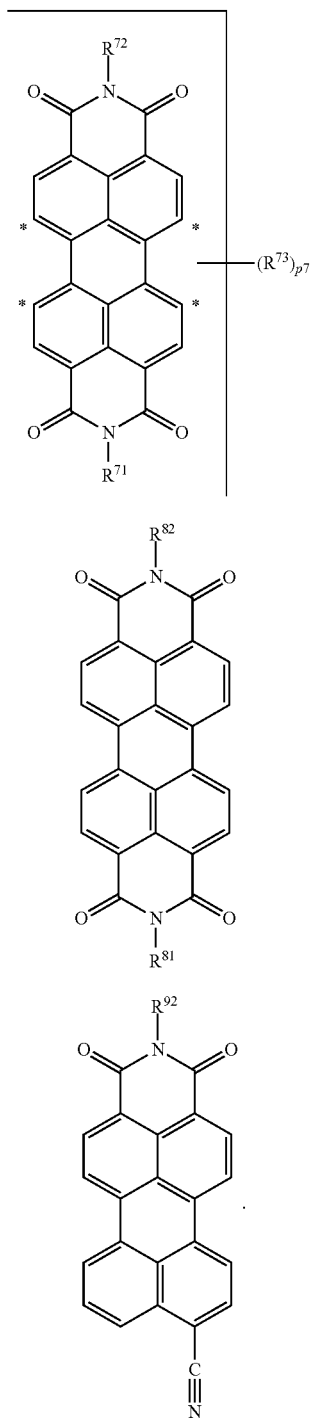

wherein p7 is 1 to 4, $R^{71}$ and $R^{72}$ are each independently $C_1$-$C_{30}$-alkyl, $C_3$-$C_8$-cycloalkyl, aryl, heteroaryl, aryl-$C_1$-$C_{10}$-alkylene, wherein the aromatic ring in the three latter radicals is unsubstituted or mono- or polysubstituted by $C_1$-$C_{10}$-alkyl;

each $R^{73}$ is independently aryloxy which is unsubstituted or mono- or polysubstituted by $C_1$-$C_{10}$-alkyl, wherein the $R^{73}$ radicals are at one or more of the positions indicated by *;

$R^{81}$ and $R^{82}$ are each independently $C_1$-$C_{30}$-alkyl, $C_3$-$C_8$-cycloalkyl, aryl, heteroaryl, aryl-$C_1$-$C_{10}$-alkylene, wherein the aromatic ring in the three latter radicals is unsubstituted or mono- or polysubstituted by $C_1$-$C_{10}$-alkyl;

$R^{92}$ is $C_1$-$C_{30}$-alkyl, $C_3$-$C_8$-cycloalkyl, aryl, heteroaryl, aryl-$C_1$-$C_{10}$-alkylene, wherein the aromatic ring in the three latter radicals is unsubstituted or mono- or polysubstituted by $C_1$-$C_{10}$-alkyl;

and mixtures thereof.

8. The color converter as claimed in claim 7, wherein the at least one additional organic fluorescent dye is at least one selected from the group consisting of the compound comprising the structural unit of formula (VI); and the compound of formula (VII).

9. The color converter as claimed in claim 1, comprising the one compound of formula (I), wherein $R^1$ and $R^2$ are, independently of each other, selected from phenyl which is unsubstituted or substituted by 1, 2 or 3 $C_1$-$C_4$-alkyl; and $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ are each hydrogen;

a compound comprising at least one structural unit of formula (VI) selected from the group consisting of compounds of formulae (VI-5), (VI-6), (VI-7), (VI-8):

(VI-5)

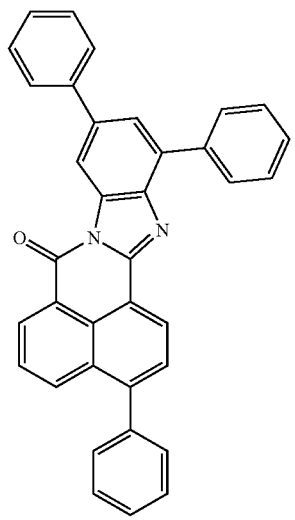

-continued (VI-6)

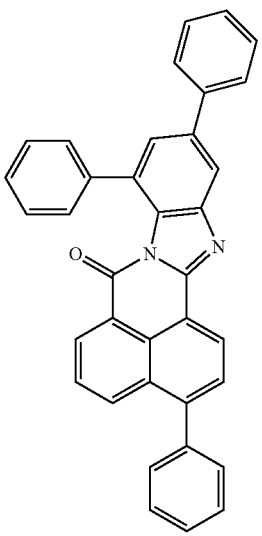

(VI-7)

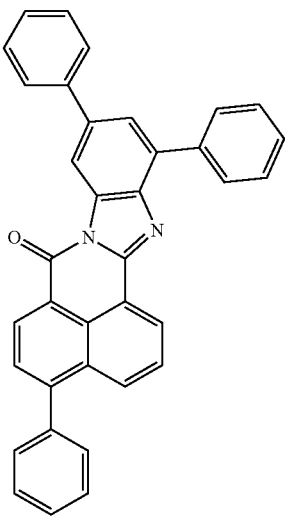

(VI-8)

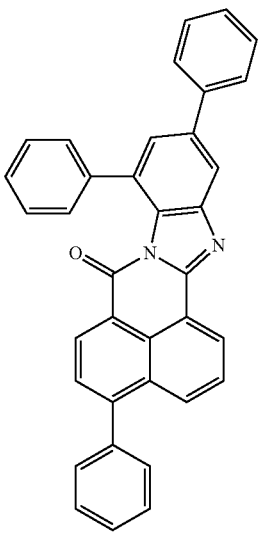

and
a compound of formula (VII) selected from the group consisting of compounds of formula (VII-3):

(VII-3)

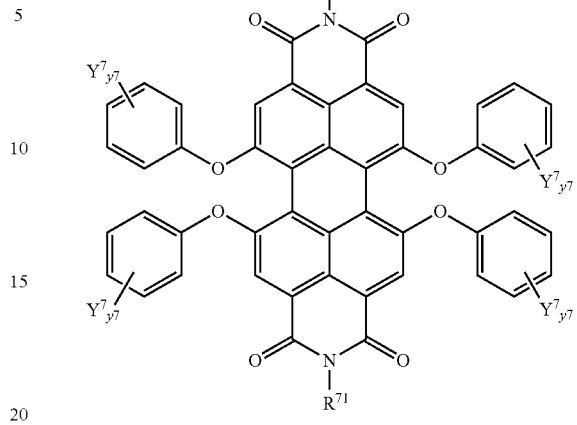

wherein
$R^{71}$ and $R^{72}$ are each independently phenyl, which is unsubstituted or mono- or polysubstituted by $C_1$-$C_{10}$-alkyl;
each $Y^7$ is independently selected from the group consisting of linear $C_1$-$C_{10}$-alkyl and branched $C_3$-$C_{10}$-alkyl; and
$y^7$ is 0, 1, 2 or 3.

10. The color converter as claimed in claim 1, comprising at least one additional fluorescent material selected from the group consisting of a garnet, a silicate, a sulfide, a nitride and an oxynitride and a quantum dot.

11. A method for color conversion of light generated by LEDs or OLEDs, the method comprising:
   color-converting the light generated by LEDs or OLEDs with the color converter as claimed in claim 1.

12. A lighting device comprising:
   an LED and
   the color converter as claimed in claim 1.

13. A compound of formula (I):

(I)

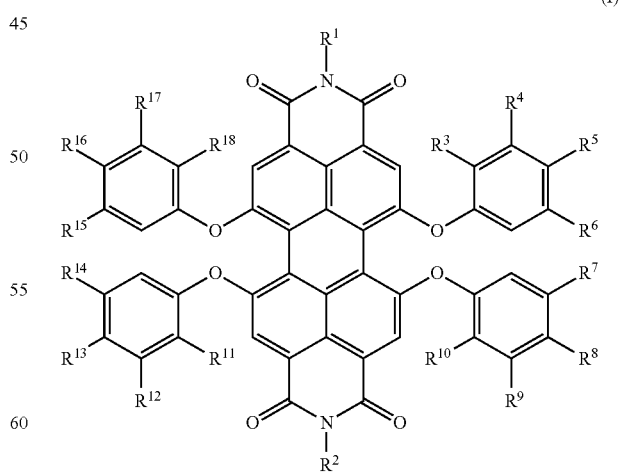

or a mixture thereof,
wherein
$R^1$ and $R^2$, independently of each other, are selected from the group consisting of hydrogen, in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkyloxy, $C_6$-$C_{24}$-aryl and $C_6$-$C_{24}$-aryloxy; and $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ independently of each other, are selected from the group consisting of hydrogen, halogen, cyano, hydroxyl, mercapto, nitro, —$NE^1E^2$, —$NR^{Ar1}COR^{Ar2}$, —$CONR^{Ar1}R^{Ar2}$, —$SO_2NR^{Ar1}R^{Ar2}$, —$COOR^{Ar1}$, —$SO_3R^{Ar2}$, in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkoxy, $C_6$-$C_{24}$-aryl, $C_6$-$C_{24}$-aryloxy and $C_6$-$C_{24}$-arylthio, wherein $R^3$ and $R^4$, $R^4$ and $R^5$, $R^5$ and $R^6$, $R^6$ and $R^7$, $R^7$ and $R^8$, $R^8$ and $R^9$, $R^9$ and $R^{10}$, $R^{11}$ and $R^{12}$, $R^{12}$ and $R^{13}$, $R^{13}$ and $R^{14}$, $R^{14}$ and $R^{15}$, $R^{15}$ and $R^{16}$, $R^{16}$ and $R^{17}$ and/or $R^{17}$ and $R^{18}$ together with the carbon atoms of the biphenylyl moiety to which they are bonded, also optionally form a further fused aromatic or non-aromatic ring system wherein the fused ring system is unsubstituted or substituted;

$E^1$ and $E^2$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl; and $R^{Ar1}$ and $R^{Ar2}$, each independently of each, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl.

14. The color converter of claim 1,
wherein the color converter is suitable for converting light emitted from a light source into light of a second, longer wavelength.

15. A security ink for security printing, comprising perylene bisimide compound of formula (I):

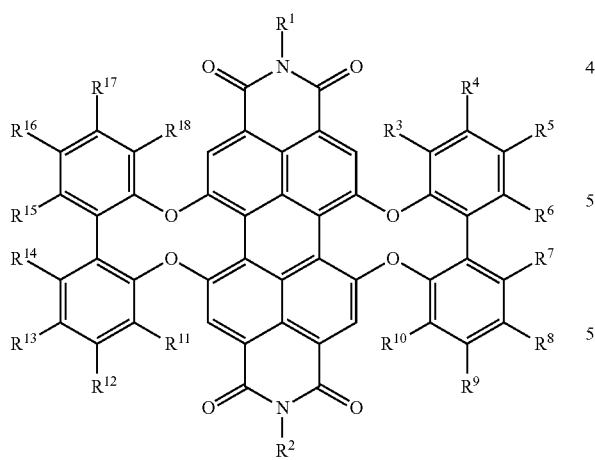

(I)

or a mixture thereof,
wherein $R^1$ and $R^2$, independently of each other, are selected from the group consisting of hydrogen, in each case unsubstituted or substituted $C_1$-$C_{30}$-alkyl, polyalkyleneoxy, $C_1$-$C_{30}$-alkylthio, $C_{20}$-cycloalkyl, $C_3$-$C_{20}$-cycloalkyloxy, $C_6$-$C_{24}$-aryl and $C_6$-$C_{24}$-aryloxy; and $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ independently of each other, are selected from the group consisting of hydrogen, halogen, cyano, hydroxyl, mercapto, nitro, —$NE^1E^2$, —$NR^{Ar1}COR^{Ar2}$, —$CONR^{Ar1}R^{Ar2}$, —$SO_2NR^{Ar1}R^{Ar2}$, —$COOR^{Ar1}$, —$SO_3R^{Ar2}$, in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkoxy, $C_6$-$C_{24}$-aryl, $C_6$-$C_{24}$-aryloxy and $C_6$-$C_{24}$-arylthio, wherein $R^3$ and $R^4$, $R^4$ and $R^5$, $R^5$ and $R^6$, $R^6$ and $R^7$, $R^7$ and $R^8$, $R^8$ and $R^9$, $R^9$ and $R^{10}$, $R^{11}$ and $R^{12}$, $R^{12}$ and $R^{13}$, $R^{13}$ and $R^{14}$, $R^{14}$ and $R^{15}$, $R^{15}$ and $R^{16}$, $R^{16}$ and $R^{17}$ and/or $R^{17}$ and $R^{18}$ together with the carbon atoms of the biphenylyl moiety to which they are bonded, also optionally form a further fused aromatic or non-aromatic ring system wherein the fused ring system is unsubstituted or substituted;

$E^1$ and $E^2$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl; and $R^{Ar1}$ and $R^{Ar2}$, each independently of each, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl.

16. A printing ink formulation for security printing, comprising:
a perylene bisimide compound of formula (I):

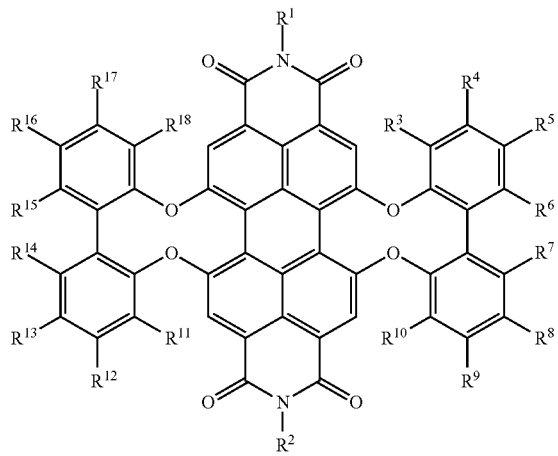

(I)

or a mixture thereof,
wherein
$R^1$ and $R^2$, independently of each other, are selected from the group consisting of hydrogen, in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkyloxy, $C_6$-$C_{24}$-aryl and $C_6$-$C_{24}$-aryloxy; and $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ independently of each other, are selected from the group consisting of hydrogen, halogen, cyano, hydroxyl, mercapto, nitro, —$NE^1E^2$, —$NR^{Ar1}COR^{Ar2}$, —$CONR^{Ar1}R^{Ar2}$, —$SO_2NR^{Ar1}R^{Ar2}$, —$COOR^{Ar1}$, —$SO_3R^{Ar2}$, in each case unsubstituted or substituted $C_1$-$C_{30}$-alkyl, polyalkyleneoxy, $C_1$-$C_{30}$- alkoxy, $C_1$-$C_{30}$-alkylthio, $C_3$-$C_{20}$-cycloalkyl, $C_3$-$C_{20}$-cycloalkoxy, $C_6$-$C_{24}$-aryl, $C_6$-$C_{24}$-aryloxy and $C_6$-$C_{24}$-arylthio, wherein $R^3$ and $R^4$, $R^4$ and $R^5$, $R^5$ and $R^6$, $R^6$ and $R^7$, $R^7$ and $R^8$, $R^8$ and $R^9$, $R^9$ and $R^{10}$, $R^{11}$ and $R^{12}$, $R^{12}$ and $R^{13}$, $R^{13}$ and $R^{14}$, $R^{14}$ and $R^{15}$, $R^{15}$ and $R^{16}$, $R^{16}$ and $R^{17}$ and/or $R^{17}$ and $R^{18}$ together with the carbon atoms of the biphenylyl moiety to which they are bonded, also optionally form a further fused aromatic or non-aromatic ring system wherein the fused ring system is unsubstituted or substituted;

$E^1$ and $E^2$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl; and $R^{Ar1}$ and $R^{Ar2}$, each independently of each, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl.

17. The printing ink formulation as claimed in claim 16, for security printing, further comprising:
a polymeric binder;
optionally an organic solvent;
optionally a colorant; and
optionally an additional additive.

18. A compound of formula (I):

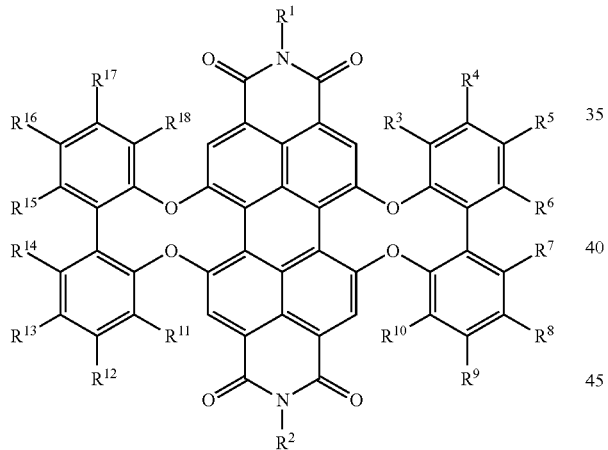

(I)

or a mixture thereof, wherein $R^1$ and $R^2$, independently of each other, are selected from the group consisting of hydrogen, in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkyloxy, $C_6$-$C_{24}$-aryl and $C_6$-$C_{24}$-aryloxy; and $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ independently of each other, are selected from the group consisting of hydrogen, halogen, cyano, hydroxyl, mercapto, nitro, —$NE^1E^2$, —$NR^{Ar1}COR^{Ar2}$, —$CONR^{Ar1}R^{Ar2}$, —$SO_2NR^{Ar1}R^{Ar2}$, —$COOR^{Ar1}$, —$SO_3R^{Ar2}$, in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkoxy, $C_6$-$C_{24}$-aryl, $C_6$-$C_{24}$-aryloxy and $C_6$-$C_{24}$-arylthio, wherein $R^3$ and $R^4$, $R^4$ and $R^5$, $R^5$ and $R^6$, $R^6$ and $R^7$, $R^7$ and $R^8$, $R^8$ and $R^9$, $R^9$ and $R^{10}$, $R^{11}$ and $R^{12}$, $R^{12}$ and $R^{13}$, $R^{13}$ and $R^{14}$, $R^{14}$ and $R^{15}$, $R^{15}$ and $R^{16}$, $R^{16}$ and $R^{17}$ and/or $R^{17}$ and $R^{18}$ together with the carbon atoms of the biphenylyl moiety to which they are bonded, also optionally form a further fused aromatic or non-aromatic ring system wherein the fused ring system is unsubstituted or substituted;

$E^1$ and $E^2$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl; and $R^{Ar1}$ and $R^{Ar2}$, each independently of each, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl, and wherein the compound is not a compound of formula (I) wherein $R^1$ and $R^2$ are each n-$C_4H_9$ and $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$ and $R^{18}$ are each hydrogen.

* * * * *